US009070962B2

(12) United States Patent
Kobayashi

(10) Patent No.: US 9,070,962 B2
(45) Date of Patent: Jun. 30, 2015

(54) SURFACE COMMUNICATION DEVICE

(75) Inventor: Naoki Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 473 days.

(21) Appl. No.: 13/504,448

(22) PCT Filed: Oct. 8, 2010

(86) PCT No.: PCT/JP2010/067746
§ 371 (c)(1),
(2), (4) Date: Apr. 26, 2012

(87) PCT Pub. No.: WO2011/052361
PCT Pub. Date: May 5, 2011

(65) Prior Publication Data
US 2012/0206314 A1    Aug. 16, 2012

(30) Foreign Application Priority Data

Oct. 30, 2009 (JP) .............................. P2009-251281
Feb. 26, 2010 (JP) .............................. P2010-043280

(51) Int. Cl.
*H01P 5/00* (2006.01)
*H01P 1/20* (2006.01)
(Continued)

(52) U.S. Cl.
CPC ................ *H01P 1/2005* (2013.01); *H04B 3/52* (2013.01); *H01P 3/121* (2013.01); *H05K 1/0236* (2013.01)

(58) Field of Classification Search
CPC .............. H01Q 1/52; H01P 3/00; H01P 5/00; H01P 1/2005; H04B 1/72; H04B 3/52; H04B 3/03
USPC ............ 333/24 R, 204, 236; 343/841; 455/14
See application file for complete search history.

(56) References Cited

U.S. PATENT DOCUMENTS 8,004,369 B2 * 8/2011 Kwon et al. .................... 333/12
2008/0238796 A1 * 10/2008 Rofougaran ................ 343/776

2012/0056693 A1    3/2012 Kobayashi et al.

FOREIGN PATENT DOCUMENTS

CN          1933348 A      3/2007
JP       2007-159082 A      6/2007
(Continued)

OTHER PUBLICATIONS

International Search Report in PCT/JP2010/067746 dated Jan. 11, 2011(English Translation Thereof).
Chinese Office Action dated Nov. 5, 2013, with partial English translation.
(Continued)

*Primary Examiner* — Benny Lee
*Assistant Examiner* — Rakesh Patel
(74) *Attorney, Agent, or Firm* — McGinn IP Law Firm, PLLC.

(57) ABSTRACT

A surface communication device of the present invention includes: an electromagnetic wave propagation unit which propagates electromagnetic waves and has a sheet shape; and at least one of a power feeding device unit which is disposed on the electromagnetic wave propagation unit in a non-conductive state with the electromagnetic wave propagation unit and feeds the electromagnetic waves to the electromagnetic wave propagation unit, and a reception device unit which is disposed on the electromagnetic wave propagation unit in a non-conductive state with the electromagnetic wave propagation unit and receives the electromagnetic waves propagated via the electromagnetic wave propagation unit. The at least one of the power feeding device unit and the reception device unit includes: an electromagnetic wave coupling unit which transmits the electromagnetic waves to the electromagnetic wave propagation unit or receives the electromagnetic waves from the electromagnetic wave propagation unit; and an electromagnetic wave suppression unit which includes a plurality of conductor unit structures arranged along a surface of the electromagnetic wave propagation unit so as to surround the electromagnetic wave coupling unit, and suppresses leakage of the electromagnetic waves from a space between the electromagnetic wave coupling unit and the electromagnetic wave propagation unit.

20 Claims, 47 Drawing Sheets

(51) Int. Cl.
*H04B 3/52* (2006.01)
*H01P 3/12* (2006.01)
*H05K 1/02* (2006.01)

(56) References Cited

FOREIGN PATENT DOCUMENTS

| JP | 2008-295176 A | 12/2008 |
| JP | 2010-063213 A | 3/2010 |
| WO | WO 2007/066447 A1 | 6/2007 |
| WO | WO2010/131612 A1 | 11/2010 |

OTHER PUBLICATIONS

Hiroyuki Shinoda, "High Speed Sensor Network Formed on Material Surfaces" in Journal of the Society of Instrument and Control Engineers, pp. 98 to 103, vol. 46, No. 2, Feb. 2007 (and full English translation).

International Search Report (ISR) (PCT Form PCT/ISA/210) for PCT/JP2010/067746 dated Jan. 11, 2011. Previously submitted on Apr. 26, 2012.

Hiroyuki Shinoda "Two dimensional transmission of power and signal", 2008 IEICE, p. S51-S52, BS-12-3.

* cited by examiner

SURFACE COMMUNICATION DEVICE

TECHNICAL FIELD

The present invention relates to technology for feeding electric power to a load, and more particularly, to a surface communication device which feeds electric power to a sheet from a power feeding side or feeds electric power to a power reception side such as a load from a sheet.

BACKGROUND ART

As a method of feeding electric power to a load by means of communication using electromagnetic waves, there is a method of disposing each of a power feeding device and a reception device to a sheet-shaped communication medium, in a non-conductive state and receiving electric power, which is fed from the power feeding device in a wireless fashion, to the reception device side in a wireless fashion via the sheet-shaped communication medium. As a modification example of the method, there is also a method of feeding power from a power feeding device to a communication medium in a contact power supply fashion and receiving the power from the communication medium to a reception device in a wireless fashion. Further, its modification, a method of feeding power from a power feeding device to a communication medium in a wireless fashion and feeding the power from the communication medium to a reception device in a contact power supply fashion may also be readily considered to be within a range of future applications. Such communication methods including modifications thereof as described above are hereinafter referred to as surface communication. Surface communication is a method capable of communicating between any two points on a two-dimensional sheet or performing one of transmission and reception on any point of the sheet.

As such a method, for example, Patent Document 1 discloses a configuration in which electromagnetic waves for feeding electric power from a power feeding device to a reception device propagate into a narrow area of a sheet-shaped medium sandwiched between facing conductors.

Also, Non-patent Document 1discloses a principle of electric power communication on a sheet-shaped communication medium.

PRIOR ART DOCUMENTS

Patent Document

[Patent Document 1] Japanese Unexamined Patent Application, First Publication No. 2008-295176

Non-patent Document

[Non-patent Document 1] pp. 98 to 103, "High Speed Sensor Network Formed on Material Surfaces" in Journal of the Society of Instrument and Control Engineers, by Hiroyuki Shinoda, Vol. 46, No. 2, February 2007

SUMMARY OF THE INVENTION

Problem to be Solved by the Invention

However, current surface communication has the following problems.

Generally, the electric power transmission efficiency between a power feeding device and a reception device, that is, communication performance, depends on electric power transmission efficiency between the power feeding device and a sheet-shaped communication medium and between the sheet-shaped communication medium and the reception device. Ideally, in the case of a power feeding device, it is required such that all electric power, which is fed from the power feeding device, is able to he fed to the sheet-shaped communication medium. In practice, however, some of electromagnetic waves are leaked from a gap between the power feeding device and the sheet-shaped communication medium to the outside. In the case of a reception device, it is required such that all electric power, which is received by the reception device, is able to receive from the sheet-shaped communication medium. In practice, however, some of electromagnetic waves are leaked from a gap between the reception device and the sheet-shaped communication medium to the outside.

Since the electromagnetic waves leaked to the outside, that is, leaking electromagnetic waves, are lost as radiated power, the communication performance is degraded. Also, since the leaking electromagnetic waves affect the surrounding radio wave environment, it is desirable to suppress the leaking electromagnetic waves as much as possible.

Therefore, an exemplary object of the present invention is to provide a surface communication device capable of suppressing electromagnetic waves from being leaked to the outside of a device from a gap between a power feeding unit and a sheet or between a reception unit and the sheet so that the communication performance can be improved.

Means for Solving the Problem

A surface communication device according to a first exemplary aspect of the present invention includes: an electromagnetic wave propagation unit which propagates electromagnetic waves and has a sheet shape; and at least one of a power feeding device unit which is disposed on the electromagnetic wave propagation unit in a non-conductive state with the electromagnetic wave propagation unit and feeds the electromagnetic waves to the electromagnetic wave propagation unit, and a reception device unit which is disposed on the electromagnetic wave propagation unit in a non-conductive state with the electromagnetic wave propagation unit and receives the electromagnetic waves propagated via the electromagnetic wave propagation unit. The at least one of the power feeding device unit and the reception device unit includes: an electromagnetic wave coupling unit which transmits the electromagnetic waves to the electromagnetic wave propagation unit or receives the electromagnetic waves from the electromagnetic wave propagation unit; and an electromagnetic wave suppression unit which includes a plurality of conductor unit structures arranged along a surface of the electromagnetic wave propagation unit so as to surround the electromagnetic wave coupling unit, and suppresses leakage of the electromagnetic waves from a space between the electromagnetic wave coupling unit and the electromagnetic wave propagation unit.

Also, a surface communication device according to a second exemplary aspect of the present invention includes: an electromagnetic wave propagation unit which propagates electromagnetic waves and has a sheet shape; a power feeding device unit which feeds the electromagnetic waves to the electromagnetic wave propagation unit; and a reception device unit which receives the electromagnetic waves propagated via the electromagnetic wave propagation unit. At least one of the power feeding device unit and the reception device unit is disposed on the electromagnetic wave propagation unit in a non-conductive state with the electromagnetic wave propagation unit. The at least one of the power feeding device unit and the reception device unit includes: an electromagnetic wave coupling unit which transmits the electromagnetic waves to the electromagnetic wave propagation unit or receives the electromagnetic waves from the electromagnetic wave propagation unit; and an electromagnetic wave suppression unit which includes a plurality of conductor unit structures arranged along a surface of the electromagnetic wave propagation unit so as to surround the electromagnetic wave coupling unit, and suppresses leakage of the electromagnetic waves from a space between the electromagnetic wave coupling unit and the electromagnetic wave propagation unit.

In the above description, the conductor unit structure is a structure which is configured of at least one conductor element. When the plurality of conductor unit structures described above are arranged along the surface of the electromagnetic wave propagation unit, while it is desirable that the conductor structures in which the physical shapes of the unit structures are the same be used, they have not necessarily to be identical. Also, in the above description, while it is also desirable that pitches of the plurality of unit structures arranged along the surface of the electromagnetic wave propagation unit be made constant, they have not necessarily to be constant. Moreover, in the above description, while it is also desirable that a group of unit structures surrounding the electromagnetic wave coupling unit be arranged multiply along the surface of the electromagnetic wave propagation unit as much as possible, they have not necessarily to be arranged multiply.

Effect of the Invention

According to the present invention, it is difficult for electromagnetic waves to propagate through a gap between the electromagnetic wave coupling unit and the electromagnetic wave propagation unit, so that it possible to suppress the leakage of electromagnetic waves from the surface communication device and simultaneously improve the communication performance.

BRIEF DESCRIPTION OF THE DRAWINGS

FIG. 6 is a cross-sectional diagram taken along a line A-A in FIG. 5a.

EMBODIMENTS FOR CARRYING OUT THE INVENTION

Hereinafter, best modes to operate surface communication devices according to the present invention will be described with reference to the accompanying drawings. However, the present invention is not limited to these embodiments.

(Basic Configuration)

Figure 1:
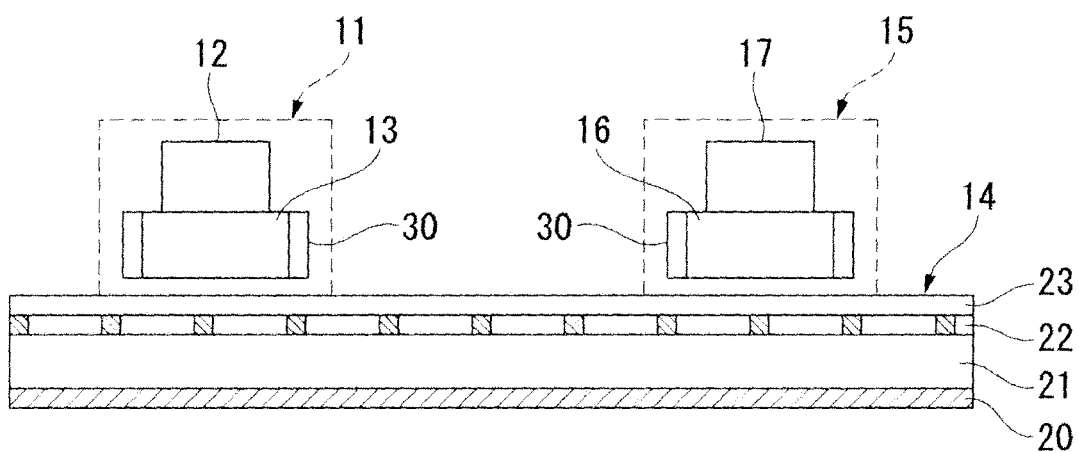
FIG. 1 is a side diagram illustrating a schematic configuration of a surface communication device according to an exemplary embodiment of the present invention.
Figure 2:
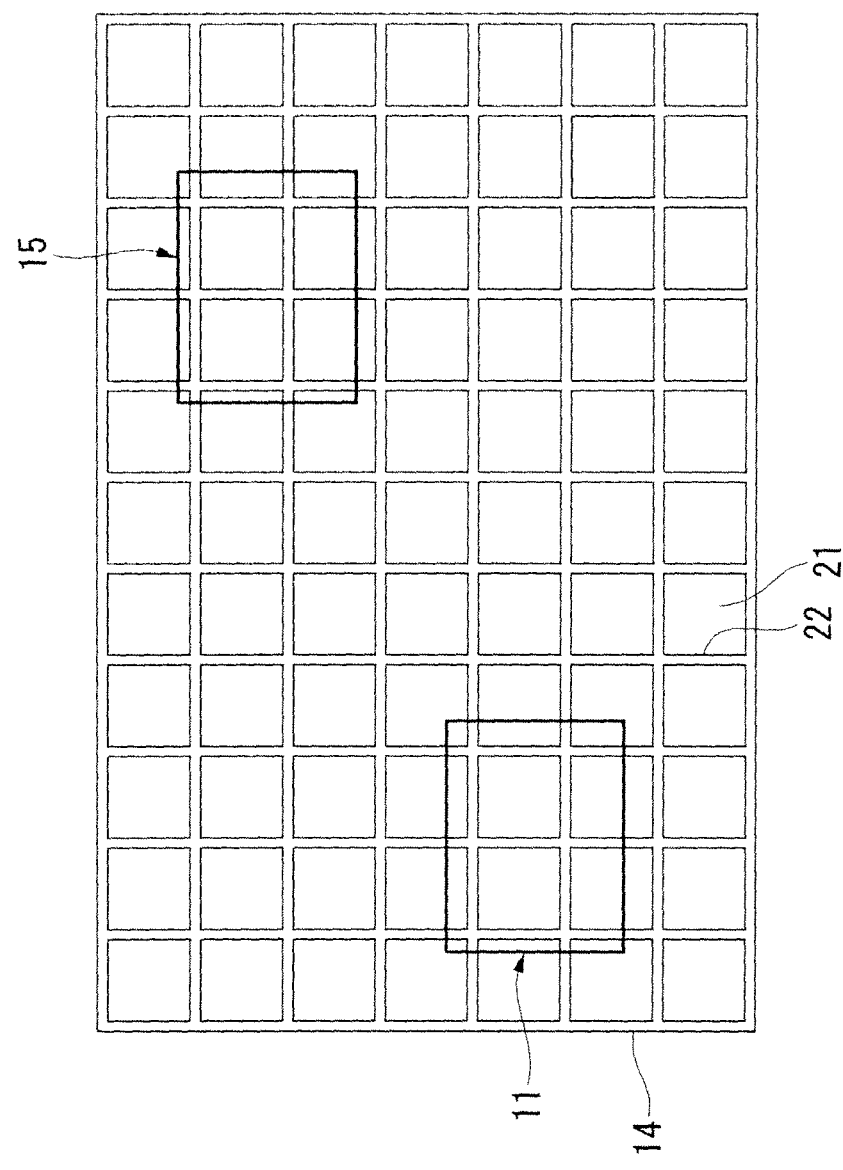
FIG. 2 is a diagram illustrating the schematic configuration shown in FIG. 1 when viewed from the top thereof.

FIG. 1 is a side diagram illustrating a schematic configuration of a surface communication device according to a present exemplary embodiment, and FIG. 2 is a diagram illustrating the schematic configuration in FIG. 1 when viewed from the top thereof.

As shown in FIGS. 1 and 2, in the surface communication device according to the present exemplary embodiment, a power feeding device unit (electromagnetic wave transmission unit) 11 and a reception device unit (electromagnetic wave reception unit) 15 are provided on a sheet-shaped electromagnetic wave propagation sheet (electromagnetic wave propagation unit) 14. A number of the power feeding device unit 11 and the reception device unit 15 may be provided on the electromagnetic wave propagation sheet 14. The power feeding device unit 11 and the reception device unit 15 may be detachably provided on the electromagnetic wave propagation sheet 14. Either the power feeding device unit II or the reception device unit 15 is provided. with respect to the electromagnetic wave propagation sheet 14, on any region of the sheet in a non-conductive state without coming in contact with a conductor. Here, the sheet shape refers to a shape having a planar span and a thin thickness, such as a cloth shape, a paper shape, a foil shape, a plate shape, a membrane shape, a film shape, a mesh shape, and the like.

The power feeding device unit 11 includes an electromagnetic wave generation unit 12, a transmission electromagnetic wave coupling unit 13, and a leaking electromagnetic wave suppression unit 30. The leaking electromagnetic wave suppression unit 30 surrounds an outer circumferential portion of the transmission electromagnetic wave coupling unit 13.

Figure 3:
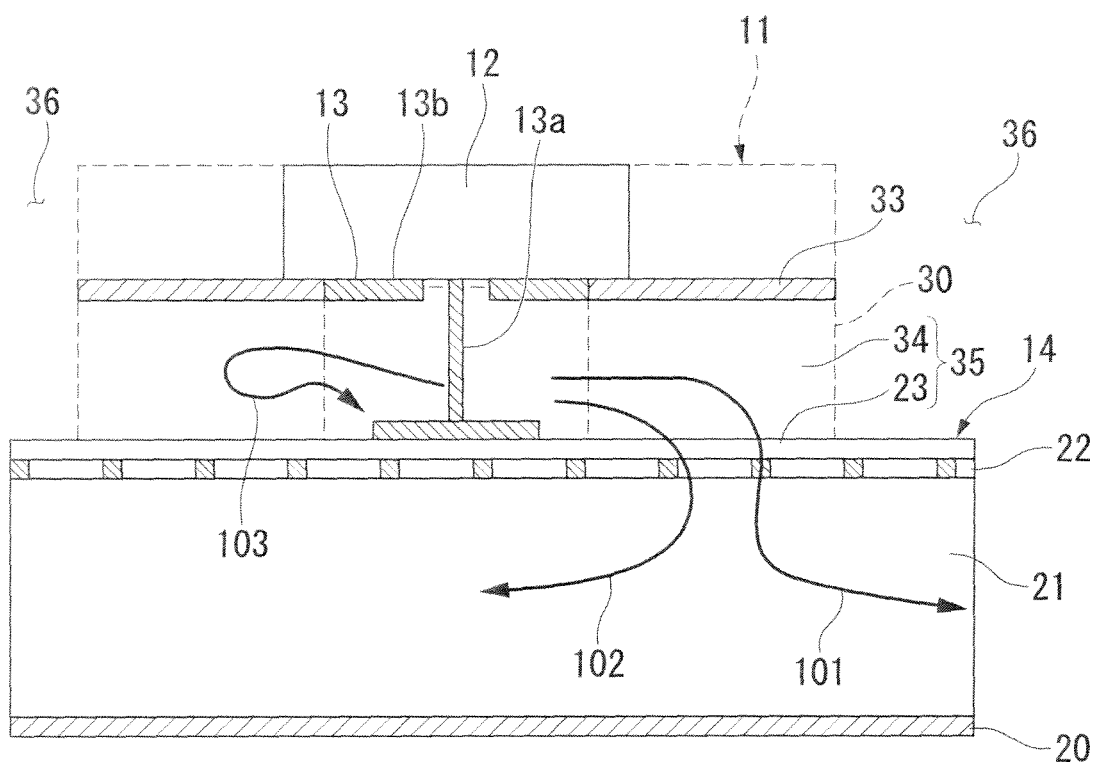
FIG. 3 is a diagram illustrating an enlarged portion of a power feeding device unit and an electromagnetic wave propagation sheet which face each other according to the exemplary embodiment of the present invention.

FIG. 3 is a diagram illustrating an enlarged portion of the power feeding device unit 11 and the electromagnetic wave propagation sheet 14 which face each other in FIG. 1.

As shown in FIG. 3, the transmission electromagnetic wave coupling unit 13 includes an emission conductor 13a and a reference conductor 13b, and has a structure in which electromagnetic waves received from the electromagnetic wave generation unit 12 are fed to the electromagnetic wave propagation layer 21 via a mesh layer 22.

The electromagnetic wave propagation sheet 14 propagates the electromagnetic waves fed from the power feeding device unit 11 in a direction along a sheet surface of the electromagnetic wave propagation sheet 14. The electromagnetic wave propagation sheet 14 has a configuration in which an electromagnetic wave propagation layer 21, a mesh layer 22 and an insulation layer 23 are sequentially stacked on a surface of a conductor plane layer 20.

The mesh layer 22 is a conductor formed in a mesh shape.

In the electromagnetic wave propagation sheet 14, electromagnetic waves propagate through a space, which is sandwiched by the mesh layer 22 and the conductor plane layer 20, in a direction along a surface of the sheet.

The insulation layer 23 is provided so that the power feeding device unit 11 or the reception device unit 15 and the electromagnetic wave propagation sheet 14 do not electrically conduct with each other. A medium of the insulation layer 23 is a medium which has a relative dielectric constant and a magnetic rate and does not pass through direct current. Air and vacuum are included among such media.

The reception device unit 15 includes a reception electromagnetic wave coupling unit (electromagnetic wave coupling unit) 16 which receives electromagnetic waves propagating through the electromagnetic wave propagation sheet 14, and an electromagnetic wave output unit 17 which outputs the received electromagnetic waves. The reception electromagnetic wave coupling unit 16 is basically configured in the same structure as the transmission electromagnetic wave coupling unit 13. That is, the reception electromagnetic wave coupling unit 16 is configured of a combination of the emission conductor 13a and the reference conductor 13b. In the case of the reception, however, the reception electromagnetic wave coupling unit 16 does not feed electromagnetic waves to the electromagnetic wave propagation layer 21 but inversely receives the electromagnetic waves from the electromagnetic wave propagation layer 21. Thereafter, the structure in the reception electromagnetic wave coupling unit 16, which is the same as that of the emission conductor 13a is referred to as a reception conductor especially when the distinction between transmission and reception is required. As with the transmission electromagnetic wave coupling unit 13, the reception device unit 15 may include the leaking electromagnetic wave suppression unit 30 which surrounds an outer circumferential portion of the reception electromagnetic wave coupling unit 16.

The leaking electromagnetic wave suppression unit 30 faces the mesh layer 22 with the insulation layer 23 being interposed therebetween, and prevents the electromagnetic waves leaked from the transmission electromagnetic wave coupling unit 13 from propagating along the insulation layer 23.

The leaking electromagnetic wave suppression unit 30 is configured of an artificial impedance conductor 33 connected to the reference conductor 13b of the transmission electromagnetic wave coupling unit 13, and a space layer 34 sandwiched between the artificial impedance conductor 33 and the insulation layer 23. A combination of the insulation layer 23 and the space layer 34 which are adjacent to each other is referred to as a leaking electromagnetic wave layer 35. The air layer 34 may be air, and may be filled with a dielectric substance rather than air.

The artificial impedance conductor 33 suppresses the electromagnetic waves, which cannot penetrate the electromagnetic wave propagation layer 21 among the electromagnetic waves generated at the transmission electromagnetic wave coupling unit 13, from being leaked as leaking electromagnetic waves toward an out-of-device region 36 along he leaking electromagnetic wave layer 35. For this reason, the artificial impedance conductor 33 reflects the leaking electromagnetic waves toward a side of the transmission electromagnetic wave coupling unit 13, or feeds the leaking electromagnetic waves to the electromagnetic wave propagation layer 21 via the mesh layer 22. In an exemplary embodiment of the present invention, the artificial impedance conductor 33 is configured by arranging certain unit structures two-dimensionally so as to surround the transmission electromagnetic wave coupling unit 13 in the leaking electromagnetic wave suppression unit 30.

Figure 4:
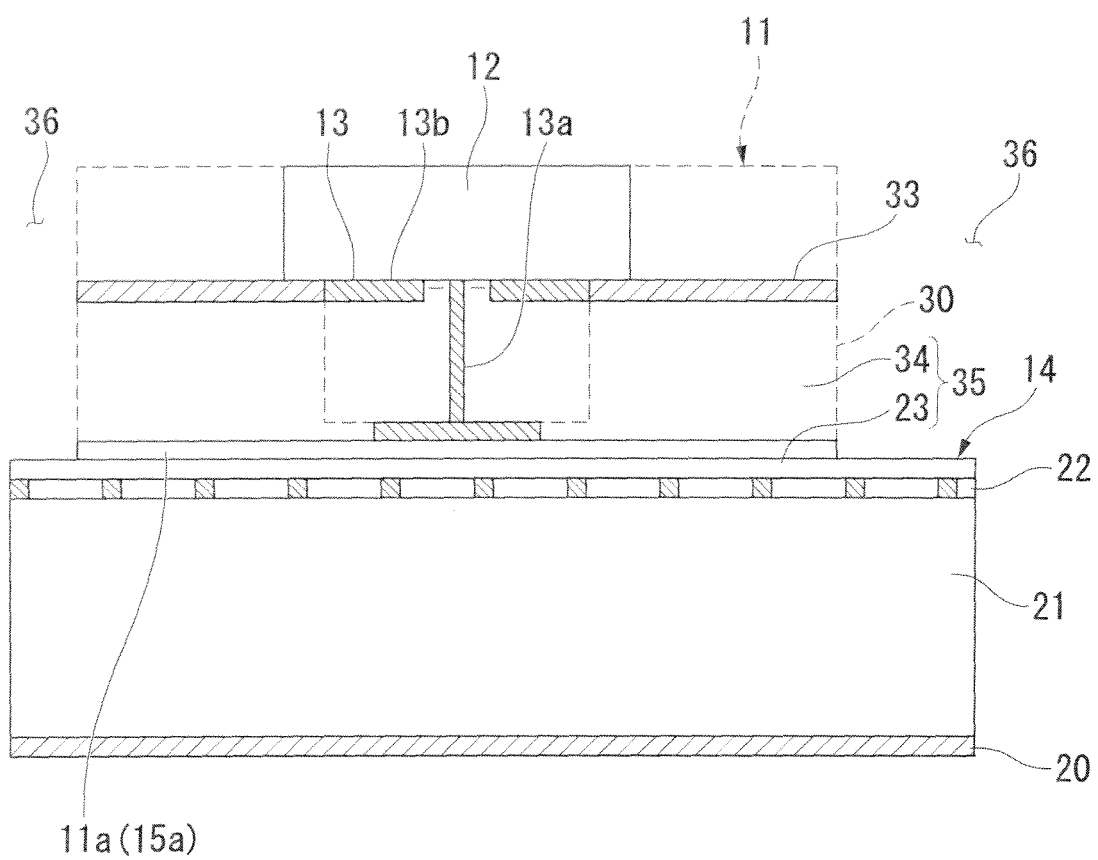
FIG. 4 is a diagram illustrating an enlarged portion of a power feeding device unit and an electromagnetic wave propagation sheet which face each other in a surface communication device according to a modification of the exemplary embodiment of the present invention.

As shown in FIG. 4, an insulation layer 11a (15a) may be coated on a bottom surface of the above-described power feeding device unit 11 or reception device unit 15 so as to prevent inadvertent electrical contact with the surroundings when the power feeding device unit 11 or the reception device unit 15 is attached to or detached from the electromagnetic wave propagation sheet 14.

Hereinafter, a plurality of exemplary embodiments of a more specific configuration of such an artificial impedance conductor 33 will be described along with the principle of the artificial impedance conductor 33 with reference to the drawings. Also, descriptions of the exemplary embodiments as will be described later are directed to only the artificial impedance conductor 33, and configurations of other parts of the surface communication device conform with the configurations shown in the above-described basic configurations, so the descriptions thereof are omitted.

(First Exemplary Embodiment)

Figure 5:
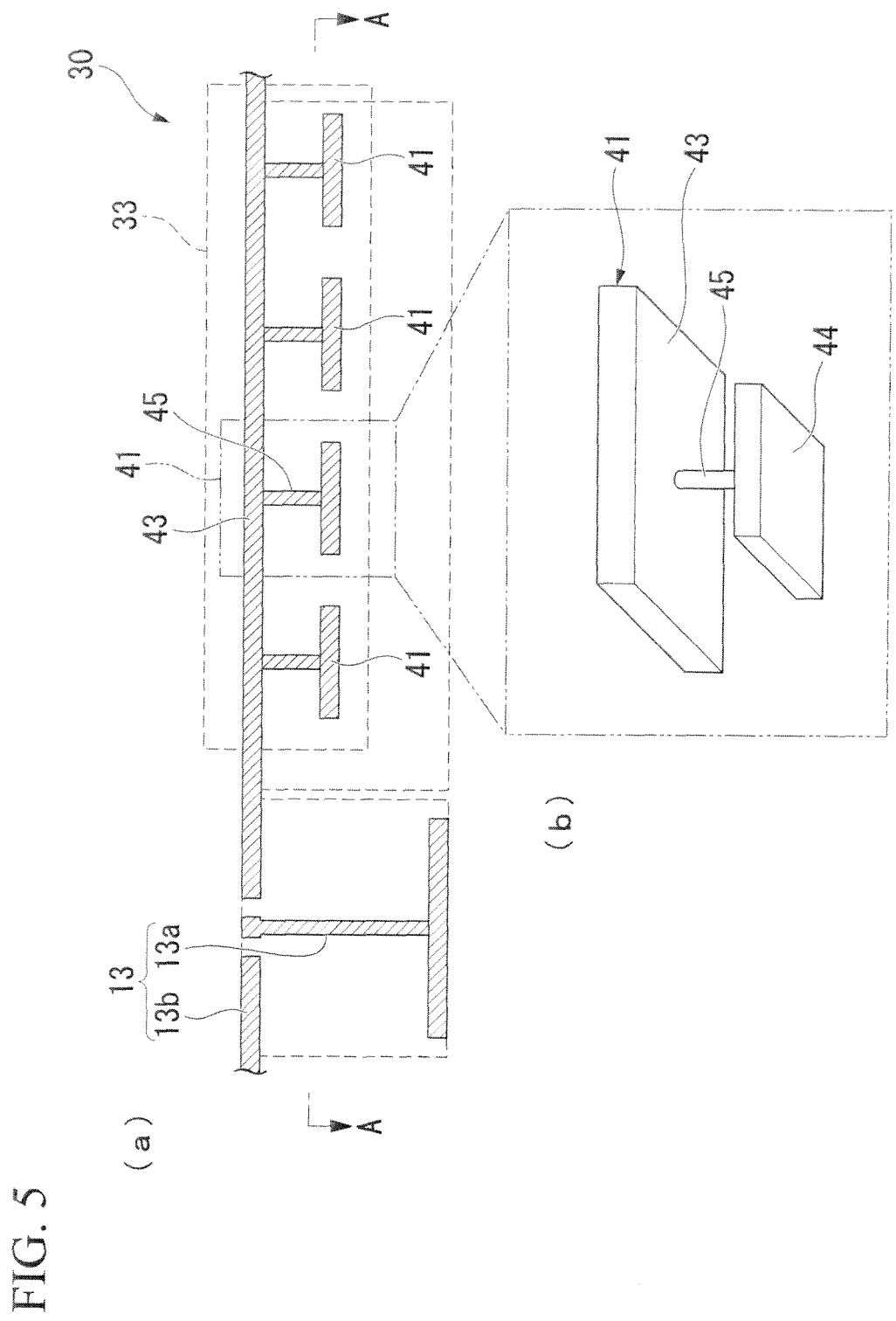
FIGS. 5a and 5b are diagrams illustrating a first exemplary embodiment of a surface communication device structure of the present invention.
Figure 6:
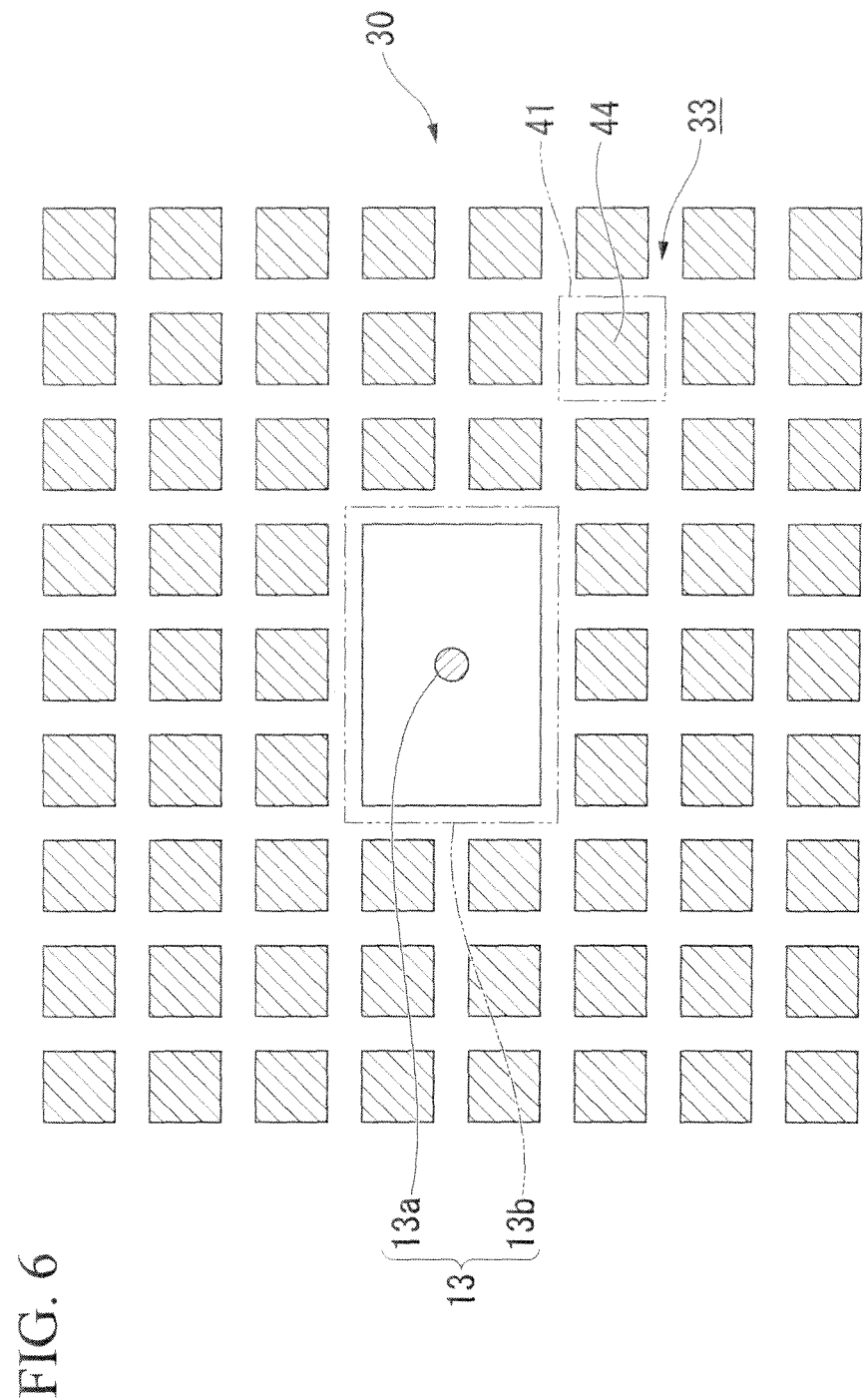

FIGS. 5 and 6 are diagrams for specifically explaining a first exemplary embodiment of the artificial impedance conductor 33 constituting the leaking electromagnetic wave suppression unit 30. FIGS. 5 and 6 show the periphery of the transmission electromagnetic wave coupling unit 13. The periphery of the reception electromagnetic wave coupling unit 16 also has the same structure. Hereinafter, it is also the same in other exemplary embodiments. As shown in part (a) of FIG. 5 and FIG. 6, the artificial impedance conductor 33 in this exemplary embodiment is configured so that one or more artificial impedance conductor unit structures 41 are two-dimensionally disposed along a surface of the electromagnetic wave propagation sheet 14 and disposed so as to surround the outer circumferential portion of the reference conductor 13b of the transmission electromagnetic wave coupling unit 13. The artificial impedance conductor unit structures 41 represent unit elements which constitute the artificial impedance conductor 33. Hereinafter, the artificial impedance conductor unit structure 41 is sometimes merely referred to as a unit structure 41.

As shown in parts (a) and (b) of FIG. 5 and FIG. 6, the artificial impedance conductor unit structure 41 is configured by a reference conductor 43, a patch conductor 44, and a conductor post 45. The patch conductor 44 has a rectangular plate shape and is installed between the reference conductor 43 and the leaking electromagnetic wave layer 35. The conductor post 45 conductively connects the patch conductor 44 and the reference conductor 43. The "patch" of a patch conductor means a small piece or fragment. The term "patch" is generally used with the meaning described above in the field of electromagnetic wave engineering, such as when a microstrip antenna in a plate shape is referred to as a "patch antenna."

The plurality of artificial impedance conductor unit structures 41 are disposed in a two-dimensional fashion so that the adjacent reference conductors 43 come in contact with each other. In each of the artificial impedance conductor unit structures 41, the reference conductor 43 is larger than the patch conductor 44. Therefore, the adjacent patch conductors 44 do not come in contact with each other.

In FIG. 5, the patch conductor 44 has a rectangular plate shape, but has not necessarily to have a rectangular shape. For example, the patch conductor 44 may have any polygonal shape, or may be formed in a shape including a smooth boundary, such as a circular shape.

In FIG. 6, the artificial impedance conductor unit structures 41 triply surround the electromagnetic wave coupling unit 13, but have not necessarily to triply surround it. For example, it may be surrounded singly or quintuply. Multiplicity may be different according to directions, for example, it is surrounded triply in one direction and quintuply in the other direction. Also, the multiplicity may be different in a certain direction according to rows. Generally, as it is surrounded in multiple folds, it has an effect that it is possible to suppress leakage of electromagnetic waves from the leaking electromagnetic wave layer 35.

The plurality of artificial impedance conductor unit structures 41 which constitute the artificial impedance conductor 33 preferably have the same structure, but have not necessarily to have the same structure. Applications of physical phenomena when they intentionally do not have the same structure are described in other exemplary embodiments of the present invention.

Also, the plurality of artificial impedance conductor unit structures 41 constituting the artificial impedance conductor 33 are preferably arranged at constant pitches with respect to a plane along the leaking electromagnetic wave layer 35, but have not necessarily to be arranged at constant pitches.

In FIG. 6, a boundary shape between the electromagnetic wave coupling unit 13 and a region covered with the artificial impedance conductor 33 has a rectangular shape, but has not necessarily to have a rectangular shape. For example, the boundary shape may include irregularities. Also, a region filled with the artificial impedance conductor 33 may be formed inside the electromagnetic wave coupling unit 13. In addition, the plurality of electromagnetic wave coupling units 13 may be formed in a region covered with the artificial impedance conductor 33.

In FIG. 3, a propagation path 101, a propagation path 102 and a propagation path 103 for electromagnetic waves emitted from the emission conductor 13a are indicated by thick-line arrows. This shows that most of the electromagnetic waves going to be propagating from the emission conductor 13a to the leaking electromagnetic wave layer 35 exude out of the electromagnetic wave propagation layer 21 without propagation or return to the transmission electromagnetic wave coupling unit 13. That is, the surrounding conductor of the electromagnetic wave coupling unit 13, which is defined as the artificial impedance conductor 33, suppresses the electromagnetic waves that could not enter the electromagnetic wave propagation layer 21 among the electromagnetic waves generated at the transmission electromagnetic wave coupling unit 13 from being leaked as leaking electromagnetic waves to an out-of-device region 36 along the leaking electromagnetic wave layer 35.

To do this, the leaking electromagnetic wave layer 35 functioning as a waveguide for leaking electromagnetic waves, that is, a region surrounded by the surrounding conductor of the transmission electromagnetic wave coupling unit 13 and the mesh layer 22, preferably has extremely high or extremely low characteristic impedance as a transmission channel. The transmission channel is made to have extremely high or extremely low characteristic impedance by designing the shapes of the surrounding conductor when a frequency of the electromagnetic waves is set to a certain frequency band. More particularly, the extremely high or extremely low characteristic impedance can he obtained at the above-described frequency band by making the surrounding conductor have a repeated structure in which resonance is caused in the vicinity of the above-described certain frequency band.

Figure 7:
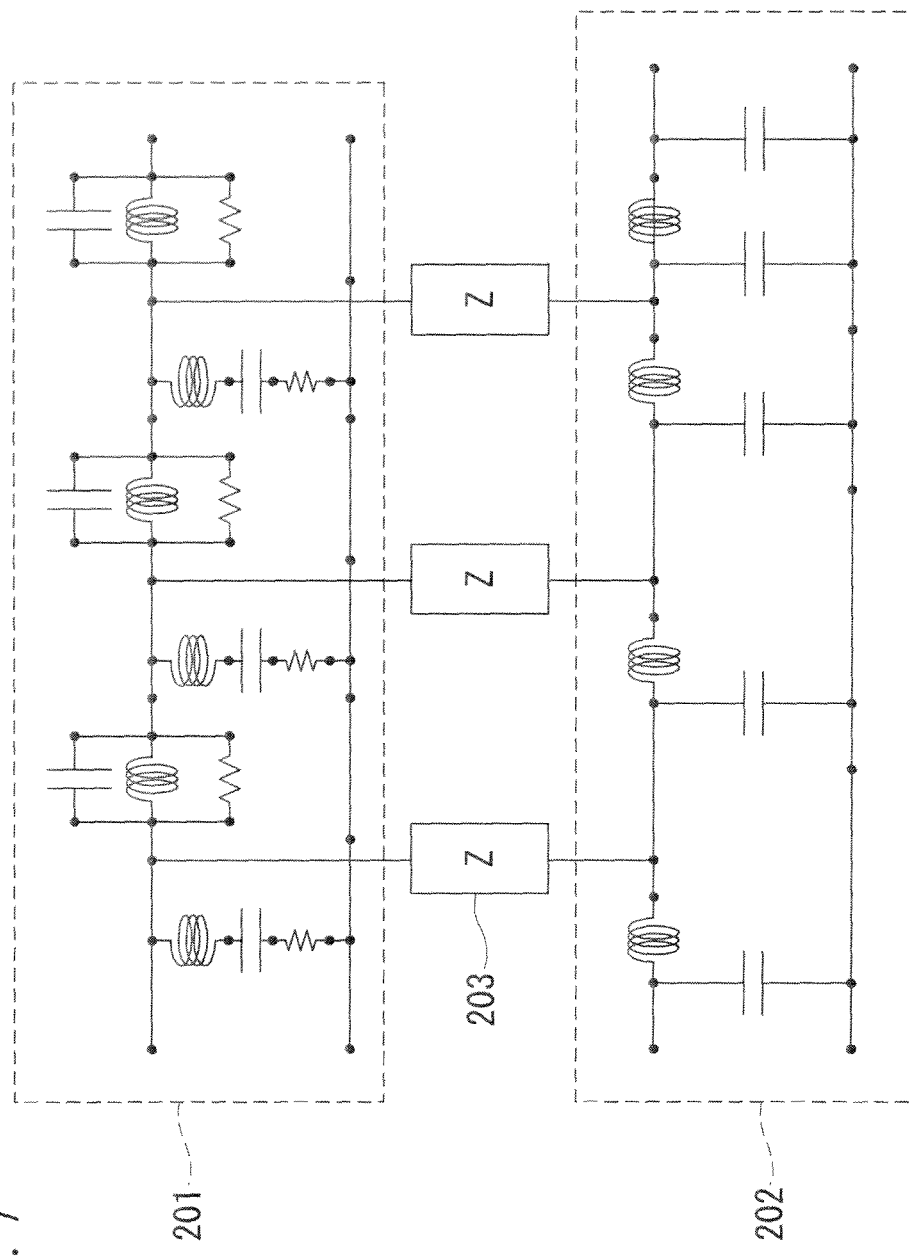
FIG. 7 is a diagram for additionally explaining the configuration of FIGS. 5a and 5b using an equivalent circuit model.

FIG. 7 is a diagram for supplementing the theoretical explanation using an equivalent circuit model. In FIG. 7, reference symbol 201 represents an equivalent circuit of the leaking electromagnetic wave layer 35 which is surrounded by the artificial impedance conductor 33 and the mesh layer 22. Reference symbol 202 represents an equivalent circuit of the electromagnetic wave propagation sheet 14 which propagates electromagnetic waves to a region which is surrounded by the mesh layer 22 and the conductor plane layer 20. Reference symbol 203 represents impedance for indicating that two electromagnetic wave propagation layers 21 and 22 are coupled via a mesh opening portion.

As shown in FIG. 7, the artificial impedance conductor 33 shown in this exemplary embodiment is represented by an equivalent circuit in which parallel resonant circuits are connected in series in the case where the capacitive coupling between the adjacent patch conductors 44 and the inductive coupling owing to a loop current flowing through the patch conductor 44 and the conductor post 45 which are adjacent to each other as well as the reference conductor 43 are predominant. Also, it is represented by an equivalent circuit in which series resonant circuits are connected in parallel in the case where the inductive coupling by the conductor post 45 and the capacitive coupling between the patch conductor 44 and a surface conductor layer of the electromagnetic wave propagation sheet 14, that is, the mesh layer 22, are predominant. As a result, a structure between the artificial impedance conductor 33 and a surface of the electromagnetic wave propagation sheet 14 can represented by an equivalent circuit in which the parallel resonant circuit and the series resonant circuit, resonance frequencies of which do not necessarily agree, are alternately connected to each other. The above description shows that the equivalent circuit in which the parallel resonant circuits are connected in series has extremely high characteristic impedance at a certain frequency, and the equivalent circuit in which the series resonant circuits are connected in parallel has extremely low characteristic impedance at a certain frequency. In this way, when the resonance is generated owing to the structure is generated by providing the artificial impedance conductor 33 along the surroundings of the transmission electromagnetic wave unit 10, most of the leaking electromagnetic waves are reflected by the leaking electromagnetic wave layer 35, or pass through the mesh layer 22 to be input to the electromagnetic wave propagation layer 21, and as a result the leaking electromagnetic waves can be suppressed from being leaked to the outside of the device. Also, as multiple artificial impedance unit structures 41 are arranged, multiple resonant circuits are connected. Therefore, a frequency band at which leakage of the electromagnetic waves is suppressed tends to spread so as to cover a corresponding resonance frequency.

For the above-described reasons, when all of the plurality of artificial impedance conductor unit structures 41 surrounding the transmission electromagnetic wave coupling unit 13 have the same physical dimensions, a frequency band at which leakage of the electromagnetic waves is suppressed is formed to cover a corresponding resonance frequency. Meanwhile, in the above description, even if the physical dimensions of the plurality of artificial impedance conductor unit structures 41 are not necessarily identical, as long as a plurality of resonance frequencies are present in the vicinity of the frequency band at which the leakage of the electromagnetic waves is desired to be suppressed, an effect of suppressing leakage of the electromagnetic waves at the above frequency band is not significantly degraded. In various exemplary embodiments as will be described later, the leaking electromagnetic wave suppression unit 30 is configured in a repeated structure of one or more artificial impedance conductor unit structures like the first exemplary embodiment. Also, a leakage suppression mechanism can also be approximately described by serial connection of the parallel resonant circuits or parallel connection of the series resonant circuits as described above.

It can also be described like the above-described first exemplary embodiment hat even if the physical shapes of the plurality of artificial impedance conductor unit structures do not necessarily match each other, as long as a plurality of resonance frequencies owing to the above mismatching property are present in the vicinity of the frequency band at which the leakage of the electromagnetic waves is desired to be suppressed, an effect of suppressing leakage of the electromagnetic waves at the above frequency band is not significantly degraded.

It can also be described like the discussion regarding the above-described physical dimensions of the first exemplary embodiment that even if the pitches of the plurality of artificial impedance conductor unit structures in a direction along the leaking electromagnetic wave layer 35 do not necessarily match each other, as long as a plurality of resonance frequencies owing to the above mismatching property are present in the vicinity of the frequency band at which the leakage of the electromagnetic waves is desired to be suppressed, an effect of suppressing leakage of the electromagnetic waves at the above frequency band is not significantly degraded.

(Second Exemplary Embodiment)

Figure 8:
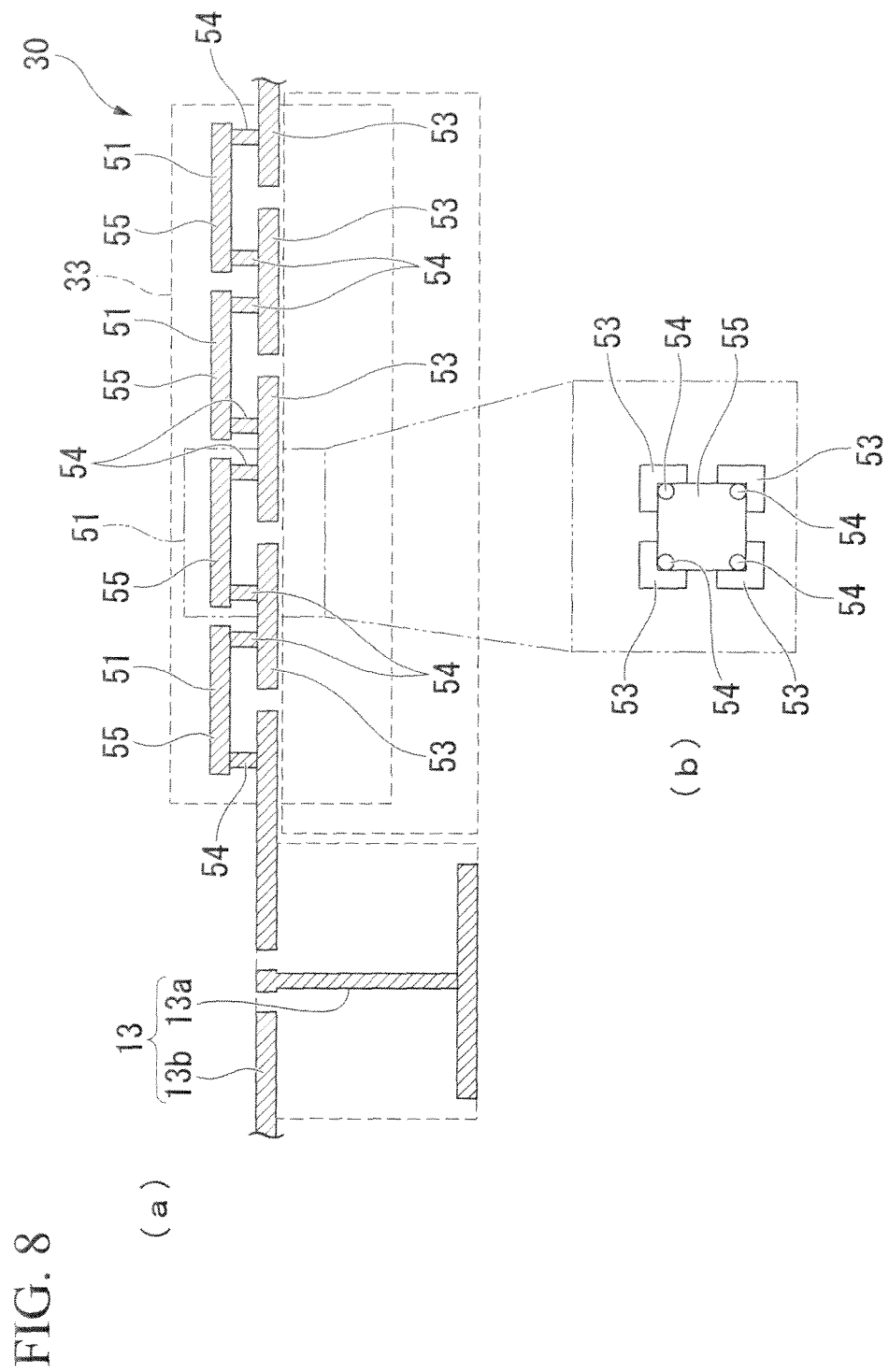
FIGS. 8a and 8b are diagrams illustrating a second exemplary embodiment of the surface communication device of the present invention.

FIG. 8 is a diagram illustrating a second exemplary embodiment of the artificial impedance conductor 33 which constitutes the leaking electromagnetic wave suppression unit 30.

As shown in part (a) of FIG. 8, the artificial impedance conductor 33 in this exemplary embodiment is configured so that one or more artificial impedance conductor unit structures 51 two-dimensionally surround the reference conductor 13b of the transmission electromagnetic wave coupling unit 13.

As shown in part (a) of FIG. 8, the artificial impedance conductor unit structure 51 represents a unit structure which constitutes the artificial impedance conductor 33. Part (b) of FIG. 8 shows a top diagram of the artificial impedance conductor unit structure 51. The artificial impedance conductor unit structure 51 is configured of a reference conductor 53, an upper layer patch conductor 55, and a conductor post 54. The reference conductor 53 is configured of conductors which are divided in a patch shape. The upper layer patch conductor 55 is installed at a layer disposed on an opposite side to the leaking electromagnetic wave layer 35 with respect to the reference conductor 53. The conductor post 54 conductively connects the upper layer patch conductor 55 and the reference conductor 53. The upper layer patch conductor 55 connects the reference conductors 53 adjacent to each other in a bridge shape via the conductor posts 54.

This exemplary embodiment can be shown as an equivalent circuit in which parallel resonant circuits are connected in series by means of the capacitive coupling between the reference conductor 53 and the patch conductor 55 and the inductive coupling by the conductor post 54. Therefore, most of the leaking electromagnetic waves are reflected by the leaking electromagnetic wave layer 35, or pass through the mesh layer 22 to be input into the electromagnetic wave propagation layer 21, and as a result the leaking electromagnetic waves can be suppressed from being leaked to the outside of the device.

Next, the calculation results indicating the effectiveness of the second exemplary embodiment of the present invention will be described with reference to the drawings.

Figure 9:
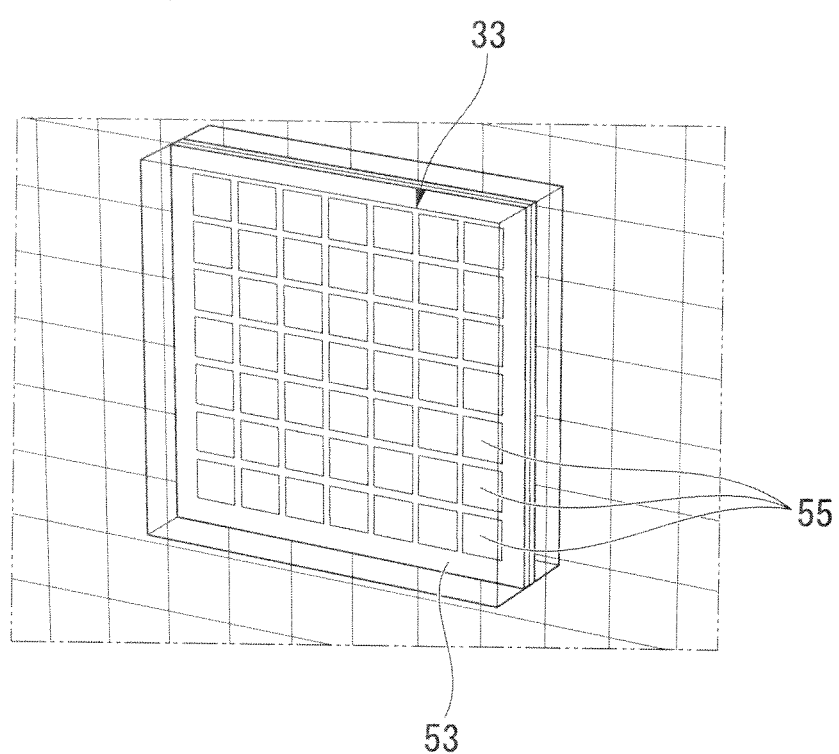
FIG. 9 is a diagram for explaining a second exemplary embodiment of n artificial impedance conductor.

FIG. 9 is a perspective diagram of an electromagnetic analysis model used to verify the effectiveness of the second exemplary embodiment. In this figure, both of the upper layer patch conductor 55 and reference conductor 53 have a square shape whose sides have a length of 12 mm. They are two-dimensionally configured in a repeated structure of 7×7, and configured as the artificial impedance conductor 33 at 110× 110 mm as a whole.

Figure 10:
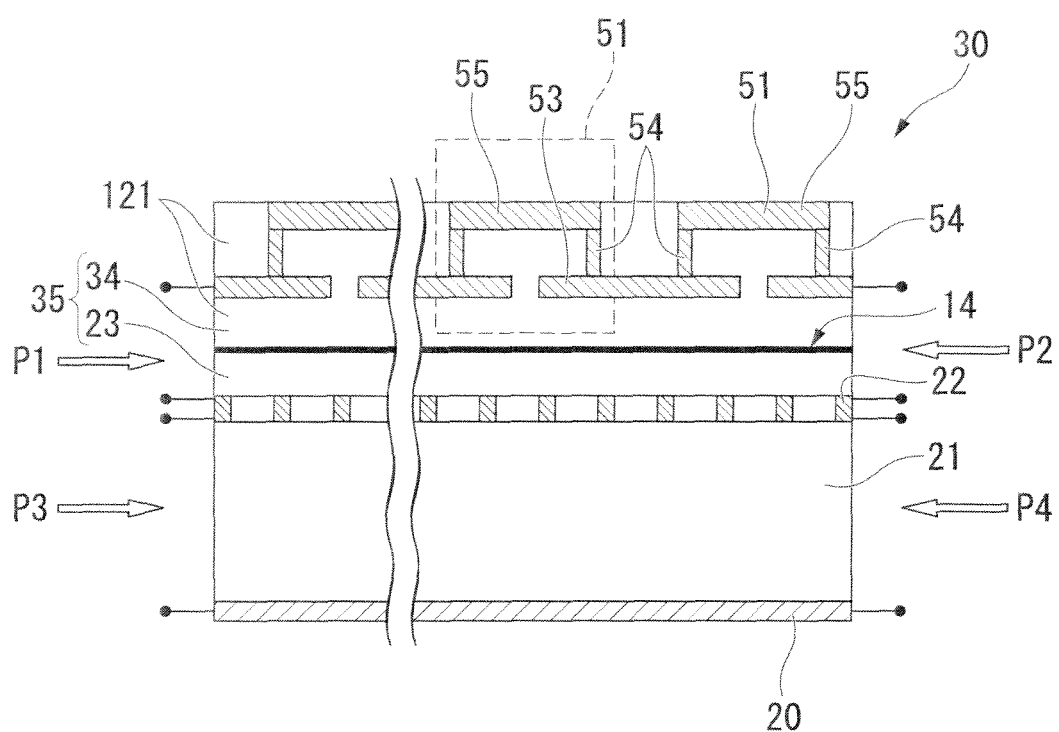
FIG. 10 is a diagram illustrating an electromagnetic field analysis model according to a second exemplary embodiment of the present invention.

FIG. 10 shows a side diagram of an electromagnetic field analysis model. The electromagnetic wave propagation unit 14 having the same two-dimensional dimensions as the artificial impedance conductor 33 is positioned directly under the artificial impedance conductor 33 to be in contact with it. In FIG. 10, the insulation layer 23 of the electromagnetic wave propagation unit 14 has a thickness of 0.25 mm and a relative dielectric constant of 2.3. The mesh layer 22 is configured so that conductors having a width of 1 mm are two-dimensionally disposed at intervals of 3 mm. The electromagnetic wave propagation layer 21 has a thickness of 2 mm, and is filled with a medium having a relative dielectric constant of 1.4. A substrate material 121 forming the background of the artificial impedance conductor 33 is a material having a relative dielectric constant of 4.2. The conductor post 54 has a height of 0.2 mm. The leaking electromagnetic wave suppression unit 30 has a thickness of 3.25 mm when the insulation layer 23 is included therein. The patch shape conductor structure used for this analysis model is modeled as a complete conductor having a thickness of 0, and the conductor post 54 has a radius of 0.15 mm.

In the analysis, with a left end of the leaking electromagnetic wave layer 35 in the figure represented by a first port P1, a right end of the leaking electromagnetic wave layer 35 represented by a second port P2. a left end of the electromagnetic wave propagation unit 14 represented by a third port P3, a right end of the electromagnetic wave propagation unit 14 represented by a fourth port P4, an electric power coupling ratio (S parameter) is calculated using a time-domain differential method.

Figure 11:
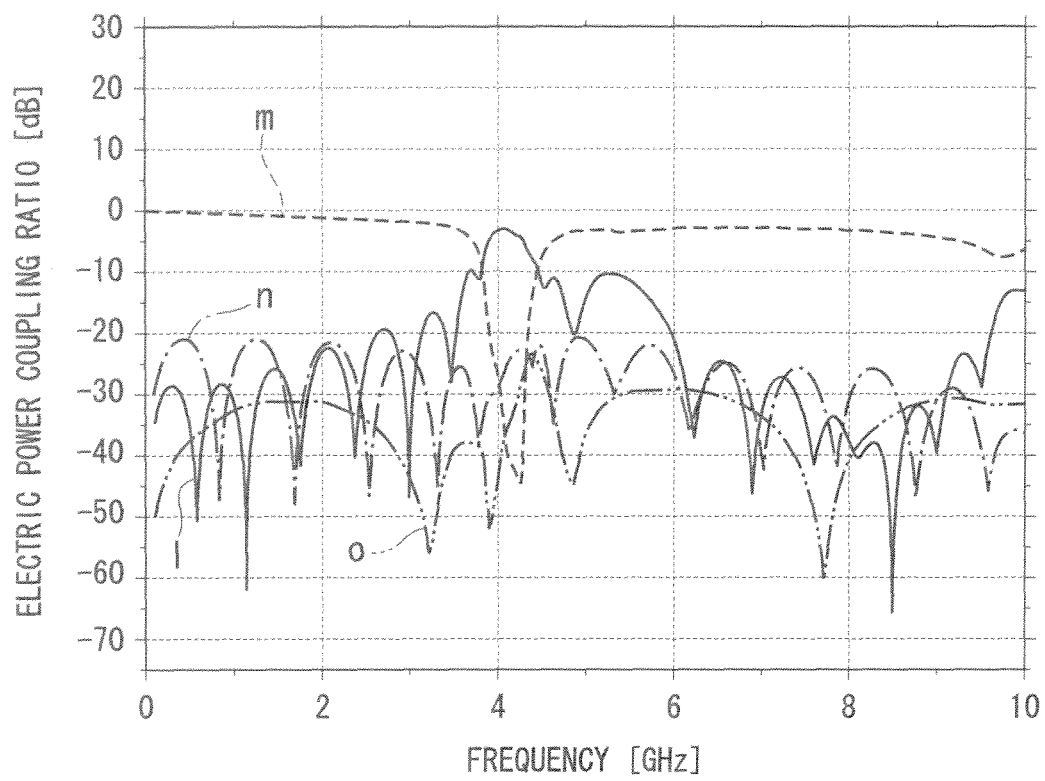
FIG. 11 is a diagram illustrating electromagnetic field analysis results according to the second exemplary embodiment of the present invention.

FIG. 11 shows the calculation results. FIG. 11 is a graph obtained by representing a frequency (GHz) up to 10 GHz at the horizontal axis and an electric power coupling ratio (dB) at the vertical axis.

In FIG. 11, a solid line 1 represents reflectance at the first port P1. A broken line m represents a coupling ratio from the first port P1 to the second port P2. An alternating long and short dashed line n represents a coupling ratio from the first port P1 to the third port P3. An alternating long and two short dashed line o represents a coupling ratio from the first port P1 to the fourth port P4.

As seen from FIG. 11, there is a tendency that the electromagnetic waves which propagate through the leaking electromagnetic wave layer 35 are dramatically reduced at a certain frequency band, particularly, a frequency band around 4.2 GHz, at the same time as the reflection is increased at the certain frequency band, and a coupling ratio to the electromagnetic wave propagation layer 21 is improved. This indicates that it is possible to suppress leakage of the electromagnetic waves from a gap between the power feeding device unit 11 and the electromagnetic wave propagation layer 21, that is, the leaking electromagnetic wave layer, to the outside at certain frequencies by employing the exemplary embodiments of the present invention.

(Third Exemplary Embodiment)

Figure 12:
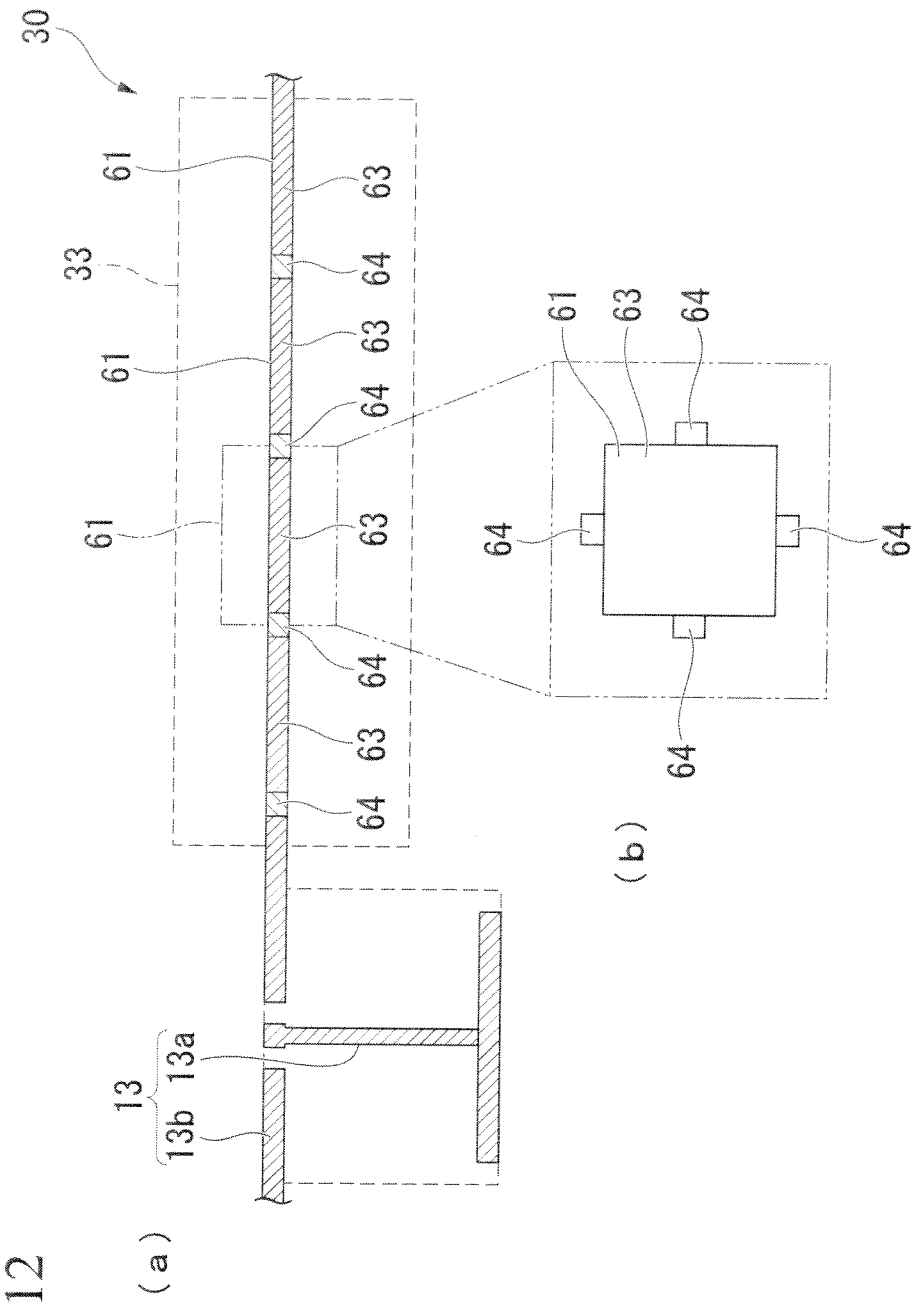
FIGS. 12a and 12b are diagrams illustrating a third exemplary embodiment of the surface communication device of the present invention.

FIG. 12 is a diagram for specifically explaining a third exemplary embodiment of the artificial impedance conductor 33 which constitutes the leaking electromagnetic wave suppression unit 30.

shown in part of FIG. 12, the artificial impedance conductor 33 is configured in this exemplary embodiment so that one or more artificial impedance conductor unit structures 61 two-dimensionally surround the reference conductor 13b of the transmission electromagnetic wave coupling unit 13. Part (b) of FIG. 12 shows a top diagram of the artificial impedance conductor unit structure 61.

The artificial impedance conductor unit structure 61 represents a unit structure which constitutes the artificial impedance conductor 33.

The artificial impedance conductor unit structure 61 is configured of a patch conductor 63 having a rectangular plate shape, and connection wires 64 which are wires electrically connecting the adjacent patch conductors 63.

In FIG. 12, the patch conductor 63 has a rectangular plate shape, but has not necessarily to have a rectangular shape. For example, the patch conductor 63 may have a polygonal shape, or be formed in a shape including a smooth boundary, such as a circular shape.

Therefore, a resonance phenomenon owing to the capacitive coupling between the adjacent patch conductors 63 and the inductive coupling by the connection wire 64 become predominant at certain frequencies, and it is possible to approximately express them as an equivalent circuit in which parallel resonant circuits are connected in series. Most of the leaking electromagnetic waves are reflected by the leaking electromagnetic wave layer 35, or pass through the mesh layer 22 to be input to the electromagnetic wave propagation layer 21, and as a result the leaking electromagnetic waves can be suppressed from being leaked to the outside of the device. In this exemplary embodiment, the connection wires 64 are positioned at midpoints of the end portion sides of the patch conductor 63, but have not necessarily to be positioned at the midpoints. The connection wires 64 may be, for example, positioned at the corners of the sides.

Figure 13:
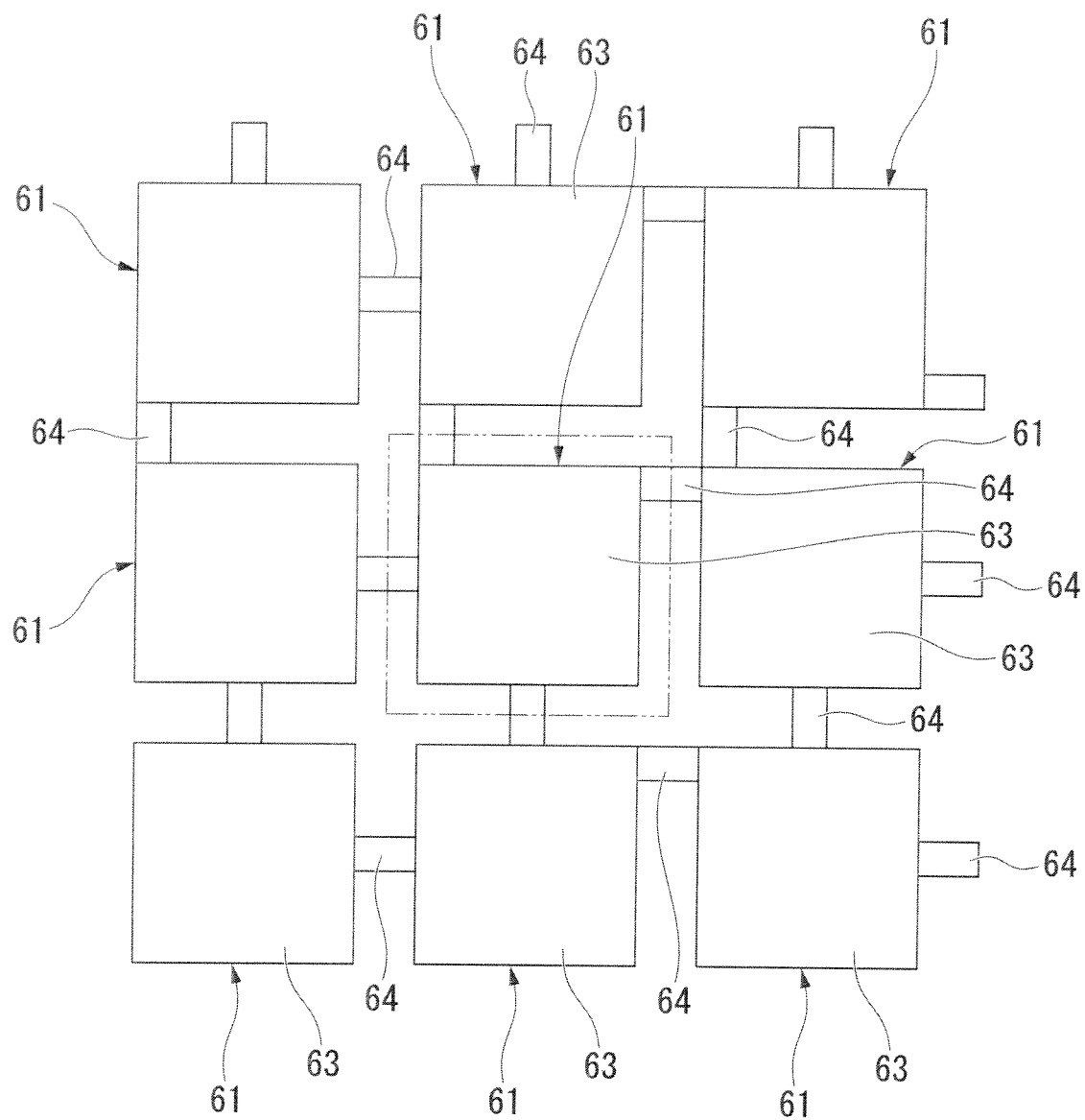
FIG. 13 is a plan diagram illustrating a first modification example of the third exemplary embodiment of the surface communication device of the present invention.

The inductance of the above-described equivalent parallel resonant circuit depends on the positional relationship between the connection wires 64 and the patch conductors 63. Therefore, by making the number of the combinations of the positional relationships of the connection wires 64 and the patch conductors 63 2 or more, as shown in FIG. 13, the combinations of the resonance frequencies of the above-described equivalent parallel resonant circuits are made to be plural. As a result, it is possible to convert a frequency band at which leakage of the electromagnetic waves is suppressed into a wideband or achieve an effect of suppressing the leakage of the electromagnetic waves at a plurality of bands. FIG. 13 shows two kinds of the positional relationship combinations in which the connection wires 64 are positioned at the midpoints of the end portion sides of the patch conductor 63 and positioned at the corners. For example, since the resonance frequencies are slightly differently combined by slightly differently combining the positional relationships between the connection wire 64 and the patch conductor 63, the suppression band of the leaking electromagnetic waves is widened. Also, since the difference in resonance frequencies increases by extremely differently combining the above positional relationships, the suppression band of the leaking electromagnetic waves become a wider band or it is possible to obtain a suppression effect of the leakage at a plurality of bands, owing to the combination of such different resonance frequencies.

Figure 14:
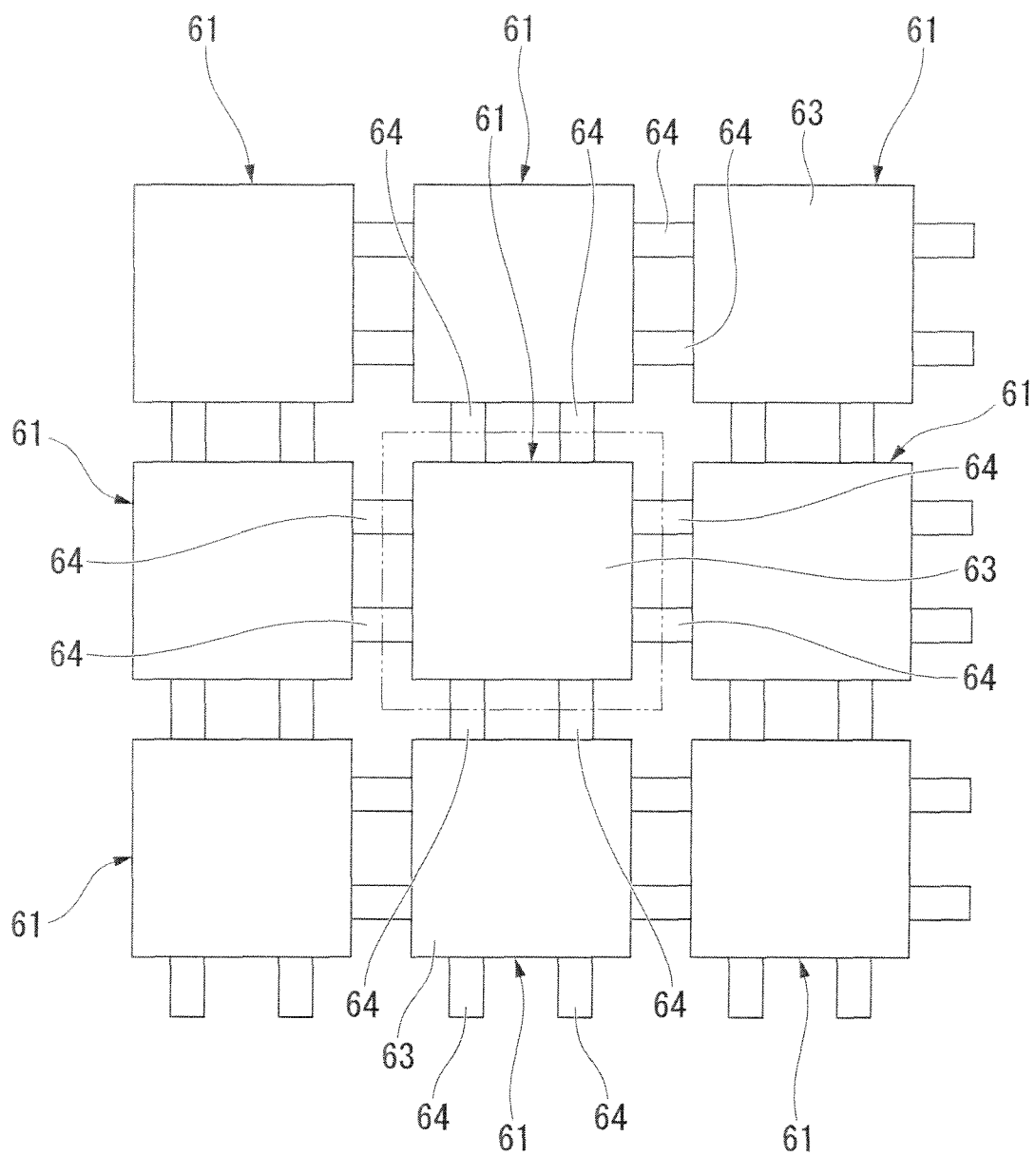
FIG. 14 is a plan diagram illustrating a second modification example of the third exemplary embodiment of the surface communication device of the present invention.
Figure 15:
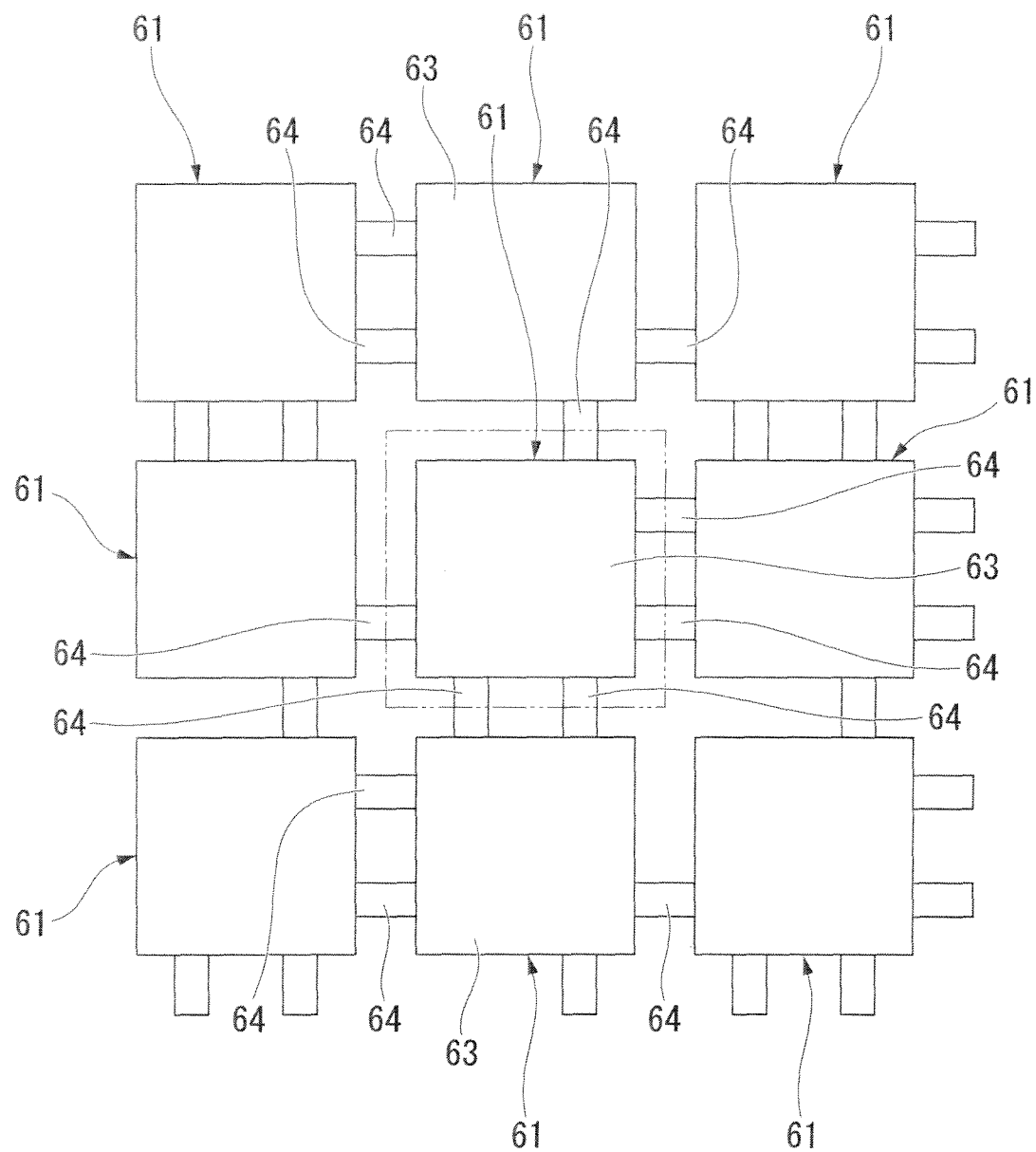
FIG. 15 is a plan diagram illustrating a third modification example of the third exemplary embodiment of the surface communication device of the present invention.
Figure 16:
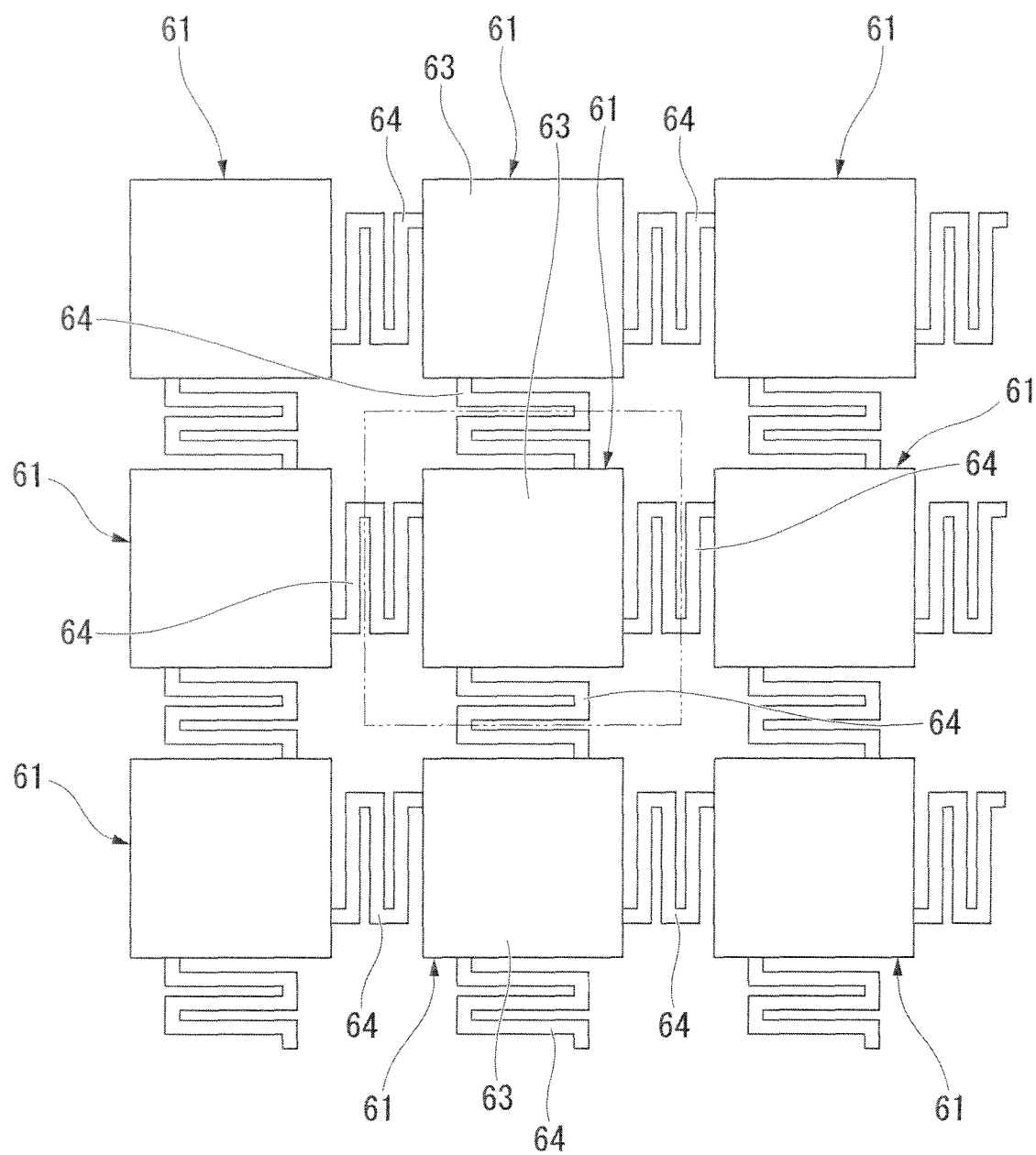
FIG. 16 is a plan diagram illustrating a fourth modification example of the third exemplary embodiment of the surface communication device of the present invention.

In this exemplary embodiment, the connection wire 64 connecting the adjacent patch conductors 63 is present in a single form, hut has not necessarily to be present in a single form. For example, when the number of the connection wires 64 connecting the adjacent patch conductors 63 is 2 or more as shown in FIG. 14, the inductance of the above-described equivalent parallel resonant circuits decreases compared to that of one connection wire 64, thereby shifting the resonance frequencies toward high frequencies. As a result, it is possible to convert the frequency band at which leakage of the electromagnetic waves is suppressed into high frequencies. The number of the above-described connection wires 64 connecting the adjacent patch conductors 63 may be set to a plurality of different combinations, as shown in FIG. 15. In this case, depending on the number combination or the positional relationship, there is realized a plurality of combinations having slightly different resonance frequencies as described above, or a plurality of combinations having highly different resonance frequencies. Therefore, it is possible to convert the suppression band of the leaking electromagnetic waves into a wide band or obtain an effect of suppressing leakage of the electromagnetic waves at a plurality of bands.

In this exemplary embodiment, the connection wire 64 is a wire having a linear shape, but has not necessarily to have a linear shape, and it may be a wire having a detour shape. For example, the connection wire 64 may be detoured in a Meander shape (zigzag shape).

When the connection wire 64 is detoured as described above, the wire has a stronger inductance than a linear wire, and thus the above-described resonance frequencies are decreased. That is, it is possible to convert the suppression band of the leaking electromagnetic waves into low frequencies.

In the artificial impedance structure described in this exemplary embodiment, by increasing a dielectric constant of a space adjacent to the artificial impedance structure to a great extent, the suppression hand of the leaking electromagnetic waves can he converted into low frequencies. This is because the capacity of the above-described equivalent parallel resonant circuits increases and thus the resonance frequencies are shifted toward the low frequencies.

Figure 17:
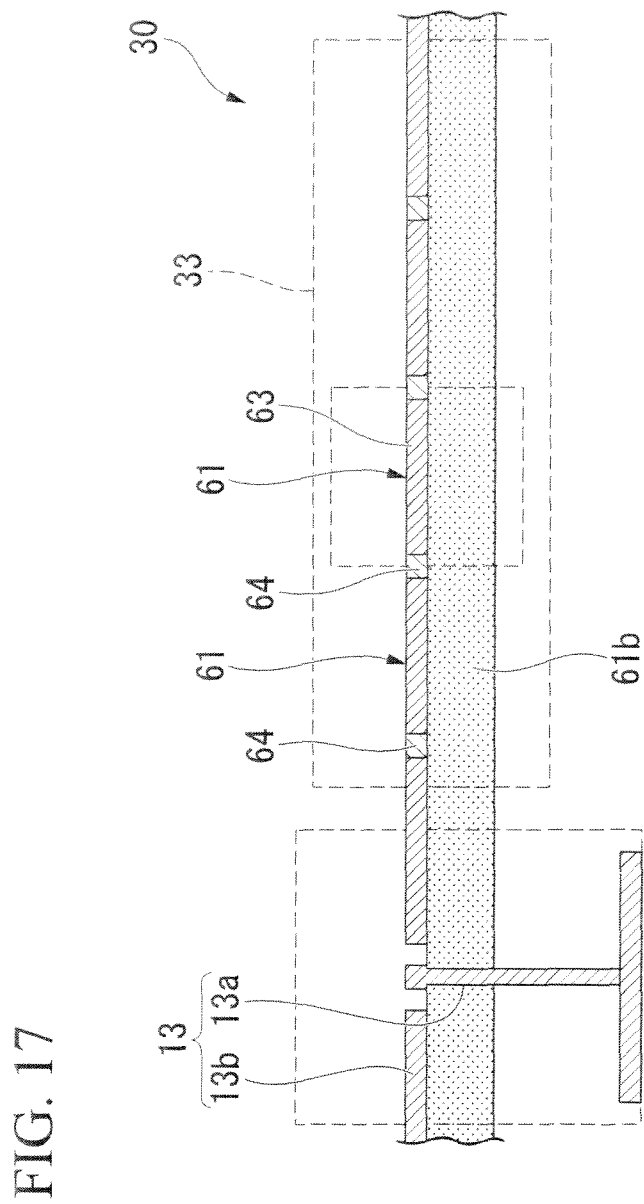
FIG. 17 is a cross-sectional diagram lustrating a fifth modification example of the third exemplary embodiment of the surface communication device of the present invention.

FIG. 17 shows he case of a high dielectric layer 61b in which a dielectric constant of a layer in contact with a lower side of the artificial impedance structure is higher than those of the other leaking electromagnetic wave layers.

Figure 18:
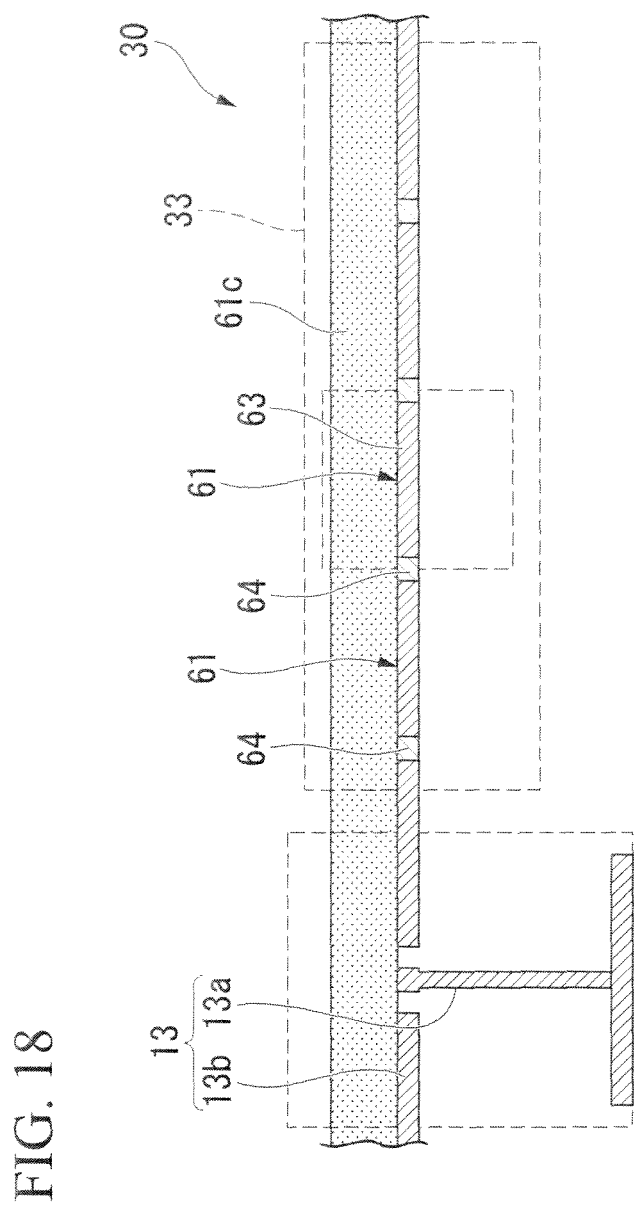
FIG. 18 is a cross-sectional diagram illustrating a sixth modification example of the third exemplary embodiment of the surface communication device of the present invention.

FIG. 18 shows the case of a high dielectric layer 61c in which a dielectric constant of a layer in contact with an upper side of the artificial impedance structure is higher than those of the leaking electromagnetic wave layers.

Figure 19:
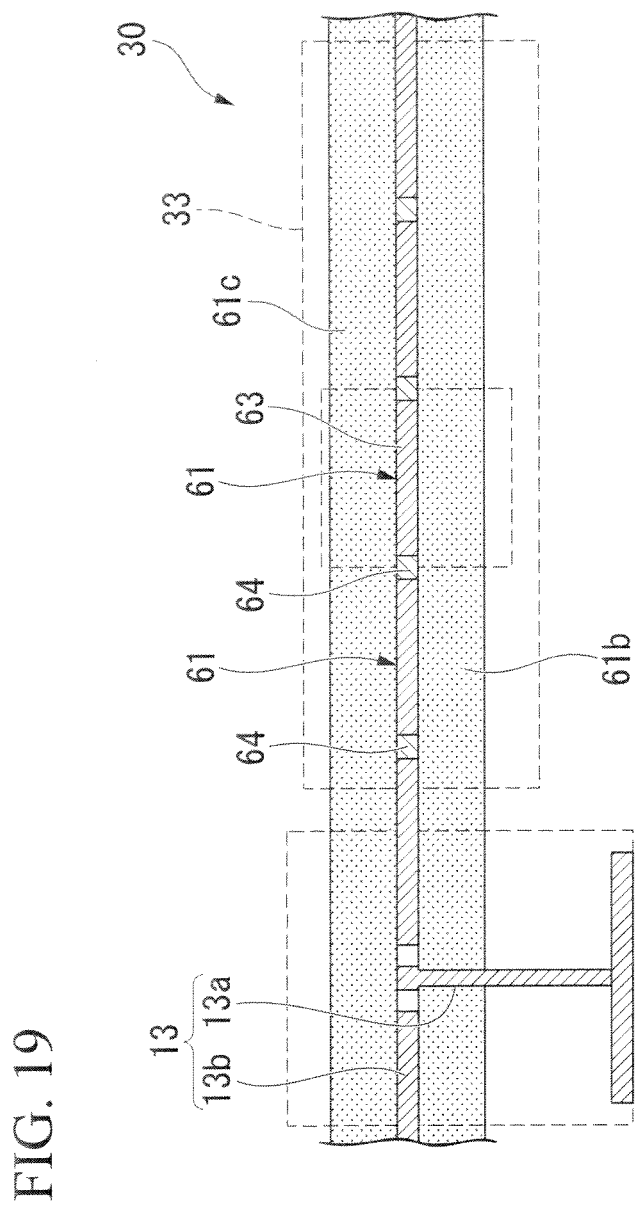
FIG. 19 is a cross-sectional diagram illustrating a seventh modification example of the third exemplary embodiment of the surface communication device of the present invention.

FIG. 19 shows the case of high dielectric layers 61b and 61c in which dielectric constants of layers in contact with upper and lower sides of the artificial impedance structure are higher than those of the other leaking electromagnetic wave layers. In all the cases of FIGS. 17 to 19, it is possible to convert a band of leaking electromagnetic waves into low frequencies, as described above.

(Fourth Exemplary Embodiment)

Figure 20:
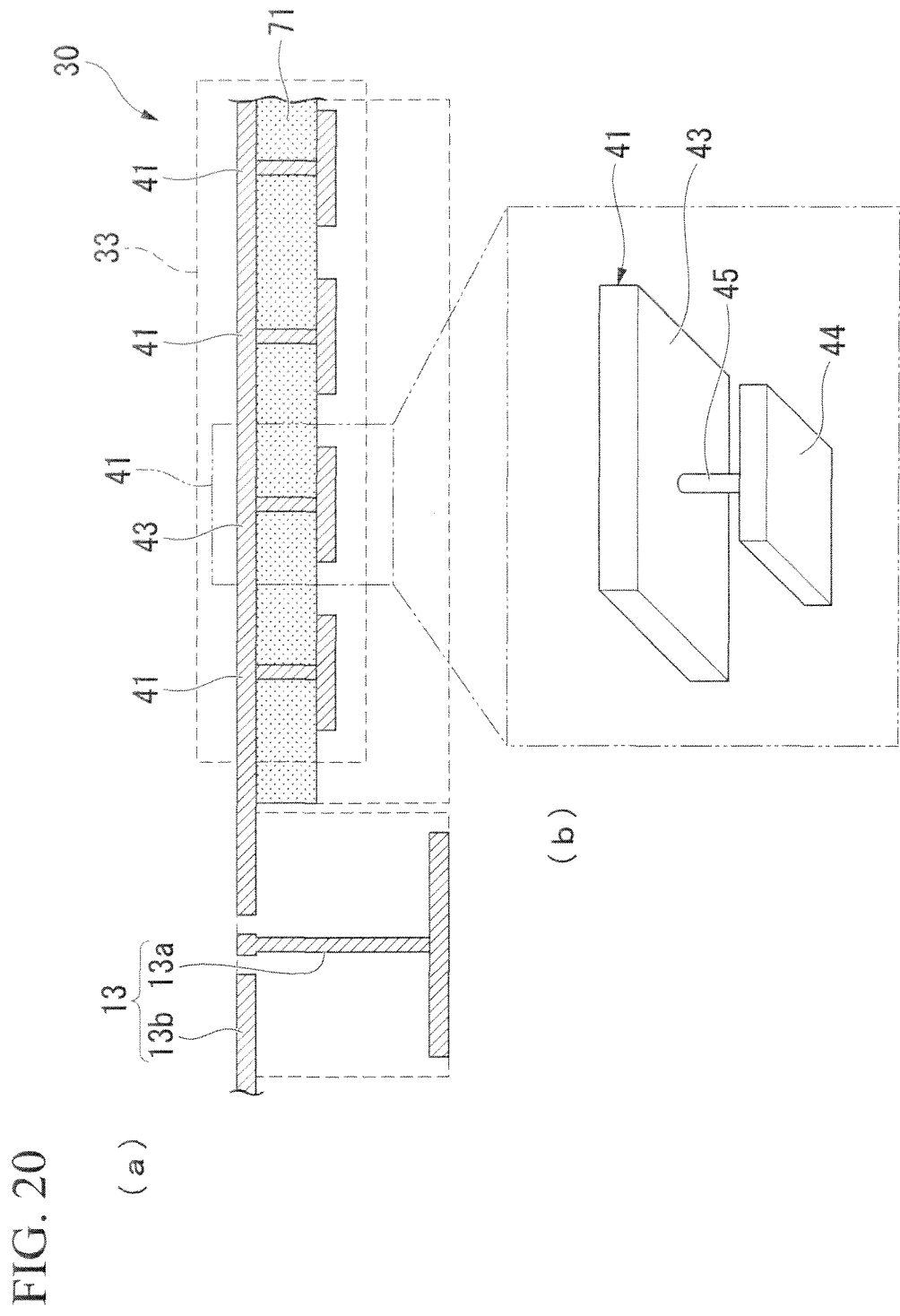
FIGS. 20a and 20b are diagrams illustrating a fourth exemplary embodiment of the surface communication device of the present invention.

FIG. 20 is a diagram for specifically explaining a fourth exemplary embodiment of the artificial impedance conductor 33 which constitutes the leaking electromagnetic wave suppression unit 30. Part (a) of FIG. 20 shows a leaking electromagnetic wave suppression unit 30. Part (b) of FIG. 20 shows a perspective diagram of the patch conductor 44.

The configuration shown in FIG. 20 is substantially identical to the configuration described in the first exemplary embodiment shown in FIG. 5. The configuration of the fourth exemplary embodiment shown in FIG. 20 is different from the configuration of the first exemplary embodiment shown in FIG. 5 in that an artificial impedance conductor intermediate layer 71 that is a layer between the reference conductor 43 and the patch conductor 44 is configured of a material which has a higher dielectric constant than a medium constituting the leaking electromagnetic wave layer 35.

In this way, by providing the artificial impedance conductor intermediate layer 71, the dimensions of a patch conductor having high impedance at certain frequencies can be reduced. This configuration can be realized by employing a BC (buried capacitor) board used for a printed circuit board for example as the artificial impedance conductor intermediate layer 71.

In such a configuration, the unit structure can be minimized by applying a material having a high dielectric constant between the patch conductor 44 and the reference conductor 43. This is because the capacitance between the patch conductor 44 and the reference conductor 43 is increased compared to the configuration of the first exemplary embodiment shown in FIG. 5 by providing the artificial impedance conductor intermediate layer 71, thereby correspondingly reducing an area of the patch conductor to resonate at certain frequencies.

Figure 21:
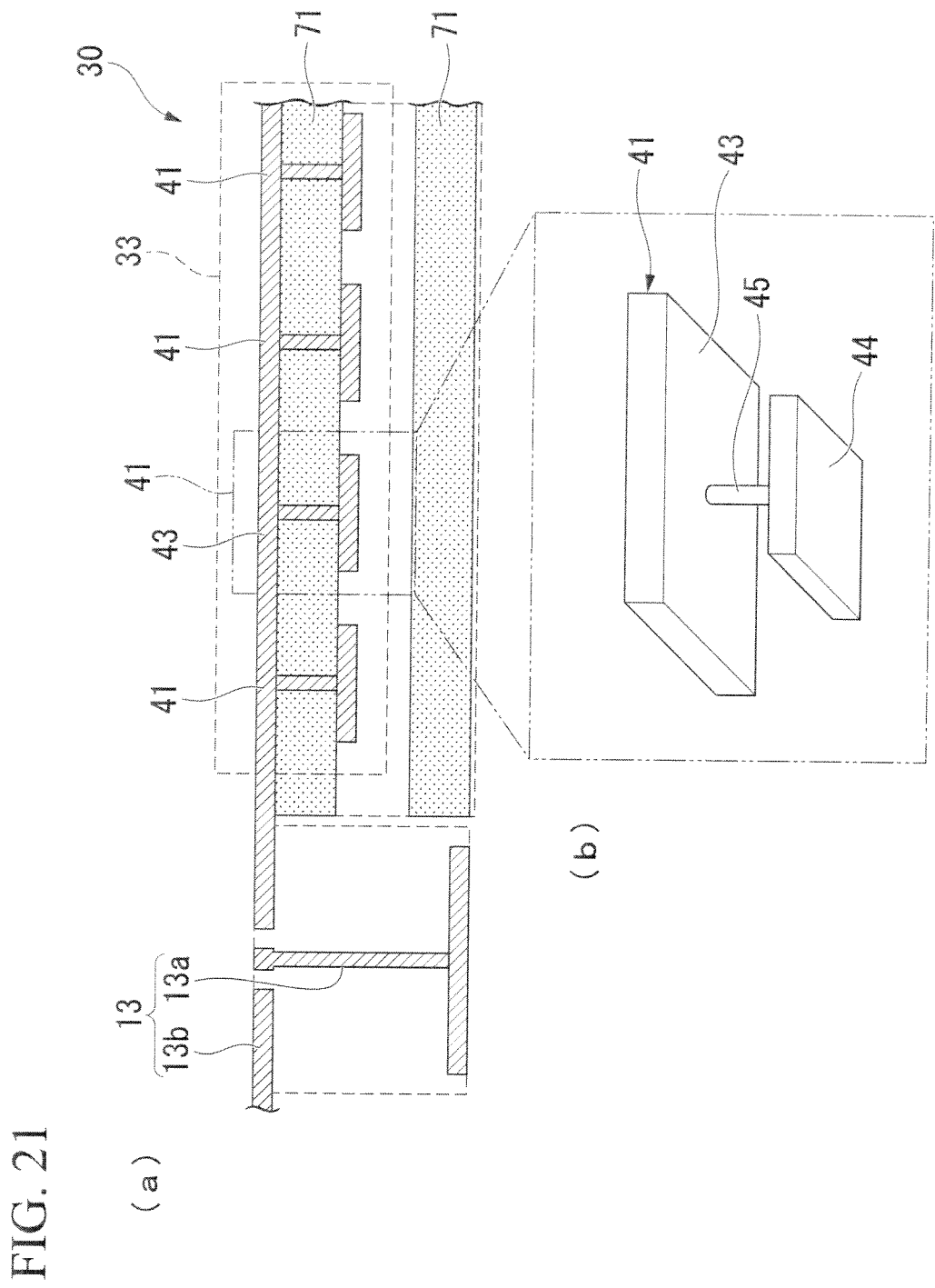
FIGS. 21a and 21b are diagrams illustrating a modification of the fourth exemplary embodiment of the surface communication device of the present invention.

In the fourth exemplary embodiment, a structure in which a high dielectric constant layer is formed at a lower side of the leaking electromagnetic wave layer is assumed in the process of the substrate to construct the artificial impedance conductor 33, as shown in FIG. 21. In this case, an effect of reducing an area of the patch conductor to resonate at certain frequencies can also be anticipated, as with above.

(Fifth Exemplary Embodiment)

Figure 22:
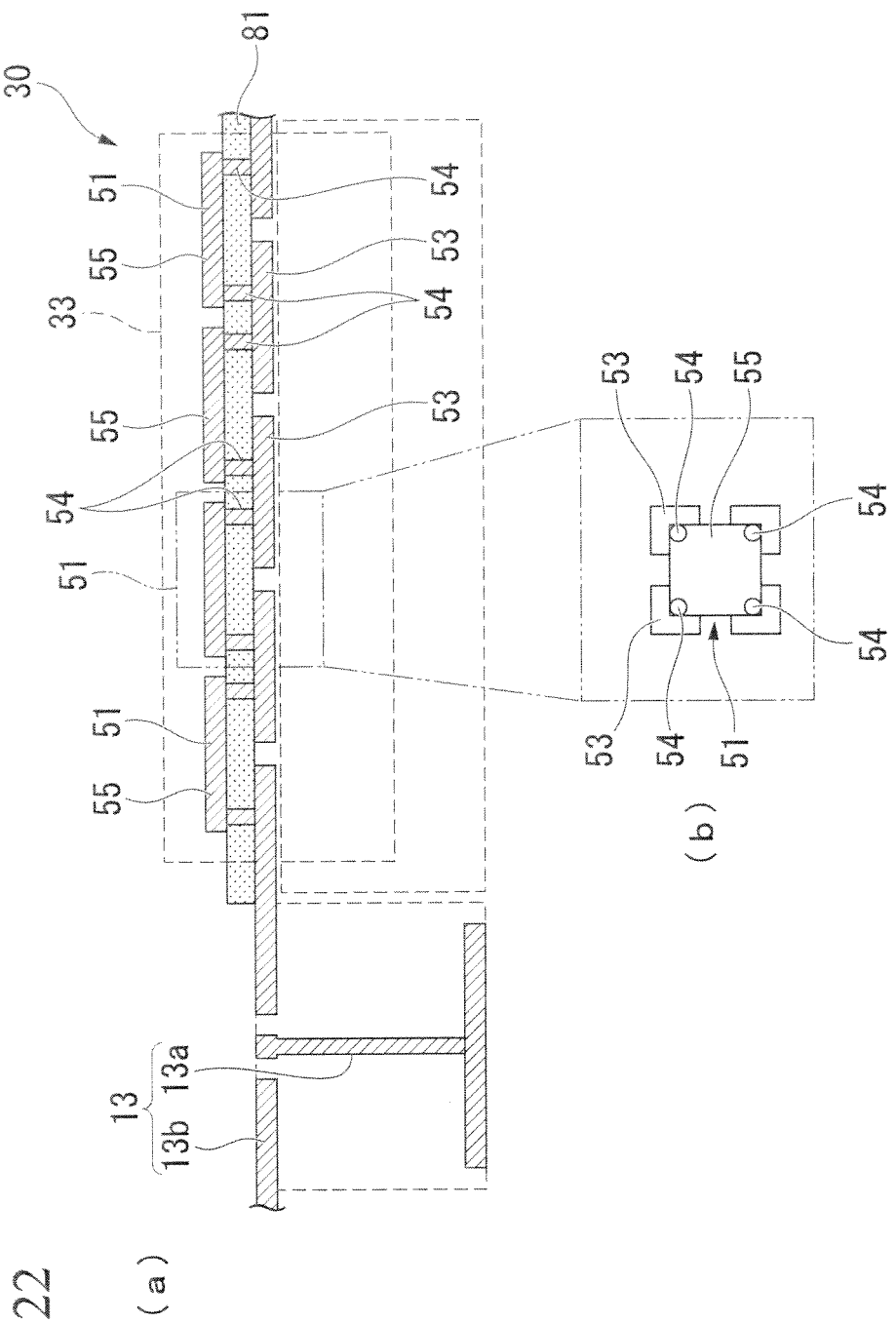
FIGS. 22a and 22b are diagrams illustrating a fifth exemplary embodiment of the surface communication device of the present invention.

FIG. 22 is a diagram for specifically explaining a fifth exemplary embodiment of the artificial impedance conductor 33 which constitutes the leaking electromagnetic wave suppression unit 30. Part (a) of FIG. 22 shows a leaking electromagnetic wave suppression unit 30. Part (b) of FIG. 22 shows a top diagram of an artificial impedance conductor unit structure 51.

The configuration shown in FIG. 22 is substantially identical to the configuration described in the second exemplary embodiment shown in FIG. 8. The configuration shown in FIG. 22 is different from the configuration shown in FIG. 8 in that an artificial impedance conductor intermediate layer 81 that is a layer between the reference conductor 53 and the patch conductor 55 is formed of a material which has a higher dielectric constant than a dielectric constant of a medium constituting the leaking electromagnetic wave layer 35.

In this way, by providing the artificial impedance conductor intermediate layer 81, the dimensions of a patch conductor having high impedance at certain frequencies can be reduced compared to the second exemplary embodiment shown in FIG. 8. This configuration can be realized by employing a BC (Buried Capacitor) board used for a printed circuit board for example as the leaking electromagnetic wave suppression unit 30.

In such a configuration, the artificial impedance conductor unit structure 51 can also be minimized by applying a material having a high dielectric constant between the patch conductor 55 and the reference conductor 53.

Figure 23:
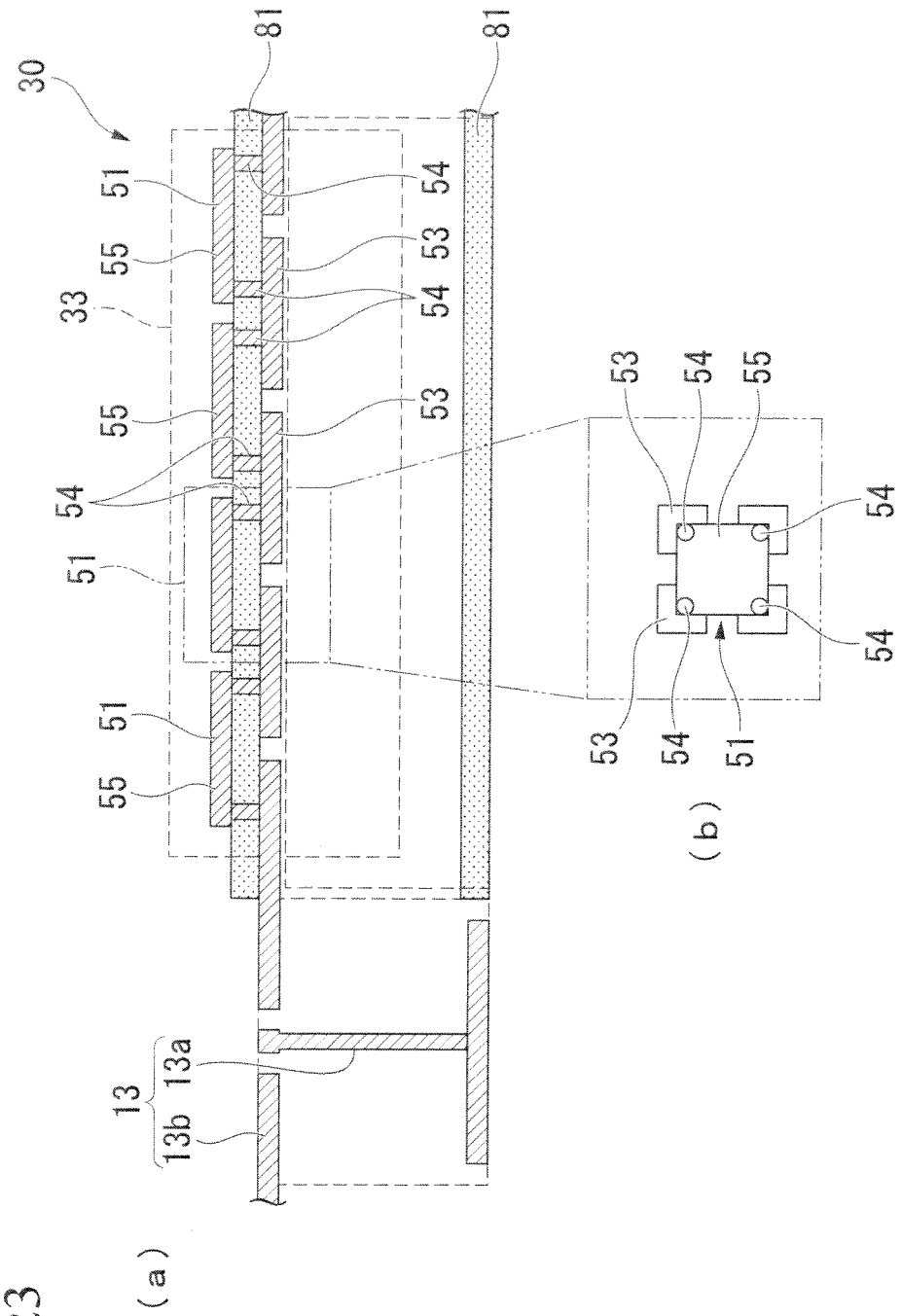
FIGS. 23a and 23b are diagrams illustrating a modification example of the fifth exemplary embodiment of the surface communication device of the present invention.

In the fifth exemplary embodiment, a structure in which a high dielectric constant layer is also formed at a lower side of the leaking electromagnetic wave layer is assumed in the process of the substrate to construct the artificial impedance conductor 33, as shown in FIG. 23. In this case, an effect of reducing an area of the patch conductor to resonate at certain frequencies can also be anticipated, as with above.

(Sixth Exemplary Embodiment)

Figure 24:
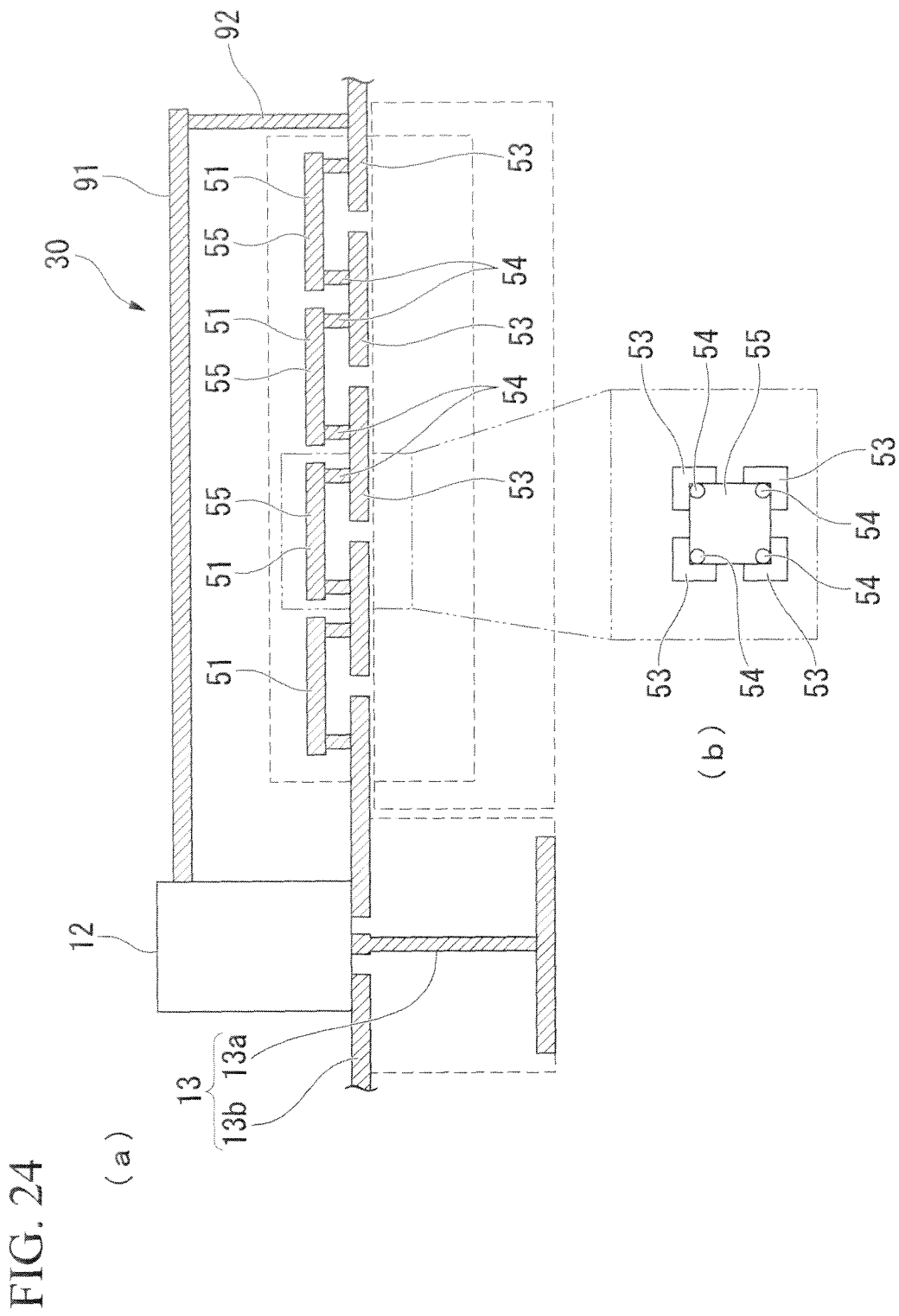
FIGS. 24a and 24b are diagrams illustrating a sixth exemplary embodiment of the surface communication device of the present invention.

FIG. 24 is a diagram for specifically explaining a sixth exemplary embodiment of the artificial impedance conductor 33 which constitutes the leaking electromagnetic wave suppression unit 30. Part (a) of FIG. 24 shows a leaking electromagnetic wave suppression unit 30. Part (b) of FIG. 24 shows a top diagram of an artificial impedance conductor unit structure 51.

The configuration shown in HG. 24 is substantially identical to the configuration described in the second exemplary embodiment shown in FIG. 8, but is different in the following aspects. In the leaking electromagnetic wave suppression unit 30 shown in FIG. 24. a shielding conductor plane (second conductor) 91 is provided above the upper layer patch conductor 55 so as to cover the artificial impedance conductor 33. Also, a shielding conductor post (second conductor post) 92 which connects the shielding conductor plane 91 and an end of the reference conductor 53 at a side of an out-of-device region 36 is provided in the leaking electromagnetic wave suppression unit 30 shown in FIG. 24.

In this way, an effect of shielding unnecessary leakage of the electromagnetic waves from the artificial impedance conductor 33 having an opening portion is anticipated by installing the shielding conductor plane 91 and the shielding conductor post 92.

In the configuration shown in FIG. 24 the end at the side of the out-of-device region 36 is connected by the shielding conductor post 92. However, a member connecting the shielding conductor plane 91 and the end of the reference conductor 53 at the side of the out-of-device region 36 has not necessarily to have a post shape as long as it is a shielding conductor. For example, the shielding conductor plane 91 and the end of reference conductor 53 in contact with the out-of-device region 36 may be covered with a plane-shaped metal.

In FIG. 24, the unit structure of the artificial impedance conductor 33 is identical to the unit structure shown in FIG. 8. However, it is not limited thereto, and this exemplary embodiment can be applied to any artificial impedance conductors having an opening portion.

(Seventh Exemplary Embodiment)

Figure 25:
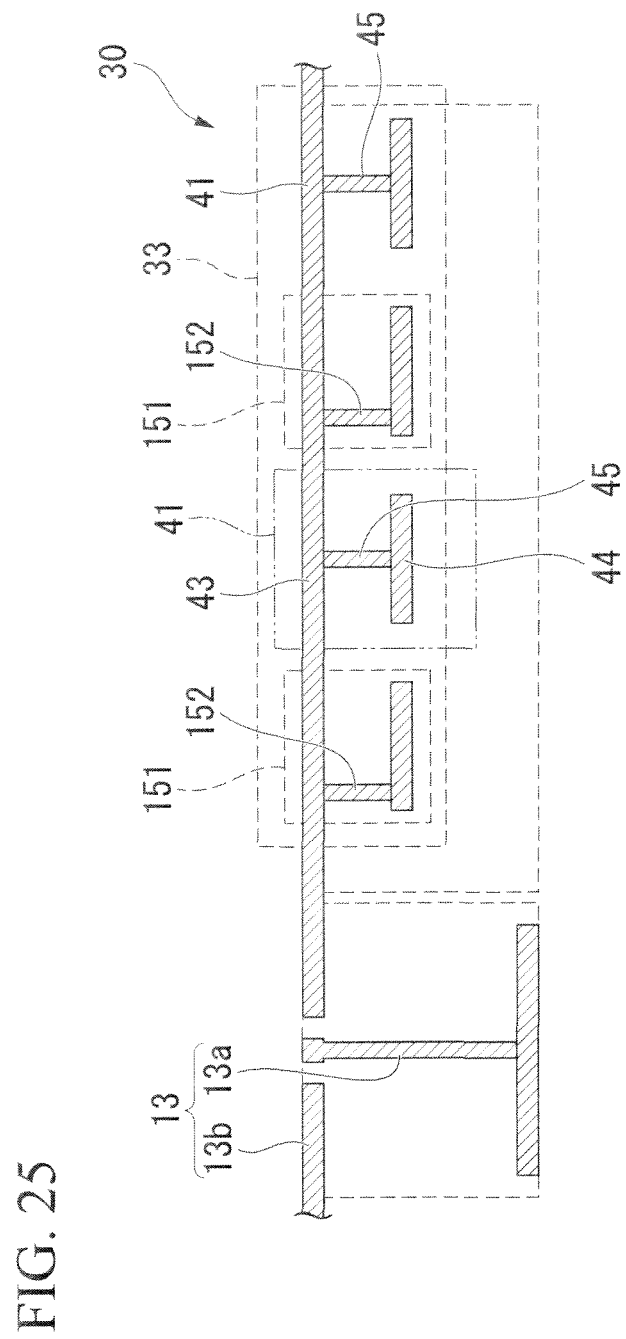
FIG. 25 is a diagram illustrating a seventh exemplary embodiment of the surface communication device of the present invention.

FIG. 25 is a diagram for specifically explaining a seventh exemplary embodiment of the artificial impedance conductor 33 for the leaking electromagnetic wave suppression unit 30.

The configuration shown in FIG. 25 is substantially identical to the configuration described in the first exemplary embodiment shown in FIG. 5, but is different in the following aspect. In the leaking electromagnetic wave suppression unit 30 shown in FIG. 25, the positional relationship of the conductor posts 45 of the unit structures 41, which constitute the artificial impedance conductor 33, with respect to the patch conductors 44 is different from the positional relationship of conductor posts 152 of adjacent unit structures 151 with respect to the patch conductors 44.

In this way, two or more kinds of the unit structures 41 and 151 are periodically arranged so that an effect of suppressing leakage of the electromagnetic waves at a plurality of frequency bands can be achieved. Moreover, when positions of the conductor posts 45 and 152 in the adjacent unit structures 41 and 151 are configured to be varied slightly, it is also possible to widen a band at which there is an effect of suppressing leakage of the electromagnetic waves, compared to a case in which the positions of the conductor posts are not different from each other.

(Eighth Exemplary Embodiment)

Figure 26:
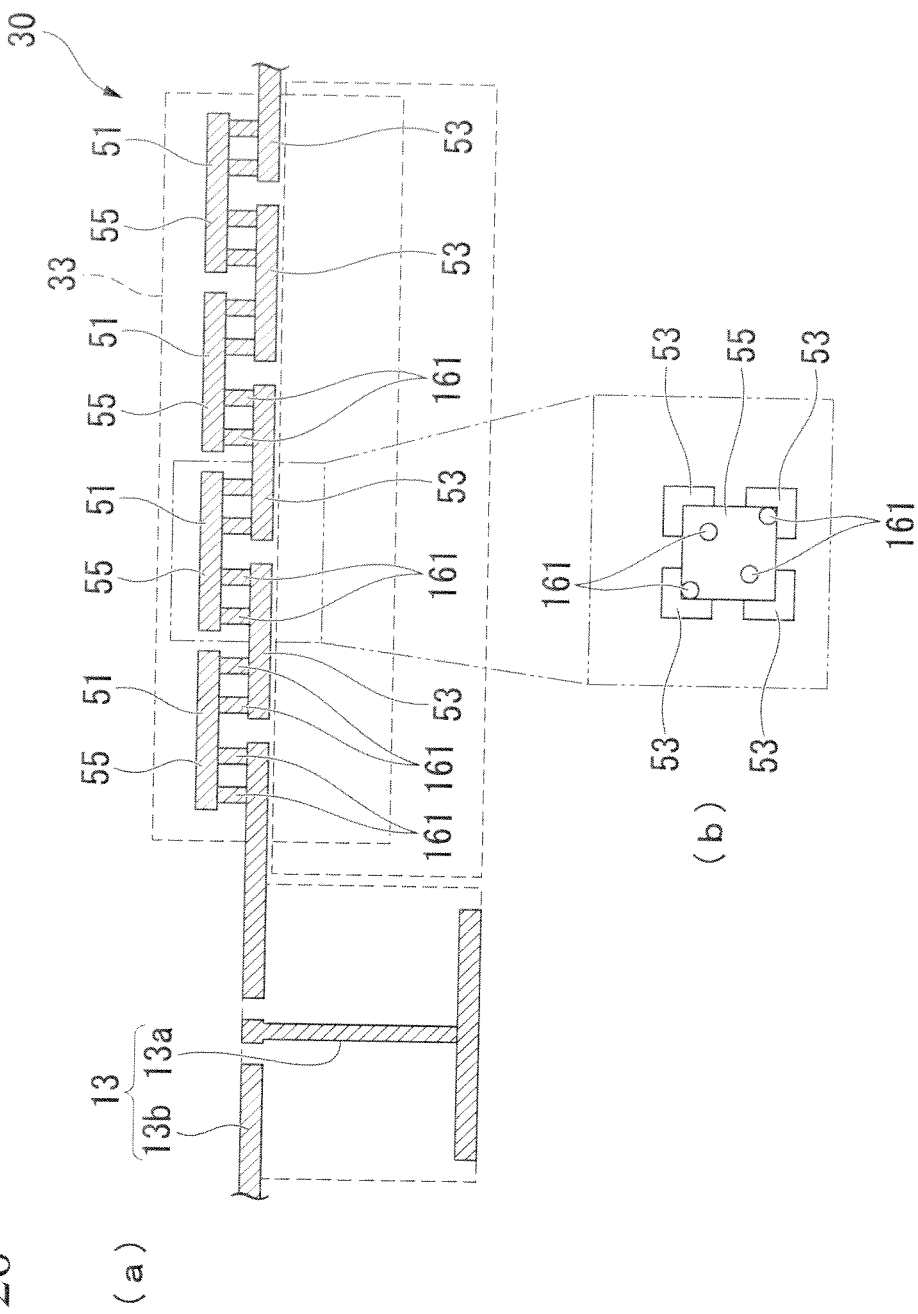
FIGS. 26a and 26b are diagrams illustrating an eighth exemplary embodiment of the surface communication device of the present invention.

FIG. 26 is a diagram for specifically explaining an eighth exemplary embodiment of the artificial impedance conductor 33 for the leaking electromagnetic wave suppression unit 30. Part (a) of FIG. 26 shows a leaking electromagnetic wave suppression unit 30. Part (b) of FIG. 26 shows a top diagram of an artificial impedance conductor unit structure 51.

In FIG. 26, a plurality of conductor posts 161 in the unit structures 51 which constitute the artificial impedance conductor 33 shown in FIG. 24 are not present in a symmetrical position with respect to a center of the patch conductor 55.

By periodically arranging unit structure groups having a structure in which the conductor posts 161 connected Co one or more patch conductors 55 are made to be asymmetrical with respect to the patch conductor 55, it is possible to change a band at which there is an effect of suppressing leakage of the electromagnetic waves, compared to the case of the symmetrical structures. For example, when unit structures in which the positions of the conductor posts 161 are slightly asymmetrical are applied to the artificial impedance conductor 33, it is possible to widen a band at which there is an effect of suppressing leakage of the electromagnetic waves, compared to a case in which the positions of the conductor posts 161 match in all the unit structures. This is because resonance frequencies of four regions which cause the resonance of the unit structure 51 are slightly varied by the positions of the conductor posts 161. Also, the positions of the four conductor posts 161 may be assigned to an extremely asymmetrical positional combination, and the above unit structures may be applied to the artificial impedance conductor 33. In this way the difference in four regions of resonance frequencies which cause the resonance of the unit structure 51 is made more significant than the above-described case. As a result, it is possible to achieve a wider frequency band or an effect of suppressing leakage of the electromagnetic waves at a plurality of frequency bands owing to the overlapping of the bands in the vicinity of these resonance frequencies.

(Ninth Exemplary Embodiment)

Figure 27:
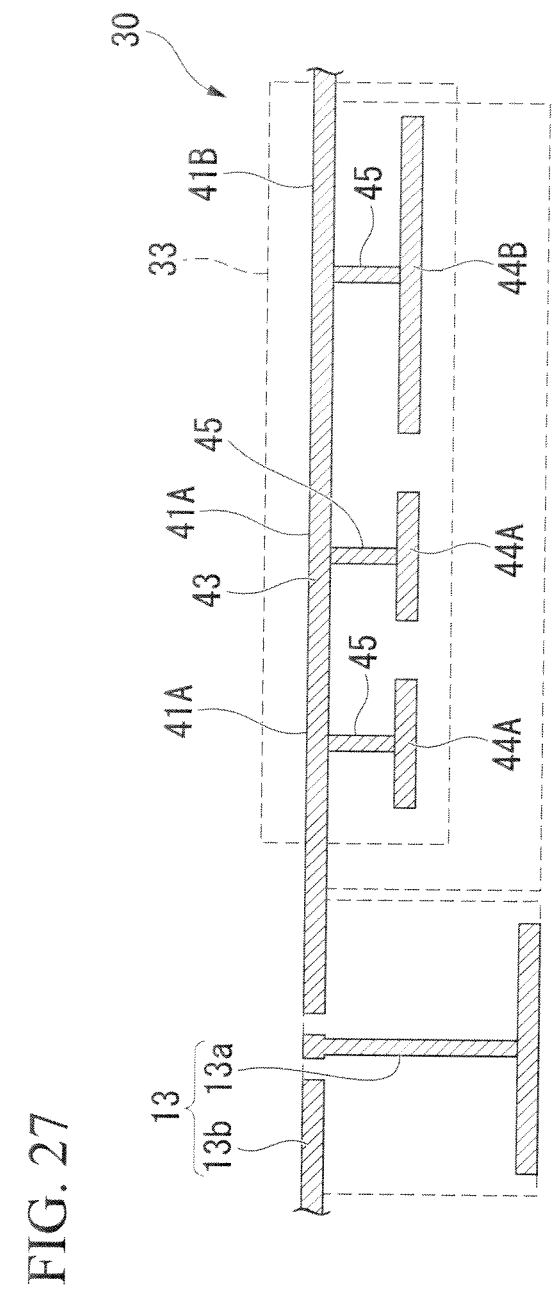
FIG. 27 is a diagram illustrating a ninth exemplary embodiment of the surface communication device of the present invention.

FIG. 27 is a diagram for specifically explaining a ninth exemplary embodiment of the artificial impedance conductor 33 for the leaking electromagnetic wave suppression unit 30.

In FIG. 27, the artificial impedance conductor 33 is configured using the same unit structures 41 as shown in FIG. 5. In this exemplary embodiment, two or more patch conductors 44A and 44B having different dimensions are used in the plurality of unit structures 41 which constitute the artificial impedance conductor 33. The unit structure 41A using the patch conductor 44A and the unit structure 41B using the patch conductor 44B having different dimensions from the patch conductor 44A are provided together. In this case, a plurality of resonance frequencies associated with the band in which there is an effect of suppressing leakage of the electromagnetic waves are present owing to the plurality of unit structures 41A and 41B using the patch conductors 44A and 44B which have different dimensions. As a result, it is possible to achieve a much wider frequency band or an effect of suppressing leakage of the electromagnetic waves at a plurality of frequency bands owing to the overlapping of the bands in the vicinity of these resonance frequencies.

(Tenth Exemplary Embodiment)

Figure 28:
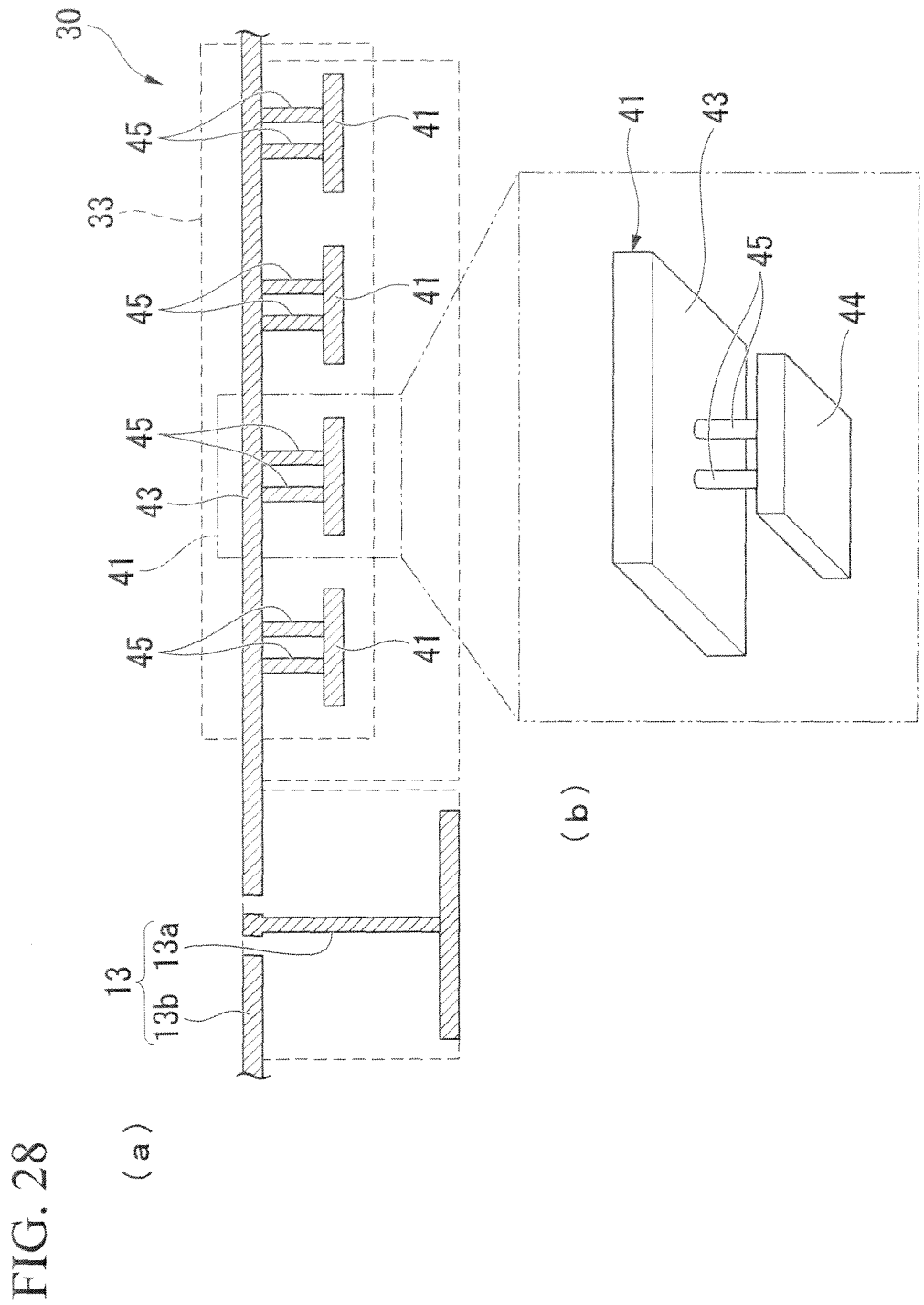
FIGS. 28a and 28b are diagrams illustrating a tenth exemplary embodiment of the surface communication device of the present invention.

FIG. 28 is a diagram for specifically explaining a tenth exemplary embodiment of the artificial impedance conductor 33 for he leaking electromagnetic wave suppression 30. Part (a) of FIG. 28 shows a leaking electromagnetic wave suppression unit 30. Part (b) of FIG. 28 shows a perspective diagram of an artificial impedance conductor unit structure 41.

In FIG. 28. the artificial impedance conductor 33 is configured using basically the same unit structures 41 shown in FIG. 5. In this exemplary embodiment, each of the plurality of unit structures 41 which constitute the artificial impedance conductor 33 has a plurality of conductor posts 45. In this case, as the unit structure 41 has the plurality of conductor posts 45, this affects the resonance frequencies associated with the band in which there is an effect of suppressing leakage of the electromagnetic waves. As a result, it is possible to obtain a suppression band of the leaking electromagnetic waves which is different from hen the single conductor post 45 is used. Specifically, since the inductance is lowered with an increase in number of the conductor posts 45, the resonance frequencies of the unit structure 41 are shifted toward the high frequencies, and thus it is possible to shift the suppression band of the leaking electromagnetic waves toward high frequencies.

(Eleventh Exemplary Embodiment)

Figure 29:
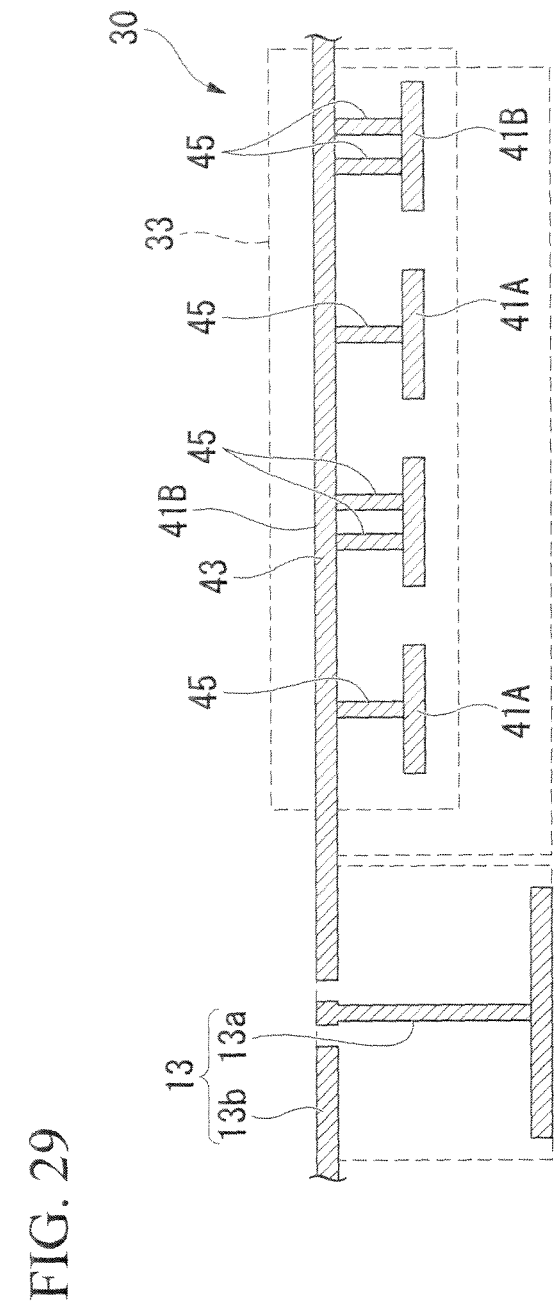
FIG. 29 is a diagram illustrating an eleventh exemplary embodiment of the surface communication device of the present invention.

FIG. 29 is a diagram for specifically explaining an eleventh exemplary embodiment of the artificial impedance conductor 33 for the leaking electromagnetic wave suppression unit 30.

In FIG. 29, the artificial impedance conductor 33 is configured using basically the same unit structures 41 shown in FIG. 5. In this exemplary embodiment, the artificial impedance conductor 33 is configured by combining two or more kinds of unit structures 41A and 41B which have different numbers of the conductor posts 45. In this exemplary embodiment, it is configured by combining the unit structure 41A having one conductor post 45 with the unit structure 41B having two conductor posts 45. The number of the conductor posts 45 may be any number as long as it is one or more. Also, kinds of the unit structures 41 (kinds of the unit structures 41 having different numbers of the conductor posts 45) to be combined are not limited to two kinds, but may be three or more kinds.

In the configuration as described above, the resonance associated with the band at which there is an effect of suppressing leakage of the electromagnetic waves is also generated at a plurality of frequencies according to the number of the kinds of the unit structures 41 having different numbers of the conductor posts 45. As a result, it is possible to obtain a suppression band of the leaking electromagnetic waves which is different from when the single conductor post is used. For example, when the plurality of resonance frequencies are significantly different, it is possible to obtain a plurality of suppression bands of the leaking electromagnetic waves. When the plurality of resonance frequencies are slightly different, it is possible to convert the suppression band of the leaking electromagnetic waves into a wideband.

(Twelfth Exemplary Embodiment)

Figure 30:
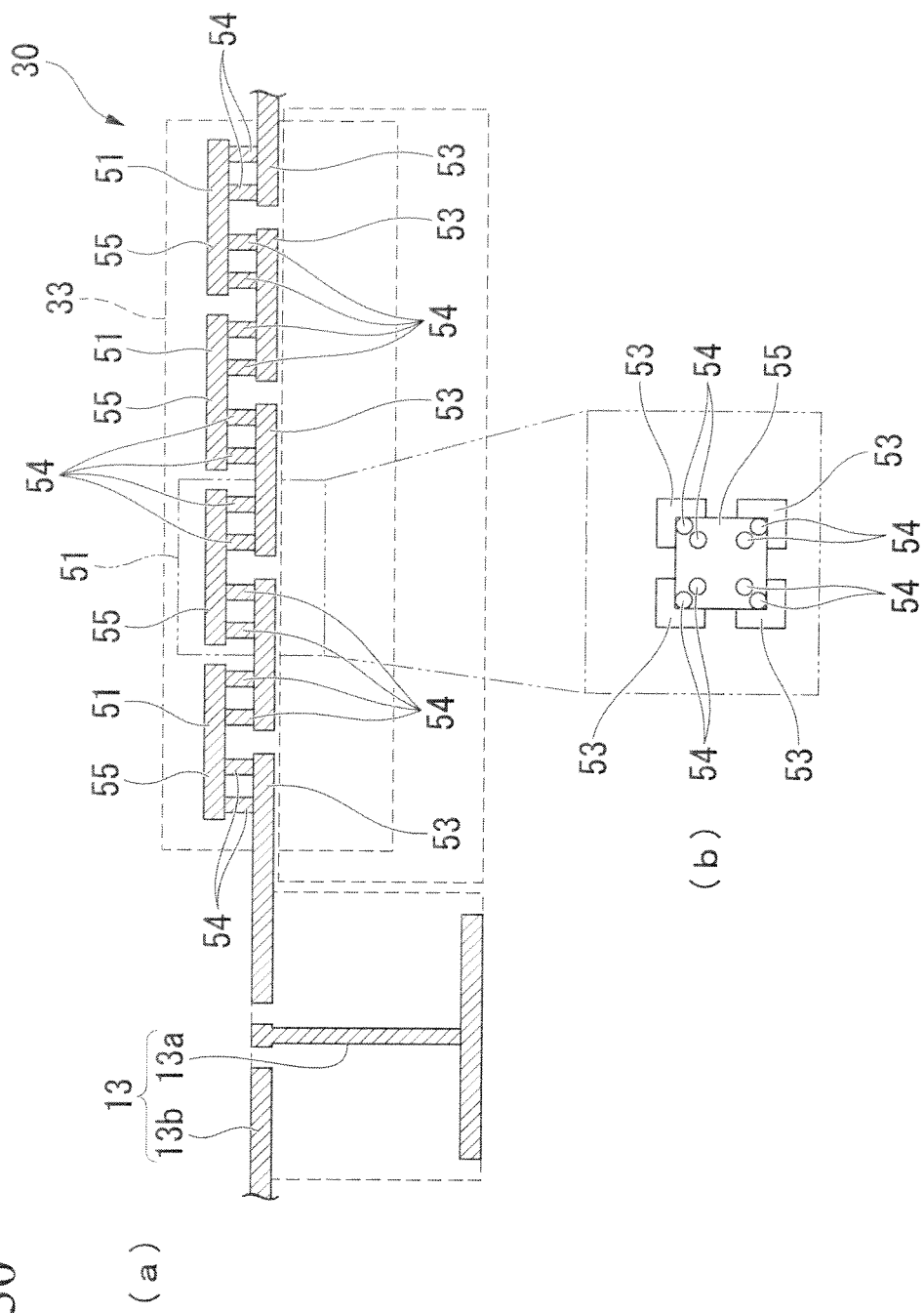
FIGS. 30a and 30b are diagrams illustrating a twelfth exemplary embodiment of the surface communication device of the present invention.

FIG. 30 is a diagram for specifically explaining a twelfth exemplary embodiment of the artificial impedance conductor 33 for the leaking electromagnetic wave suppression unit 30. Part (a) of FIG. 30 shows a leaking electromagnetic wave suppression unit 30. Part (b) of FIG. 30 shows a top diagram of an artificial impedance conductor unit structure 51.

In FIG. 30, the artificial impedance conductor 33 is configured using basically the same unit structures 51 shown in FIG. 8. Each of the upper layer patch conductors 55 and the reference conductors 53 which face each other are connected by means of a plurality of conductor posts 54. In this case, since this affects the resonance frequencies associated with a band at which there is an effect of suppressing leakage of the electromagnetic waves, it is possible to obtain a suppression band of the leaking electromagnetic waves which is different from when there is a single conductor post 54 that connects the upper layer patch conductor 55 and the reference conductor 53 which face each other. Specifically, the inductance is lowered with an increase in the number of conductor posts 54 that connect the upper layer patch conductor 55 and the reference conductor 53 which face each other. Therefore, the resonance frequencies are shifted toward high frequencies, and as a result it is possible to shift the suppression band of the leaking electromagnetic waves toward the high frequencies.

(Thirteenth Exemplary Embodiment)

Figure 31:
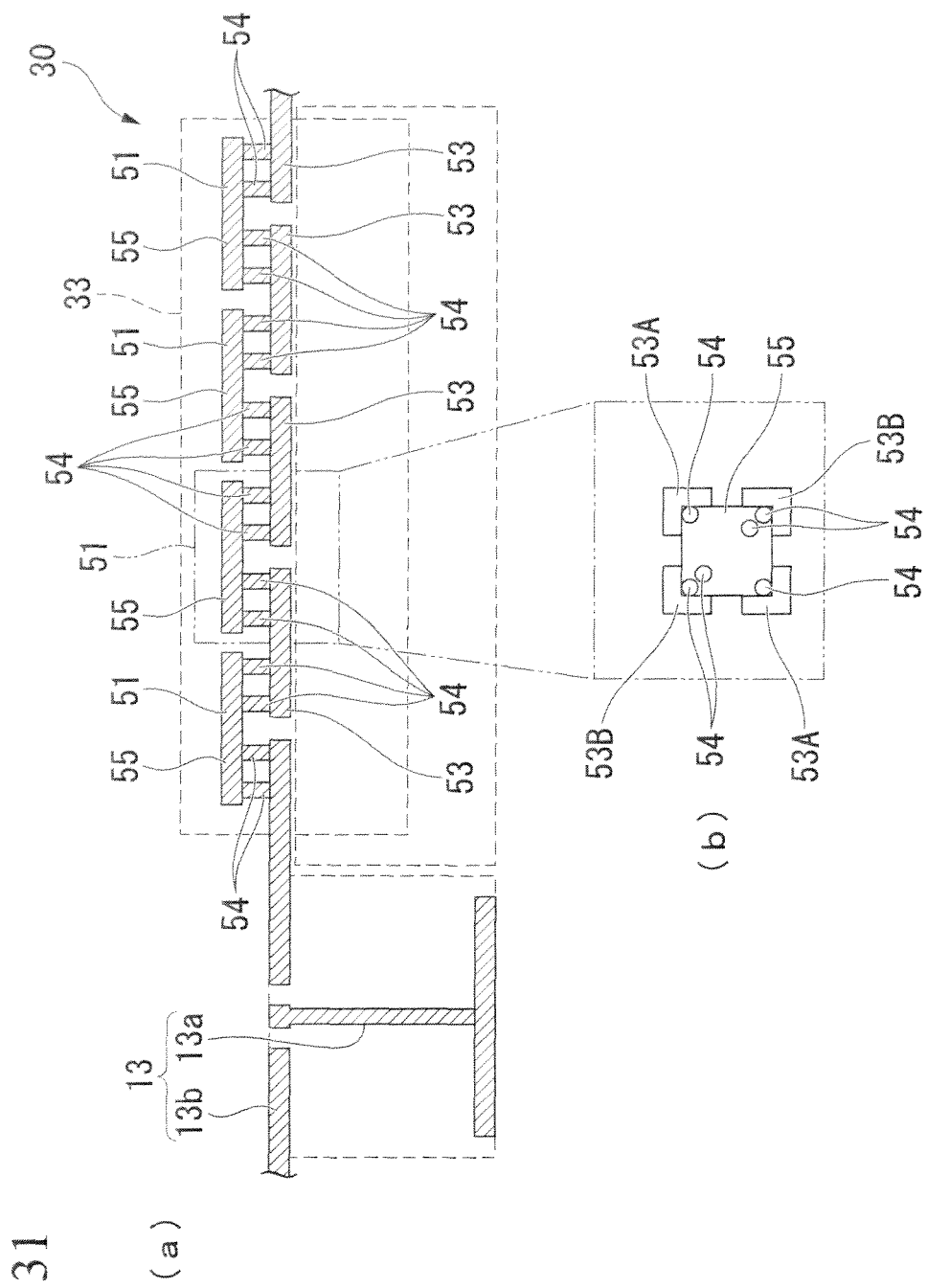
FIGS. 31a and 31b are diagrams illustrating a thirteenth exemplary embodiment of the surface communication device of the present invention.

FIG. 31 is a diagram for specifically explaining a thirteenth exemplary embodiment of the artificial impedance conductor 33 for the leaking electromagnetic wave suppression unit 30. Part (a) of FIG. 31 shows a leaking electromagnetic wave suppression unit 30. Part (b) of FIG. 31 shows a top diagram of an artificial impedance conductor unit structure 51.

In FIG. 31, the artificial impedance conductor 33 is configured using basically the same unit structures 51 shown in FIG. 8.

In this exemplary embodiment, in the artificial impedance conductor 33 the number of the conductor posts 54 connected to a plurality of reference conductors 53, which face the patch conductor 55 of each unit structure 51 is made to two or more. As shown in part (b) of FIG. 31, it is configured such that, with respect to the single patch conductor 55 the reference conductor 53A, which is connected to the patch conductor 55 via the single conductor post 54, and the reference conductor 53B, which is connected to the patch conductor 5 via the two conductor posts 54 are combined. The number of conductor posts 54 which connect each of the reference conductors 53A to the patch conductor 55 may be any number as long as it is one or more. Also, the number of conductor posts 54 which connect the reference conductor 53 to the single patch conductor 55 is not limited to types of one and two, and may be three or more types.

In the configuration as described above. since the resonance associated with the band at which there is an effect of suppressing leakage of the electromagnetic waves is also generated at a plurality of frequencies, it is possible to obtain a suppression band of the leaking electromagnetic waves which is different from the case of the single disposition of the conductor post 54. For example, when the plurality of resonance frequencies are significantly different, it is possible to secure a plurality of suppression bands of the leaking electromagnetic waves. When the plurality of resonance frequencies are slightly different, it is possible to convert the suppression band of the leaking electromagnetic waves into a wideband.

(Fourteenth Exemplary Embodiment)

Figure 32:
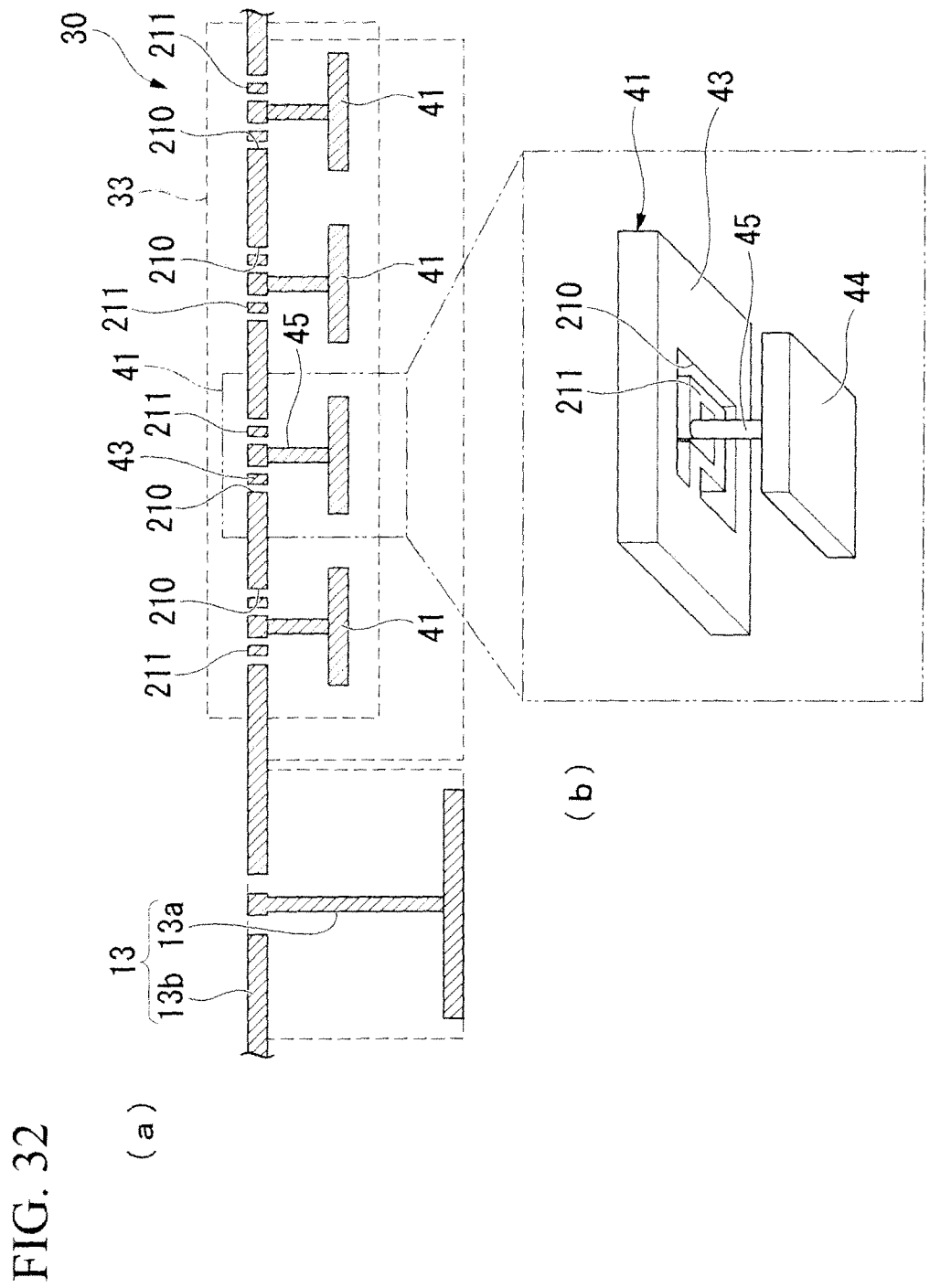
FIGS. 32a and 32b are diagrams illustrating a fourteenth exemplary embodiment of the surface communication device of the present invention.

FIG. 32 is a diagram for specifically explaining a fourteenth exemplary embodiment of the artificial impedance conductor 33 for the leaking electromagnetic wave suppression unit 30. Part (a) of FIG. 32 shows a leaking electromagnetic wave suppression unit 30. Part (b) of FIG. 32 shows a perspective diagram of an artificial impedance conductor unit structure 41.

In FIG. 32, the artificial impedance conductor 33 is configured using basically the same unit structures 41 shown in FIG. 5. In this exemplary embodiment, an open g portion 210 is formed in the reference conductor 43 of the unit structure 41. The reference conductor 43 and the conductor post 45 are connected by a conductor wire 211 which is provided in the opening portion 210 and has a spiral shape.

In this way, the inductance of the resonance can be increased by adding the spiral-shaped conductor wire 211 to the reference conductor 43, and as a result it is possible to convert a suppression band of the leaking electromagnetic waves into low frequencies.

In this exemplary embodiment, the conductor post 45 and the reference conductor 53 are connected through the spiral-shaped conductor wire 211. However, the conductor ire 211 has not necessarily to have a spiral shape as long as it is a metal conductor wire. For example, the conductor wire 211 may be a wire having a Meander shape (zigzag shape). Also, the conductor wire 211 may have a linear shape. Generally, since the inductance of the above resonance is increased by making the conductor wire 211 in a detour shape rather than the linear shape, it is possible to effectively convert the above suppression band of the leaking electromagnetic waves into low frequencies.

(Fifteenth Exemplary Embodiment)

Figure 33:
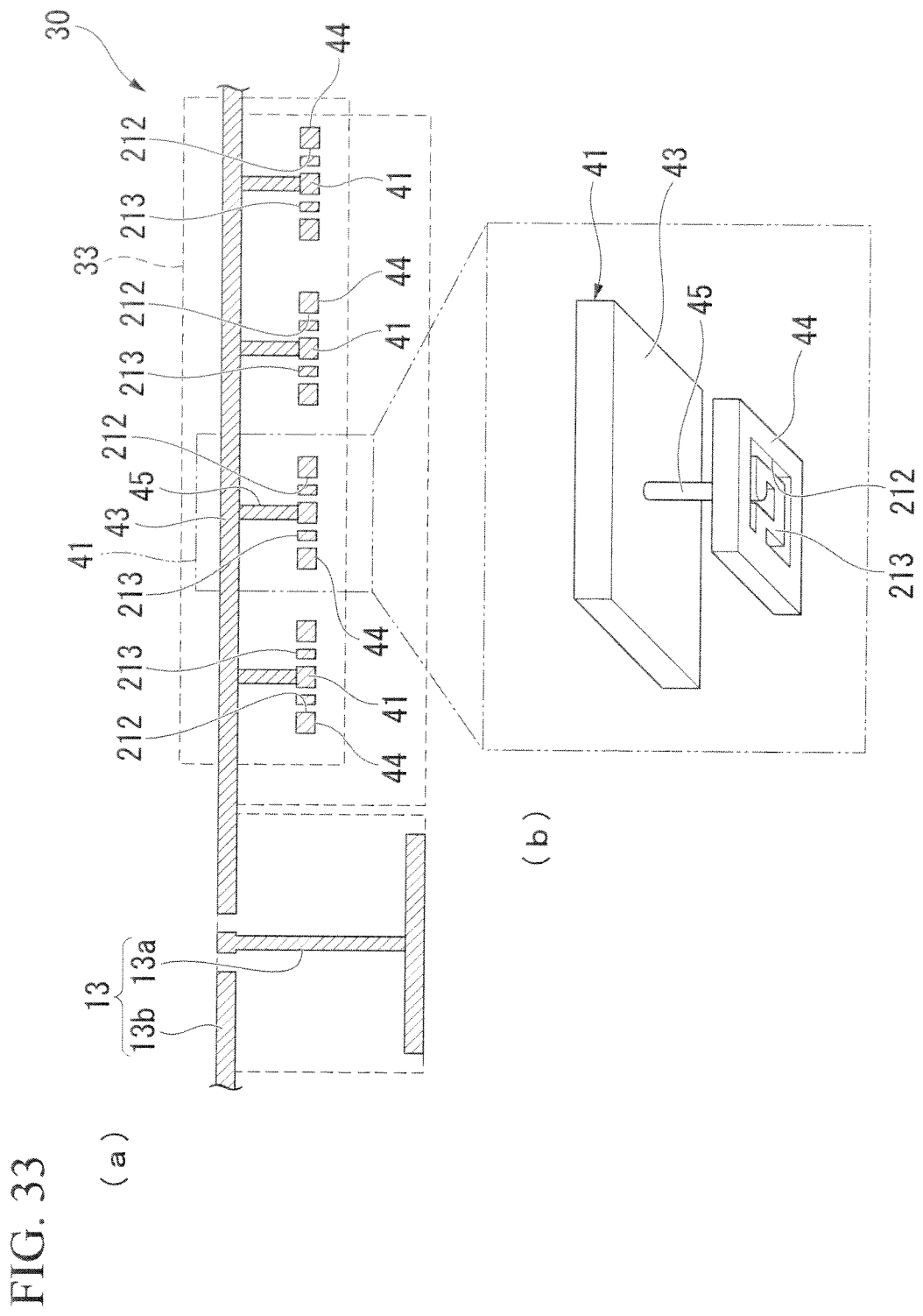
FIGS. 33a and 33b are diagrams illustrating a fifteenth exemplary embodiment of the surface communication device of the present invention.

FIG. 33 is a diagram for specifically explaining a fifteenth exemplary embodiment of the artificial impedance conductor 33 for the leaking electromagnetic wave suppression unit 30. Part (a) of FIG. 33 shows a leaking electromagnetic wave suppression unit 30. Part (b) of FIG. 33 shows a perspective diagram of an artificial impedance conductor unit structure 41.

In FIG. 33, the artificial impedance conductor 33 is configured using basically the same unit structures 41 shown in FIG. 5. In this exemplary embodiment, an opening portion 212 is formed in the patch conductor 44 of the unit structure 41. The conductor post 45 and the patch conductor 44 are connected by means of a conductor wire 213 which is provided in the opening portion 212 and has a spiral shape.

In this way, the inductance of the resonance can be increased by adding the spiral -shaped conductor wire 213 to the patch conductor 44, and as a result it is possible to convert a suppression band of the leaking electromagnetic waves into low frequencies.

In this exemplary embodiment, the conductor post 45 and the patch conductor 44 are connected through the spiral-shaped conductor wire 213. However, the conductor wire 213 has not necessarily to have a spiral shape as long as it is a metal conductor wire. For example, it may be a wire having a Meander shape (zigzag shape). Also, the conductor wire 213 may have a linear shape. Generally, since the inductance of the above resonance can be increased by making the conductor wire 213 in a detour shape rather than the linear shape, it is possible to effectively convert the above suppression band of the leaking electromagnetic waves into low frequencies.

(Sixteenth Exemplary Embodiment)

Figure 34:
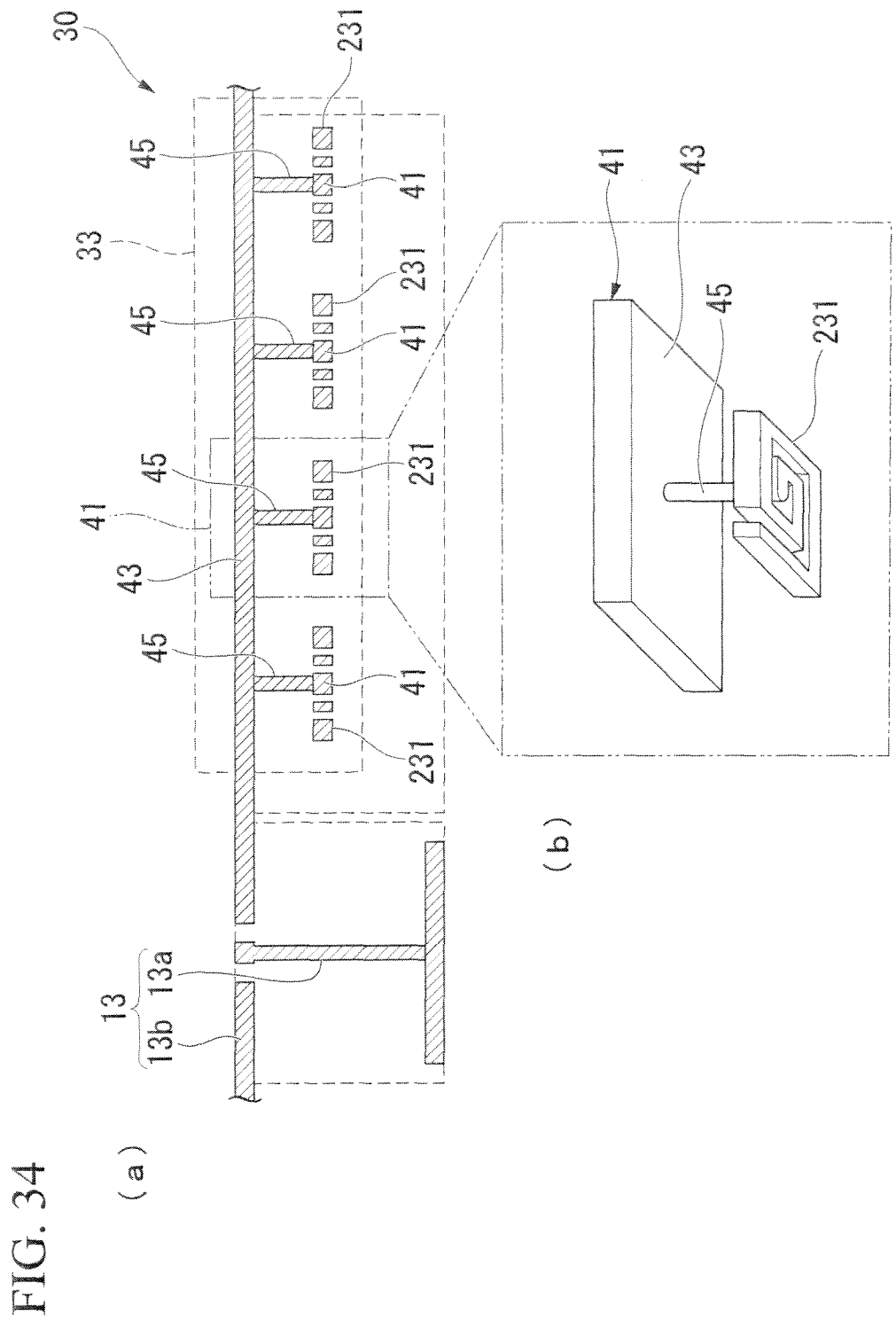
FIGS. 34a and 34b are diagrams illustrating a sixteenth exemplary embodiment of the surface communication device of the present invention.

FIG. 34 is a diagram for specifically explaining a sixteenth exemplary embodiment of the artificial impedance conductor 33 for the leaking electromagnetic wave suppression unit 30. Part (a) of FIG. 34 shows a leaking electromagnetic wave suppression unit 30. Part (b) of FIG. 34 shows a perspective diagram of an artificial impedance conductor unit structure 41.

The unit structure 41 shown in FIG. 34 includes a wire-shaped conductor 231 with an open end instead of the patch conductor of the unit structure 41 which constitutes the artificial impedance conductor 33 shown in FIG. 5. By providing the shaped conductor 231 with the open end in the unit structure 41 instead of the patch conductor 44, the resonance is generated at frequencies corresponding to approximately an odd multiple of ¼ of the wavelength of an electromagnetic wave. Therefore, since the functions as the artificial impedance conductor 33 are consequentially completed, it is possible to suppress leakage of the electromagnetic waves.

In this exemplary embodiment, the wire-shaped conductor 231 with the open end has a spiral shape. However, the wire-shaped conductor 231 has not necessarily to have a spiral shape as long as it is a metal wire. For example, the wire-shaped conductor 231 may be a wire having a Meander shape (zigzag shape). Also, the wire-shaped conductor 231 may have a linear shape.

Moreover, in FIG. 34, the wire-shaped conductor 231 is configured so that it does not come in contact with the insulation layer 23 of the electromagnetic wave propagation sheet 14, but may be configured so that it comes in contact with the insulation layer 23.

(Seventeenth Exemplary Embodiment)

Figure 35:
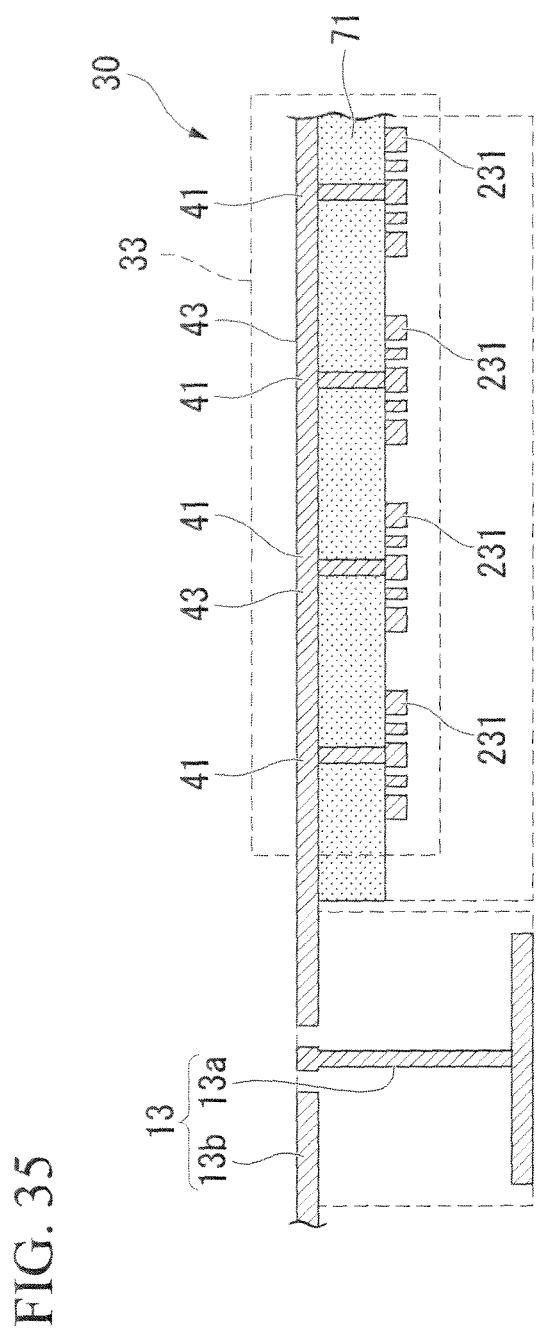
FIG. 35 is a diagram illustrating a seventeenth exemplary embodiment of the surface communication device of the present invention.

FIG. 35 is a diagram for specifically explaining a seventeenth exemplary embodiment of the artificial impedance conductor 33 for the leaking electromagnetic wave suppression unit 30.

In FIG. 35, an artificial impedance conductor intermediate layer 71 is provided between the wire-shaped conductor 231 and the reference conductor 43 shown in FIG. 34. The artificial impedance conductor intermediate layer 71 is formed of a material having a higher dielectric constant than a dielectric constant of a medium constituting the leaking electromagnetic wave layer 35. By the artificial impedance conductor intermediate layer 71 being formed of a material having a high dielectric constant as described above, a frequency wavelength corresponding to an odd multiple of ¼ of an electromagnetic wave wavelength is shortened. Therefore, it is possible to reduce dimensions of the unit structure which resonates at certain frequencies. This configuration can be realized by employing a BC (Buried Capacitor) board used for a printed circuit board for example as the leaking electromagnetic wave suppression unit 30.

In such a configuration, the artificial impedance conductor unit structure 41 can also be minimized by using a material having a high dielectric constant between the wire-shaped conductor 231 having a spiral shape and the reference conductor 53.

In this exemplary embodiment, a wire 231 with an open end is configured in a spiral shape. However, the wire-shaped conductor 231 has not necessarily t have a spiral shape as long as it is a metal wire. For example, the wire 231 may be a wire having a Meander shape (zigzag shape). Also, the wire 231 may have a linear shape.

In this exemplary embodiment, a material having a high dielectric constant is used for a layer between the wire-shaped conductor 231 and the reference conductor 43, but it is not limited thereto. Even when a material having a higher dielectric constant than the other layers is used for at least one layer between the wire-shaped conductor 231 and the electromagnetic wave propagation layer 21, the dimensions of the unit structures which resonate at certain frequencies can be reduced as with described above. In this case, it is preferable that the wire-shaped conductor 231 come in contact with the material having a high dielectric constant, but has not necessarily to come in contact with it.

(Eighteenth Exemplary Embodiment)

Figure 36:
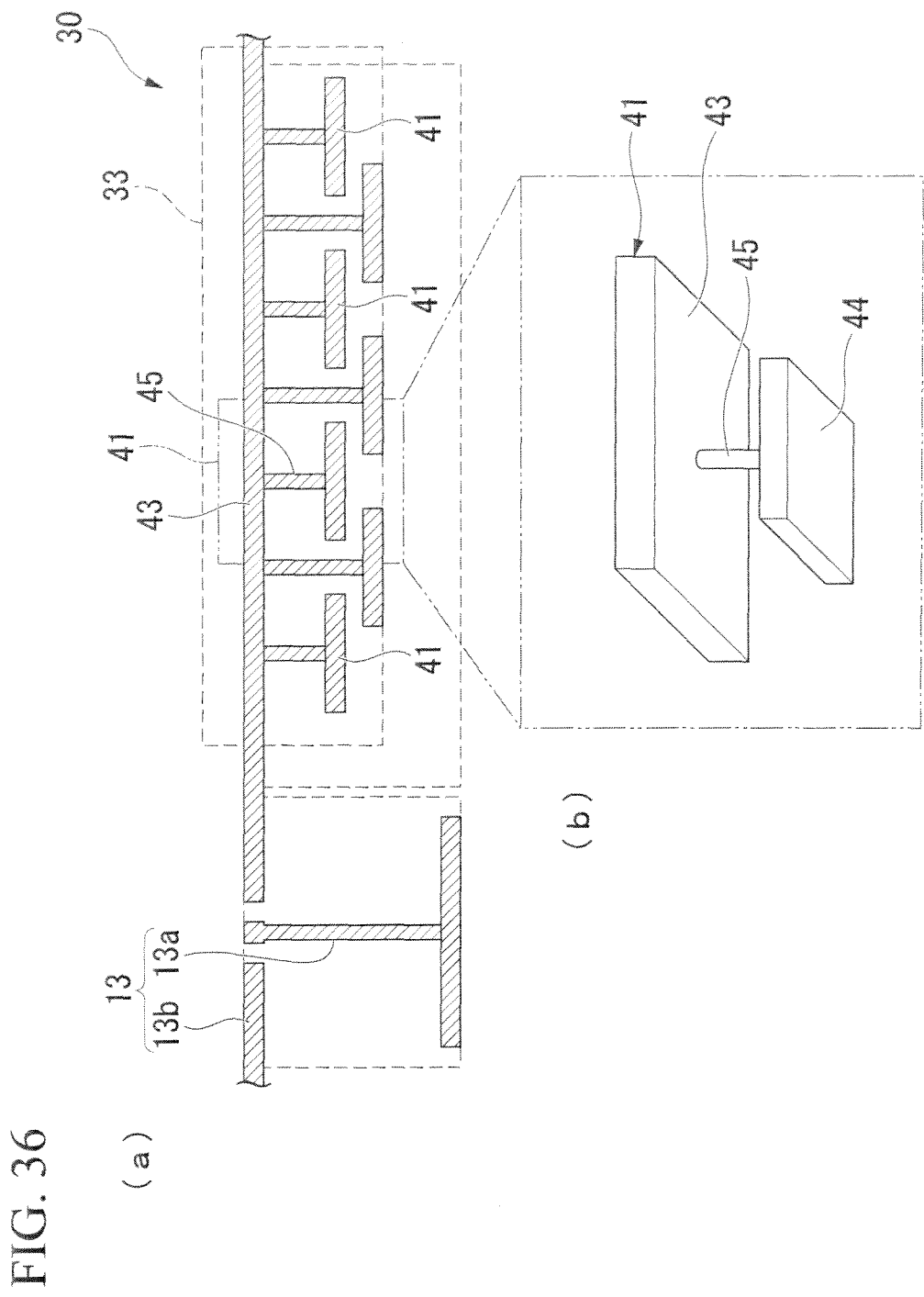
FIGS. 36a and 36b are diagrams illustrating an eighteenth exemplary embodiment of the surface communication device of the present invention.

FIG. 36 is a diagram for specifically explaining an eighteenth exemplary embodiment of the artificial impedance conductor 33 for the leaking electromagnetic wave suppression unit 30. Part (a) of FIG. 36 shows a leaking electromagnetic wave suppression unit 30. Part (b) of FIG. 36 shows a perspective diagram of an artificial impedance conductor unit structure 41.

The unit structure 41 shown in FIG. 36 is different compared to the unit structure 41 shown in FIG. 5 in that there are conductor posts 45 kinds of dimensions of which are two or more. The artificial impedance conductor unit structures 41 in which the conductor posts 45 have different dimensions are adjacent to each other. Also, the adjacent patch conductors 44 are in a positional relationship in which they overlap when viewed from a side of the reference conductor 43. By adopting the above-described exemplary embodiment, the capacitive coupling between the adjacent patch conductors can be obtained. Therefore, it is possible to convert a suppression band of the leaking electromagnetic waves into low frequencies.

Figure 37:
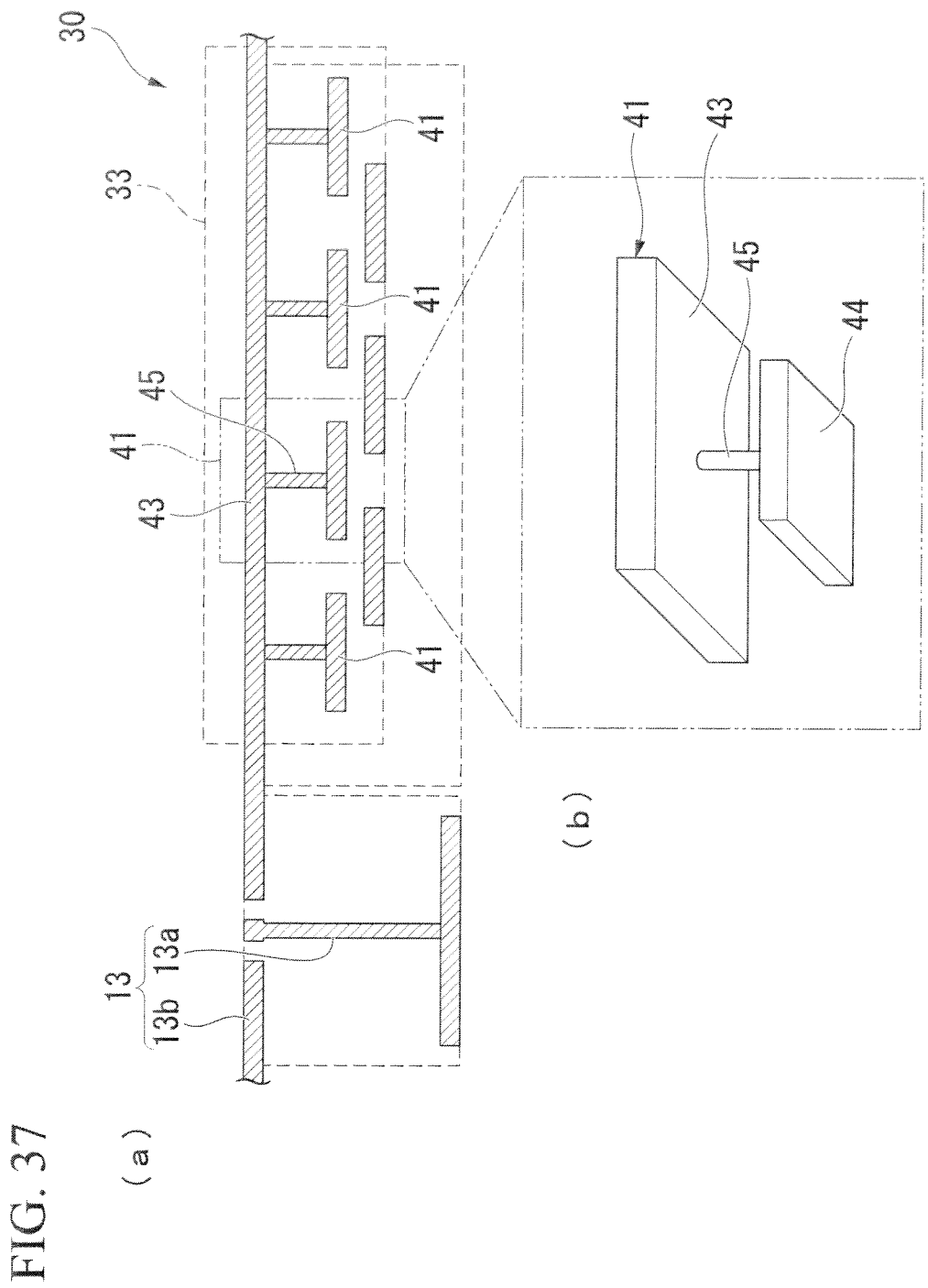
FIGS. 37a and 37b are diagrams illustrating a modification example of the eighteenth exemplary embodiment of the surface communication device of the present invention.
Figure 38:
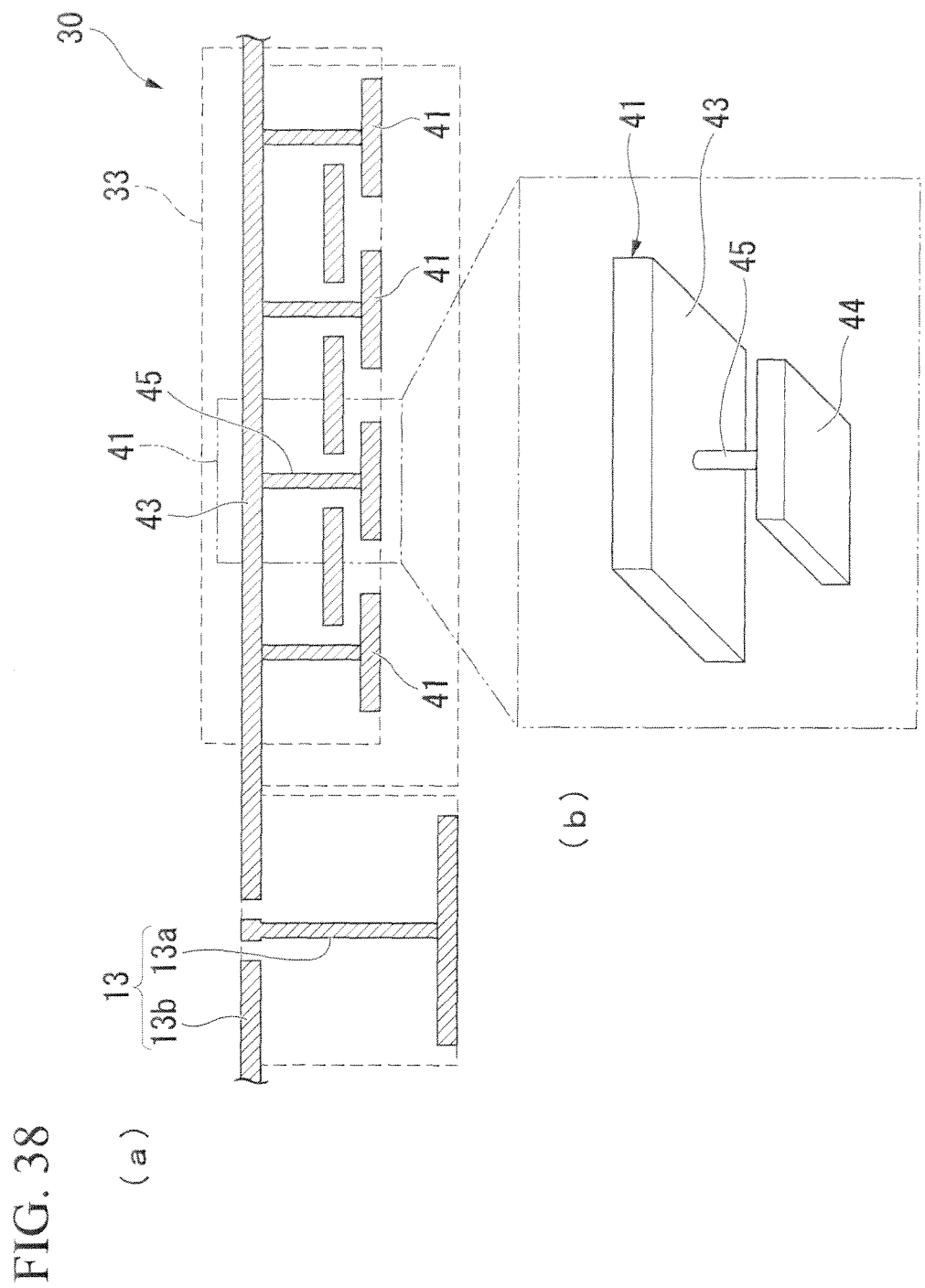
FIGS. 38a and 38b are diagrams illustrating another modification example of the eighteenth exemplary embodiment of the surface communication device of the present invention.

As a modification of the eighteenth exemplary embodiment of the artificial impedance conductor 33 shown in FIG. 36, one of the conductor posts 45 having different lengths may be omitted, as shown in FIGS. 37 and 38. In any case, by obtaining the capacitive coupling between the adjacent artificial impedance conductor unit structures 41 using a patch conductor from which the conductor post 45 is omitted, it is possible to convert a suppression band of the leaking electromagnetic waves into low frequencies.

(Nineteenth Exemplary Embodiment)

Figure 39:
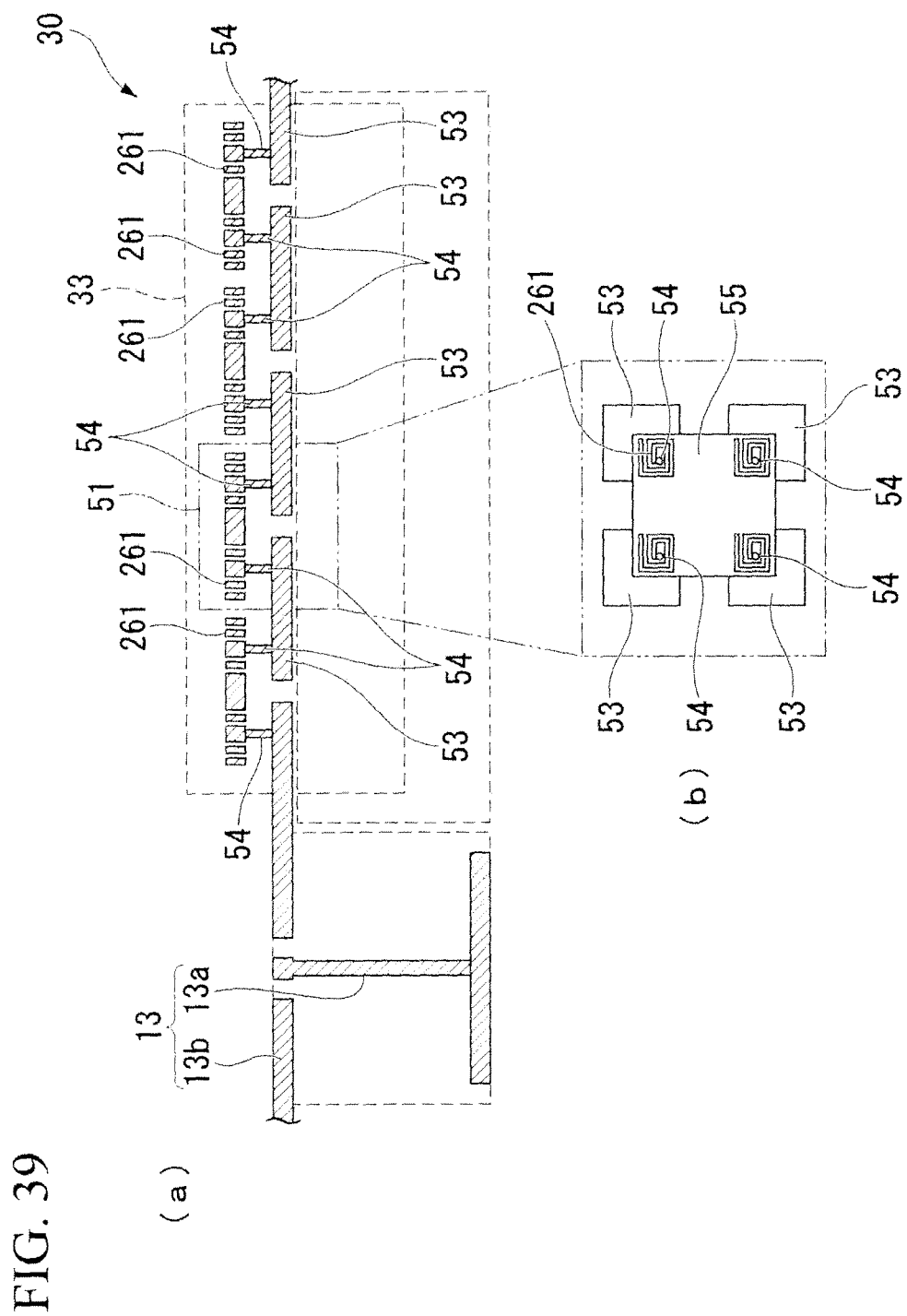
FIGS. 39a and 39b are diagrams illustrating a nineteenth exemplary embodiment of the surface communication device of the present invention.

FIG. 39 is a diagram for specifically explaining a nineteenth exemplary embodiment of the artificial impedance conductor 33 for the leaking electromagnetic wave suppression unit 30. Part (a) of FIG. 39 shows a leaking electromagnetic wave suppression unit 30. Part (b) of FIG. 39 shows a top diagram of an artificial impedance conductor unit structure 51.

In FIG. 39, an aperture is present between the conductor post 54 and the upper layer patch conductor 55 of the artificial impedance conductor unit structure 51 shown in FIG. 8. The conductor post 54 and the upper layer patch conductor 55 are connected through a wire-shaped conductor 261 having a spiral shape. In this way, the inductance of the resonance can be increased by adding the wire-shaped conductor 261, and as a result it is possible to convert a suppression band of the leaking electromagnetic waves into lo frequencies.

In this exemplary embodiment, the conductor post 54 and the upper layer patch conductor 55 are connected through the spiral-shaped conductor wire. However, the wire-shaped conductor 261 has not necessarily to have a spiral shape as long as it is a metal conductor wire. For example, it may be a wire having a Meander shape (zigzag shape). Also, the wire-shaped conductor 261 may have a linear shape. Generally, since the inductance of the above resonance can be increased by forming the wire-shaped conductor 261 in a detour shape rather than the linear shape, it is possible to effectively convert the suppression band of the leaking electromagnetic waves into low frequencies.

(Twentieth Exemplary Embodiment)

Figure 40:
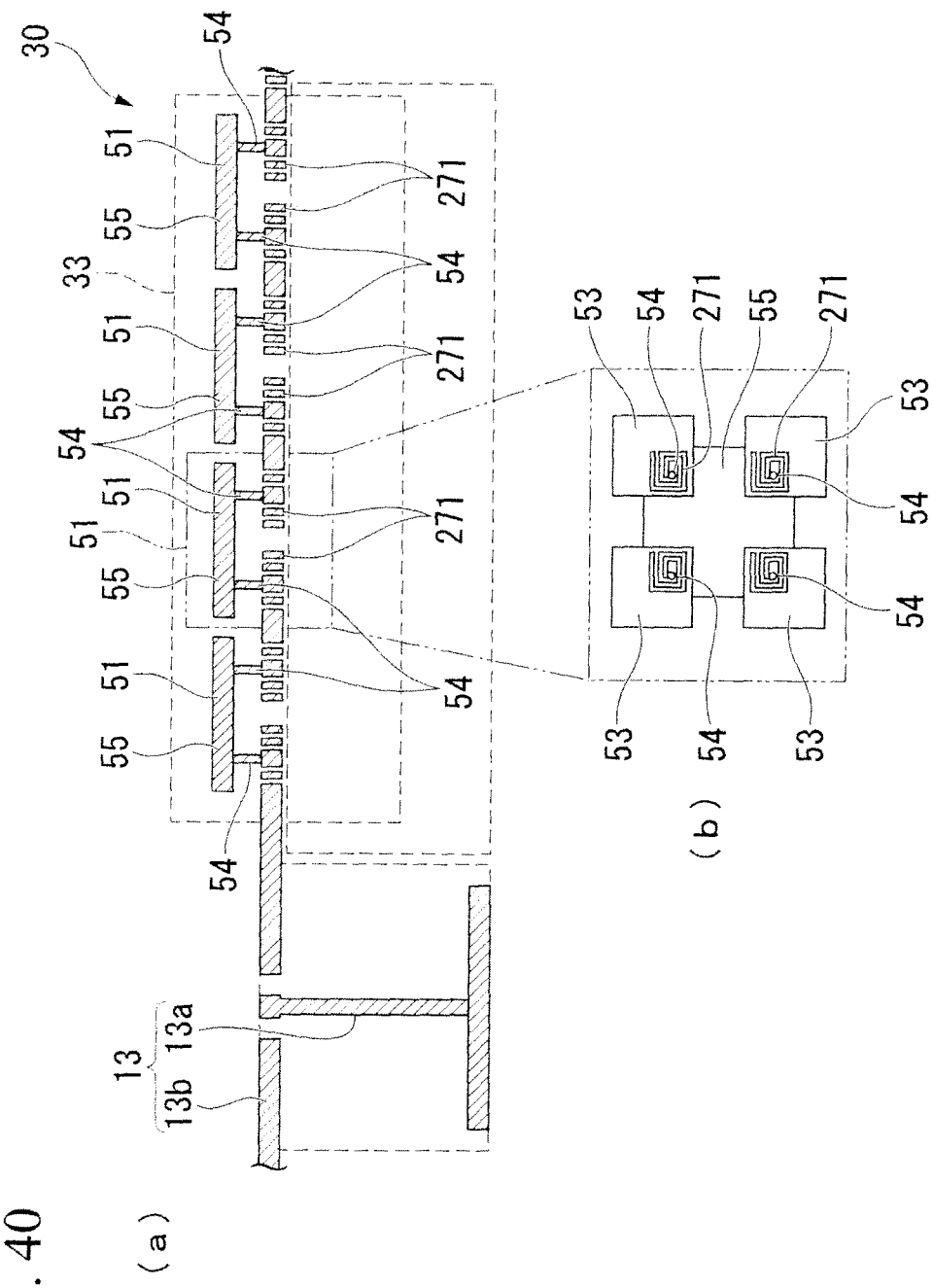
FIGS. 40a and 40b are diagrams illustrating a twentieth exemplary embodiment of the surface communication device of the present invention.

FIG. 40 is a diagram for specifically explaining a twentieth exemplary embodiment of the artificial impedance conductor 33 for the leaking electromagnetic wave suppression unit 30. Part (a) of FIG. 40 shows a leaking electromagnetic wave suppression unit 30. Part (b) of FIG. 40 shows a bottom diagram of an artificial impedance conductor unit structure 51.

In FIG. 40, an aperture is present between the conductor post 54 and the upper layer patch conductor 55 of the artificial impedance conductor unit structure 51 shown in FIG. 8. A wire-shaped conductor 271 having a spiral-shape is used to connect between the conductor post 54 and the reference conductor 53. In this way, the inductance of the resonance can be increased by adding the wire-shaped conductor 271, and as a result it is possible to convert a suppression band of the leaking electromagnetic waves into low frequencies.

In this exemplary embodiment, the conductor post 54 and the reference conductor 53 are connected through a spiral-shaped conductor wire. However, the wire-shaped conductor 271 has not necessarily to have a spiral shape as long as it is a metal conductor wire. For example. the wire-shaped conductor 271 may be a wire having a Meander shape (zigzag shape). Also. the wire-shaped conductor 271 may have a linear shape. Generally, since the inductance of the above resonance can be increased by forming the wire-shaped conductor 271 in a detour shape rather than the linear shape, it is possible to effectively convert the suppression band of the leaking electromagnetic waves into low frequencies.

(Twenty-first Exemplary Embodiment)

Figure 41:
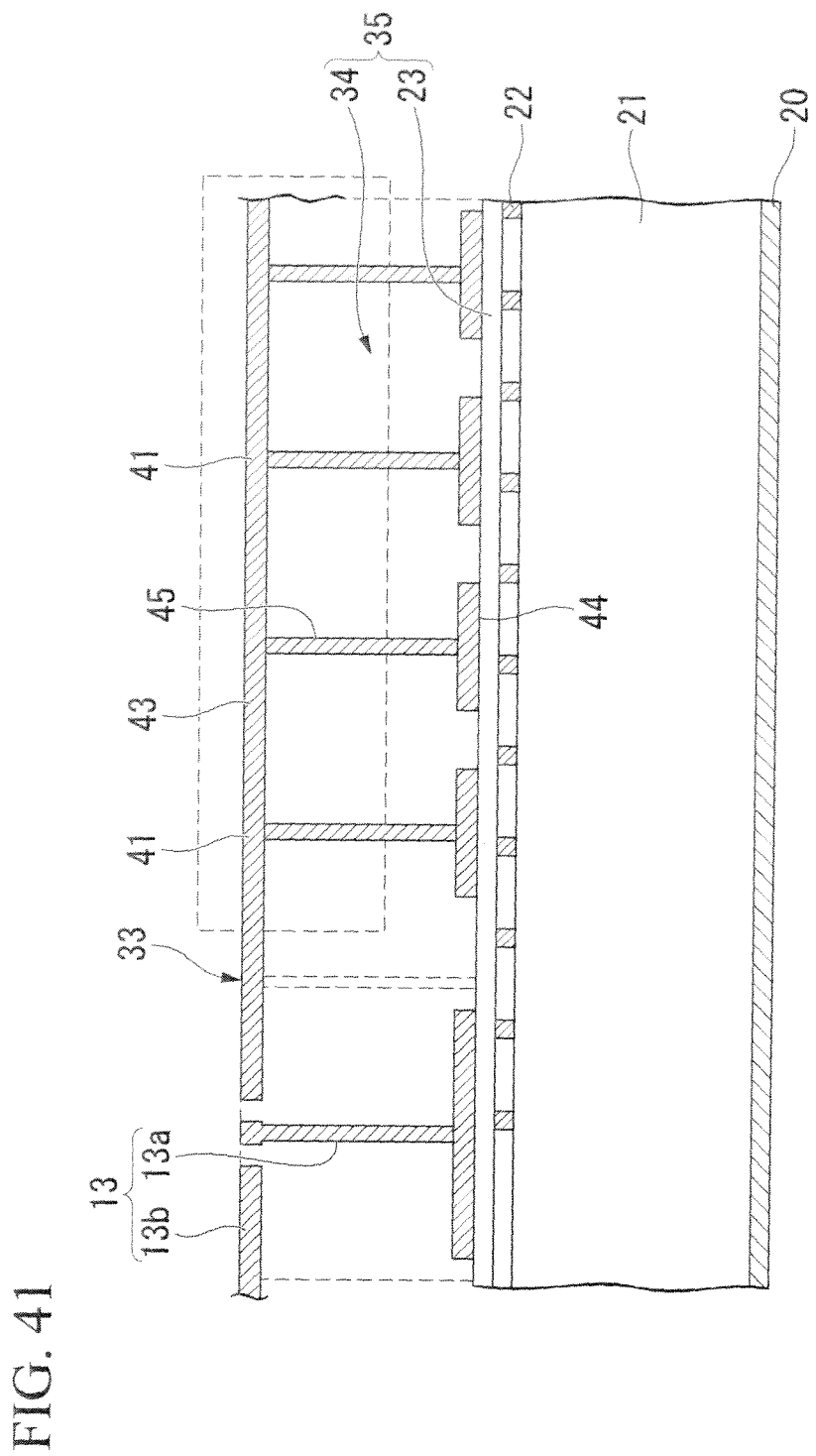
FIG. 41 is a diagram illustrating a twenty-first exemplary embodiment of the surface communication device of the present invention.

FIG. 41 is a diagram for specifically explaining a twenty-first exemplary embodiment of the artificial impedance conductor 33 for the leaking electromagnetic wave suppression unit 30.

The configuration shown in FIG. 41 is substantially identical to the configuration shown in FIG. 5, but is different from it in that the insulation layer 23 of the electromagnetic wave propagation sheet 14 comes close to the patch conductor 44. Since the insulation layer 23 comes close to the patch conductor 11 as described above, the resonance can be effectively utilized using the capacitive coupling with a surface of the electromagnetic wave propagation sheet 14. As a result, it is possible to convert a suppression band of the leaking electromagnetic waves into low frequencies.

It is desirable that the distance between the insulation layer 23 and the patch conductor 44 he as narrow as possible in an aspect of the above-described effectiveness. It is more desirable to allow the insulation layer 23 to come in contact with the patch conductor 44. Moreover, in an aspect of the above-described effectiveness, by intentionally increasing the dielectric constant of the insulation layer 23, the resonance can he effectively utilized using the capacitive coupling between the patch conductor 44 and a surface conductor layer of the electromagnetic wave propagation sheet 14, that is, the mesh layer 22. When an insulation layer 11a (15a) is coated on a bottom surface of the power feeding device unit 11 or the reception device unit 15, by intentionally increasing the dielectric constant of the corresponding insulation layer 11a (15a), the resonance can be effectively utilized using the capacitive coupling between the patch conductor 44 and the surface conductor layer of the electromagnetic wave propagation sheet 14, that is, the mesh layer 22 in an aspect of the above-described effectiveness.

This exemplary embodiment is similarly applicable to the other exemplary embodiments in which the resonance uses the capacitive coupling with a surface of the electromagnetic wave propagation sheet 14. For the fourteenth exemplary embodiment (FIG. 32), the fifteenth exemplary embodiment (FIG. 33) or the eighteenth exemplary embodiment (FIGS. 36 to 38), for example, the artificial impedance conductor unit structure may be configured to come in contact with the insulation layer 23.

(Twenty-second Exemplary Embodiment)

Figure 42:
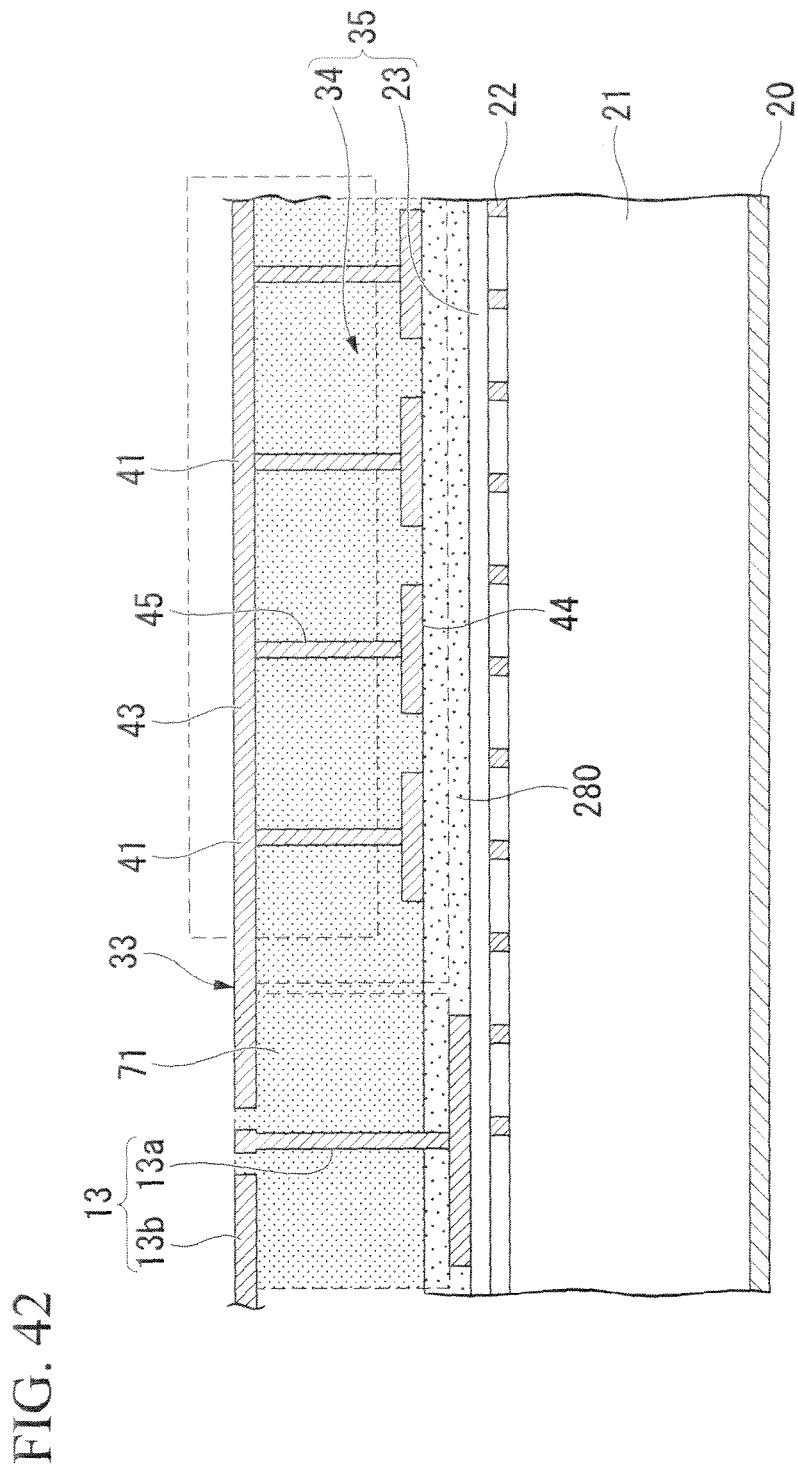
FIG. 42 is a diagram illustrating a twenty-second exemplary embodiment of the surface communication device of the present invention.

FIG. 42 is a diagram for specifically explaining a twenty-second exemplary embodiment of the artificial impedance conductor 33 for the leaking electromagnetic wave suppression unit 30.

The configuration shown in FIG. 42 is substantially identical to the configuration shown in FIG. 20, but is different from in that a dielectric layer 280 having a higher dielectric constant than the artificial impedance conductor intermediate layer 71 is provided between the insulation layer 23 of the electromagnetic wave propagation sheet 14 and the patch conductor 44. By providing a dielectric layer 280 having a higher dielectric constant than the artificial impedance conductor intermediate layer 71, which acts as an upper layer of itself, as described above, it is possible to convert a suppression band of the leaking electromagnetic waves into low frequencies even in a state in which the patch conductor 44 does not come in contact with or does not close to the insulation layer 23. Moreover, in an aspect of the above-described effectiveness, by intentionally increasing the dielectric constant of the insulation layer 23, the resonance can be effectively utilized using the capacitive coupling between the patch conductor 44 and a surface conductor layer of the electromagnetic wave propagation sheet 14, that is, the mesh layer 22. When an insulation layer 11*a* (15*a*) is coated on a bottom surface of the power feeding device unit 11 or the reception device unit 15, by intentionally increasing the dielectric constant of the corresponding insulation layer 11*a* (15*a*), the resonance can be effectively utilized using the capacitive coupling between the patch conductor 44 and the surface conductor layer of the electromagnetic wave propagation sheet 14, that is, the mesh layer 22 in an aspect of the above-described effectiveness.

(Twenty-third Exemplary Embodiment)

Figure 43:
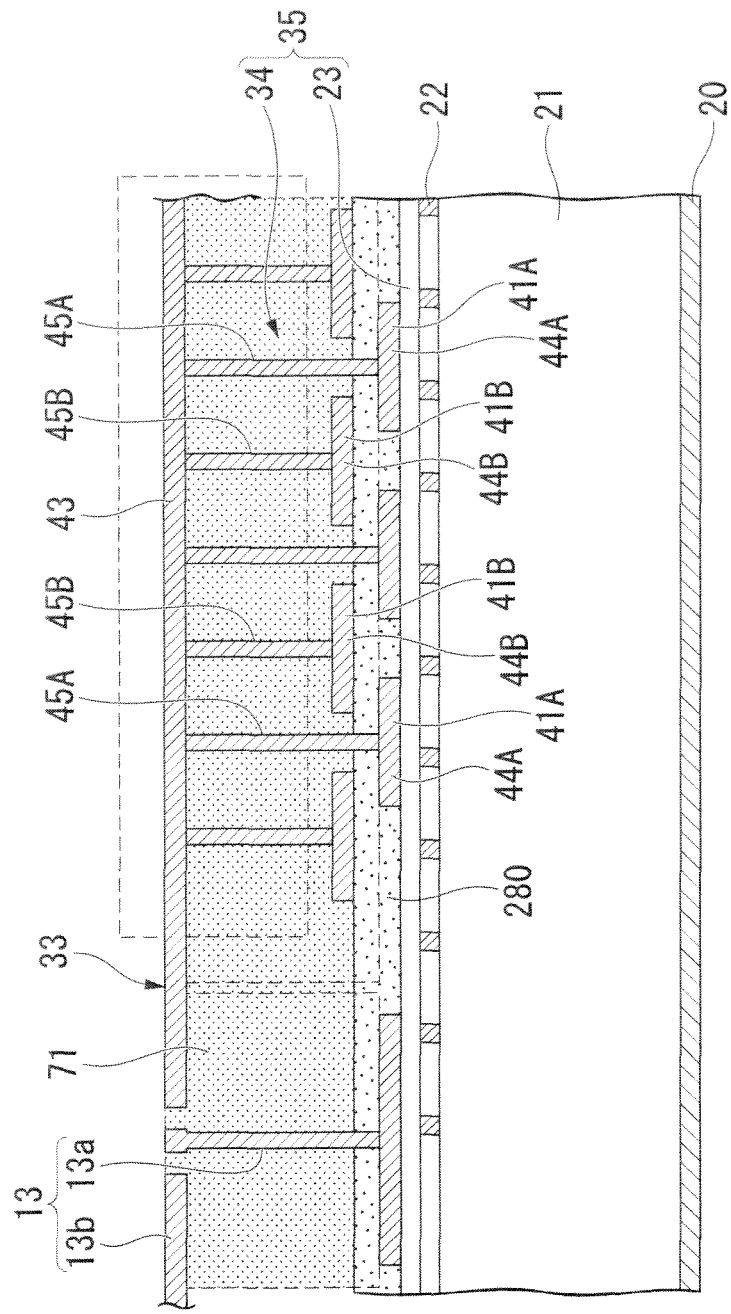
FIG. 43 is a diagram illustrating a twenty-third exemplary embodiment of the surface communication device of the present invention.

FIG. 43 is a diagram for specifically explaining a twenty-third exemplary embodiment of the artificial impedance conductor 33 for the leaking electromagnetic wave suppression unit 30.

The unit structures 41A and 41B shown in FIG. 43 are different compared to the unit structure 41 shown in FIG. 5 in that the conductor posts 45A and 45B kinds of dimensions of which are two or more are provided. Also, the unit structures 41A in which the conductor posts 45A are provided are adjacent to the unit structures 41B in which the conductor posts 45B are provided. In addition, the patch conductors 44A of the unit structures 41A and the patch conductors 44B of the unit structures 41B, which are adjacent to each other, are in a positional relationship in which they overlap when viewed from a side of the reference conductor 43. Also, the patch conductor 44A in the unit structure 41A having the longest conductor post 45A comes in contact with or close to the insulation layer 23, whereas the patch conductor 44B in the artificial impedance conductor unit structure 41B having the other conductor post 45B having a shorter length than the conductor post 45A, is spaced apart from the insulation layer 23. The dielectric layer 280, which has a higher dielectric constant than the artificial impedance conductor intermediate layer 71 that acts as an upper layer of itself is provided between the insulation layer 23 and the patch conductor 44B.

With the above-described exemplary embodiment, the capacitive coupling between the adjacent patch conductors can be obtained. In the artificial impedance conductor unit structure 41A having the longest conductor post 45A, the resonance can be effectively utilized using the capacitive coupling with the surface of the electromagnetic wave propagation sheet 14. For this reason, it is possible to convert a suppression band of the leaking electromagnetic waves into low frequencies. Moreover, in the artificial impedance conductor unit structure 41B having the other conductor post 45B having a shorter length than the conductor post 45A, since the dielectric layer 280 is provided between the patch conductor 44B and the insulation layer 23, it is possible to convert a suppression band of the leaking electromagnetic waves into low frequencies. Furthermore, in an aspect of the above-described effectiveness, by intentionally increasing the dielectric constant of the insulation layer 23, the resonance can be effectively utilized using the capacitive coupling between the patch conductors 44A and 44B and a surface conductor layer of the electromagnetic wave propagation sheet 14, that is, the mesh layer When an insulation layer 11*a* (15*a*) is coated on a bottom surface of the power feeding device unit 11 or the reception device unit 15, by intentionally increasing the dielectric constant of the corresponding insulation layer 11*a* (15*a*), the resonance can be effectively utilized using the capacitive coupling between the patch conductors 44A and 44B and the surface conductor layer of the electromagnetic wave propagation sheet 14, that is, the mesh layer 22 in an aspect of the above-described effectiveness.

Figure 44:
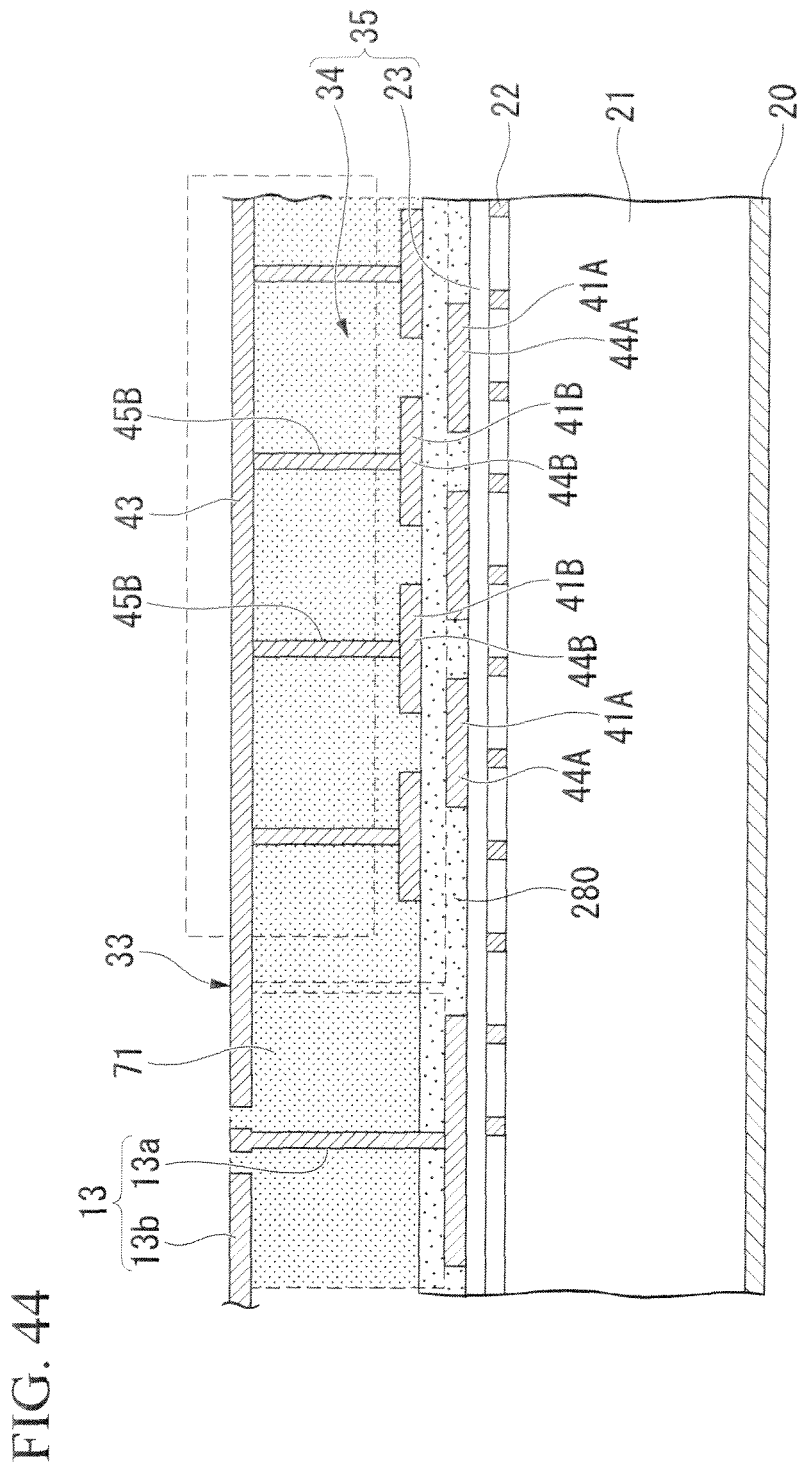
FIG. 44 is a diagram illustrating a modification example of the twenty-third exemplary embodiment of the surface communication device of the present invention.
Figure 45:
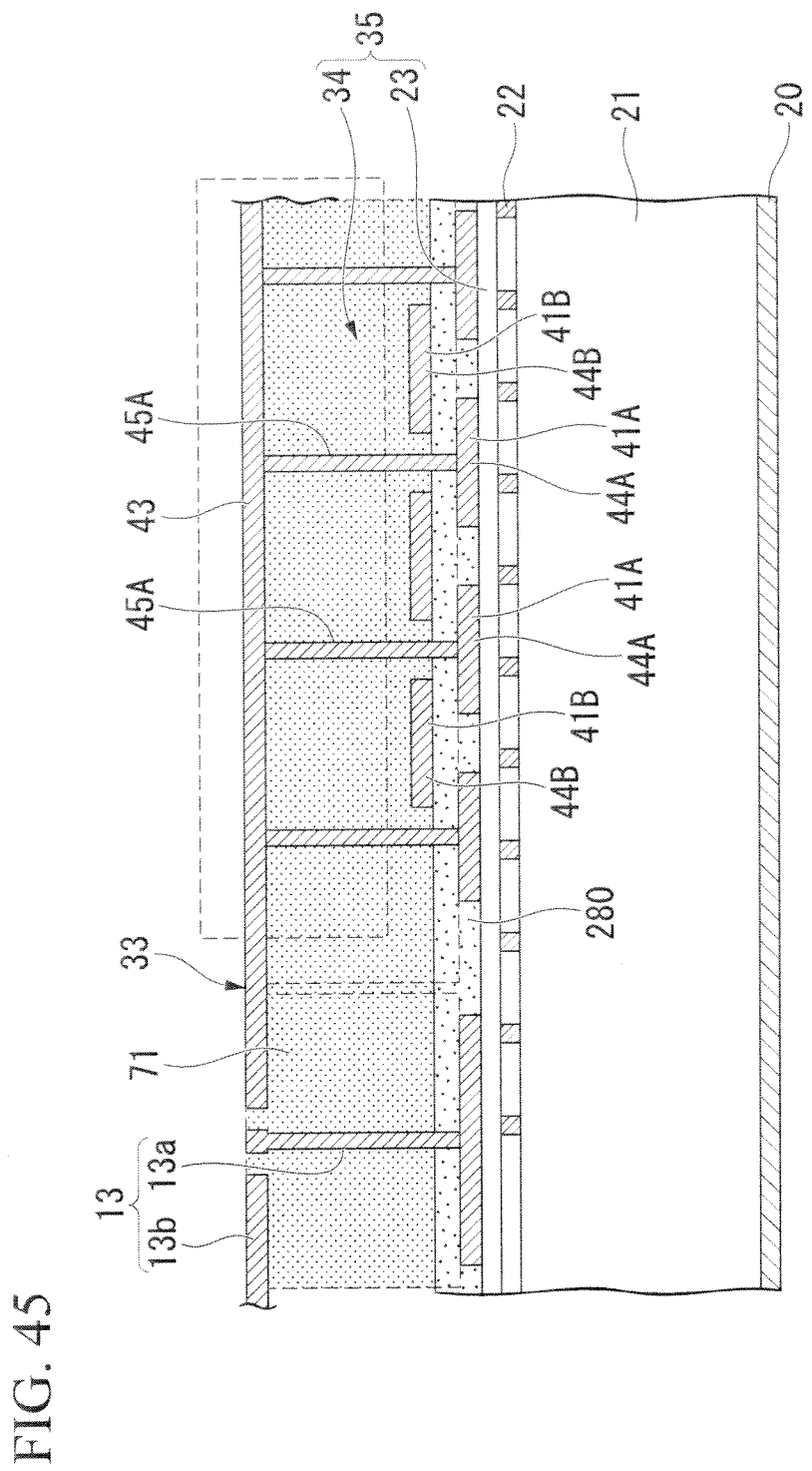
FIG. 45 is a diagram illustrating another modification example of the twenty-third exemplary embodiment of the surface communication device of the present invention.

As modifications of the twenty-third exemplary embodiment in FIG. 43, one of the conductor posts 45A and 45B having different lengths may be omitted, as shown in FIGS. 44 and 45. In this case, by obtaining the capacitive coupling between the adjacent artificial impedance conductor unit structures 41 using a patch conductor from which the conductor post 45A(45B) is omitted, it is possible to convert a suppression band of the leaking electromagnetic waves into low frequencies.

The surface communication device of the present invention is not limited to each of the above-described exemplary embodiments, which are described with reference to the drawings, and various modifications may be made within the technical scope of the present invention.

For example, various modifications are possible by combinations of respective components or treatment processes shown in each of the exemplary embodiments.

Also, although the respective exemplary embodiments adopt configurations including both the power feeding device unit 11 and the reception device unit 15, a configuration which includes one of the power feeding device unit 11 and the reception device unit 15 may be adopted. For example, the contact power supply of electromagnetic waves to be fed to the reception device unit 15 may be performed in the configuration including only the power feeding device unit 15. Also, the contact power supply of electromagnetic waves to be fed to the power feeding device unit 11 may be performed in the configuration including only the reception device unit 15.

Moreover, although the above cases adopt a configuration including both the power feeding device unit 11 and the reception device unit 15, a device unit in a side using the contact power supply may be omitted from the components according to the exemplary embodiments of the present invention by adding it in other treatment processes. Also, in each of the above exemplary embodiments, as the transmission electromagnetic wave coupling unit 13 surrounded by the leaking electromagnetic wave suppression unit 30, the patch antenna structure which is configured of the emission conductor 13a and the reference conductor 13b which are insulated from each other is shown as a example, but it is not limited to the above-described shapes, and various modifications can be possible as long as their structures are applicable as the electromagnetic wave coupling unit. For example, the emission conductor 13a may be formed in a linear shape or a wire shape. Also, the emission conductor 13a and the reference conductor 13b may be configured so that they are not insulated from each other. Examples of the shapes which are not insulated described above include a loop antenna shape, a planar reversed F-type antenna shape, a short stub shape, and the like. Also, even when the reception electromagnetic wave coupling unit 16 is surrounded by the leaking electromagnetic wave suppression unit 30, various modifications can be possible as long as their structures are applicable as the electromagnetic wave coupling unit as with the case of the above-described transmission electromagnetic wave coupling unit 13. For example, the description of the basic configuration has assumed that the reception conductor has the same patch antenna structure as the emission conductor 13a, but it is not limited to the above-described shapes, and it may include a linear-shaped conductor or a wire-shaped conductor. In addition, it is acceptable either that the reception conductor and the reference conductor are insulated from each other or that they are not. Examples of the shapes which are not insulated described above, include a loop antenna shape, a planar reversed F-type antenna shape, a short stub shape, and the like.

Also, the exemplary embodiments of the present invention exemplify the structures in which the emission conductor or reception conductor is present inside the electromagnetic wave coupling unit, but it has not necessarily to be present inside the electromagnetic wave coupling unit. For example, the input/output of the electromagnetic waves may be performed by providing the emission conductor on a side of the electromagnetic wave generation unit and forming an opening portion at a boundary portion between the electromagnetic wave generation unit and the electromagnetic wave coupling unit.

Figure 46:
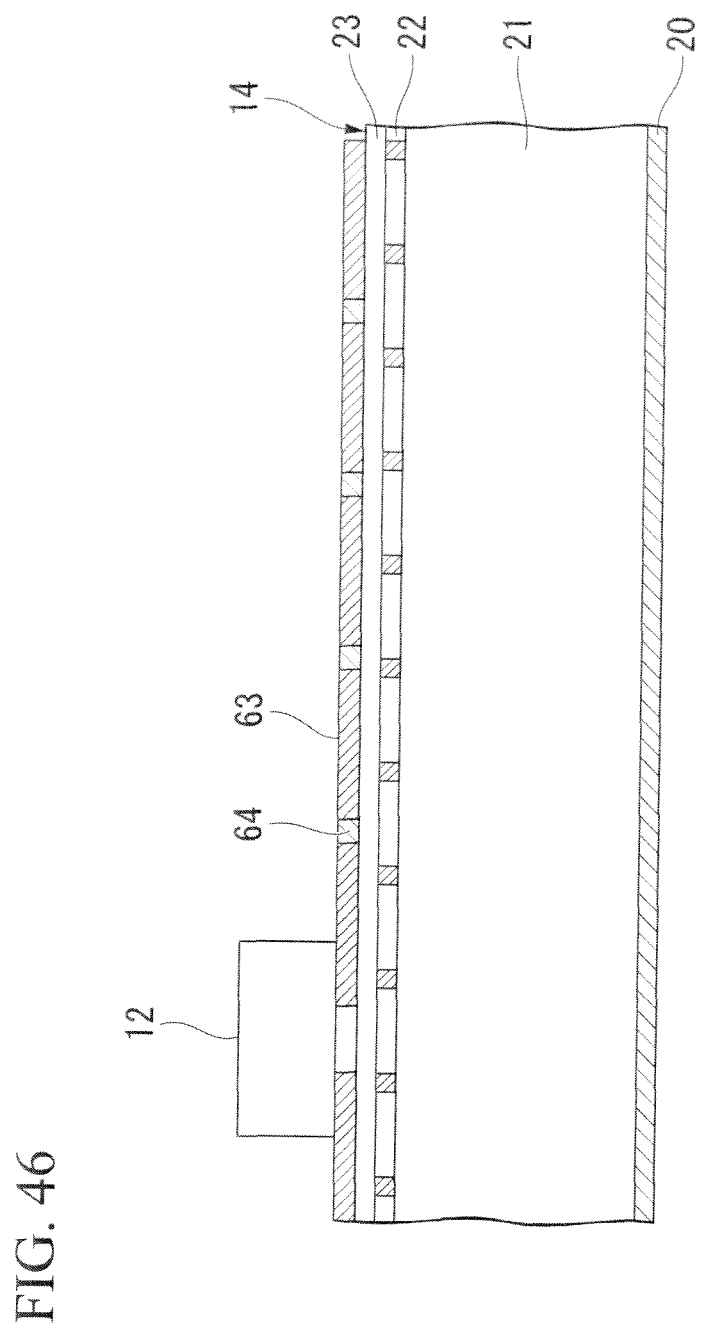
FIG. 46 is a diagram illustrating another modification example of the third exemplary embodiment of the surface communication device of the present invention.
Figure 47:
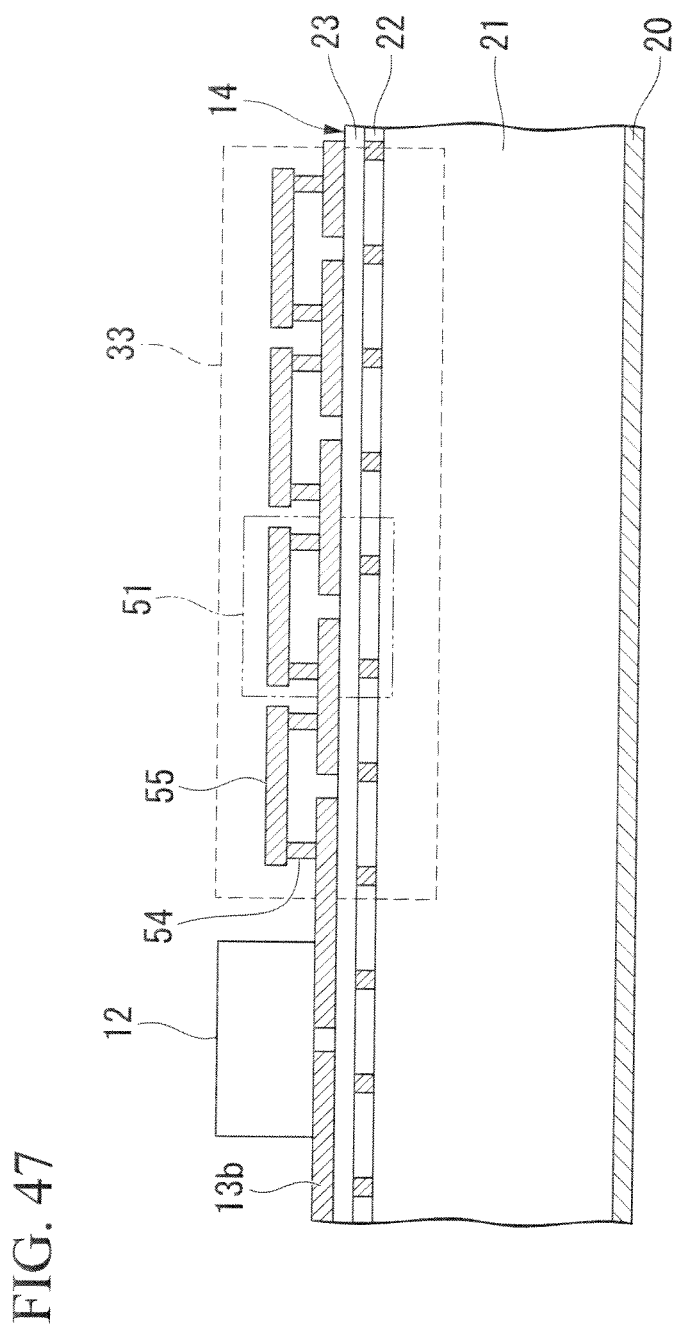
FIG. 47 is a diagram illustrating a modification example of the second exemplary embodiment of the surface communication device of the present invention.

When the emission conductor or reception conductor is not present inside the electromagnetic wave coupling unit, for example, the artificial impedance conductor unit structure 61 according to the second and third exemplary embodiments of the present invention may come in contact with the insulation layer 23, as shown in FIGS. 46 and 47. The same applies to the fifth, eighth, twelfth, thirteenth, nineteenth and twentieth exemplary embodiments of the present invention have the same configurations. Also, an insulation layer may be coated on a contact surface of a side of the artificial impedance conductor unit structure with the insulation layer 23 in consideration of the safety during attachment/detachment of the electromagnetic wave transmission unit or the electromagnetic wave reception unit. In addition, the shielding conductor may be installed in an upper side of the artificial impedance conductor unit structure, as described in the sixth exemplary embodiment of the present invention.

Also, each of the above exemplary embodiments discloses an example of the structure in which the emission conductor or the reception conductor comes in contact with the electromagnetic wave propagation sheet 14, but it has not necessarily to come in contact with it.

Also, in the exemplary embodiments, the case in which an opening plane of the mesh layer 22 of the electromagnetic wave propagation sheet 14 has a rectangular shape is shown in FIG. 2, but it is not limited to the rectangular shape. The opening shape may be modified into various opening shapes as long as it is applicable as the electromagnetic wave propagation sheet. For example, the opening shape may be hexagonal, triangular, or circular in shape.

In addition, the configurations of the exemplary embodiments may be optionally selected and suitably modified into other configurations without departing from the scope of the present invention.

This application is based upon and claims the benefit of priority from Japanese patent application No. 2009-251281, filed on Oct. 30, 2009, and Japanese patent application No. 2010-043280, filed on Feb. 26, 2010, the disclosure of which is incorporated herein in its entirety by reference.

INDUSTRIAL APPLICABILITY

The exemplary embodiments of the present invention can be used in a surface communication device for the purpose of propagating electric power as energy from a side of a power feeding device to a side of a reception device. At the same time, it can be used in a surface communication device for the purpose of propagating electric power as communication data from a side of a power feeding device to a side of a reception device. For example, it is possible to use it, with pairs of power feeding devices and reception devices installed on an electromagnetic wave propagation sheet, for the purpose of propagating electric power as energy between some pairs of the power feeding devices and the reception devices, and propagating electric power as communication data from a side of the power feeding device to a side of the reception device in the other pairs of the power feeding devices and the reception devices.

DESCRIPTION OF REFERENCE SYMBOLS

10 Transmission electromagnetic wave unit
11 Power feeding device unit (electromagnetic wave transmission unit)
12 Electromagnetic wave generation unit
13 Transmission electromagnetic wave coupling unit
14 Electromagnetic wave propagation sheet (electromagnetic wave propagation unit)
15 Reception device unit (electromagnetic wave reception unit)
16 Reception electromagnetic wave coupling unit (electromagnetic wave coupling unit)
17 Electromagnetic wave output unit
20 Conductor plane layer
21 Electromagnetic wave propagation layer
22 Mesh layer
23 Insulation layer
30 Leaking electromagnetic wave suppression unit
33 Artificial impedance conductor
34 Space layer
35 Leaking electromagnetic wave layer
41, 41A, 41B, 51, 61 Artificial impedance conductor unit structure
43, 53 Reference conductor
44, 44A, 44B, 63 Patch conductor
45, 45A, 45B, 54 Conductor post
55 Upper layer patch conductor
64 Connection wire
71, 81 Artificial impedance conductor intermediate layer
91 Shielding conductor plane (second conductor)
92 Shielding conductor post (second conductor post)

152, 161 Conductor post
210, 212 Opening portion
211, 213, 251, 261 Wire-shaped conductor
231 Wire-shaped conductor with open end
280 Dielectric layer

The invention claimed is:

1. A surface communication device, comprising:
an electromagnetic wave propagation unit which propagates electromagnetic waves and has a sheet shape;
a power feeding device unit which feeds the electromagnetic waves to the electromagnetic wave propagation unit; and
a reception device unit which receives the electromagnetic waves propagated via the electromagnetic wave propagation unit, at least one of the power feeding device unit and the reception device unit being disposed on the electromagnetic wave propagation unit in a non-conductive and non-embedded state with the electromagnetic wave propagation unit, the at least one of the power feeding device unit and the reception device unit comprising:
an electromagnetic wave coupling unit which transmits the electromagnetic waves to the electromagnetic wave propagation unit or receives the electromagnetic waves from the electromagnetic wave propagation unit; and
an electromagnetic wave suppression unit which includes a plurality of conductor unit structures arranged along a surface of the electromagnetic wave propagation unit so as to surround the electromagnetic wave coupling unit, and suppresses leakage of the electromagnetic waves from a space between the electromagnetic wave coupling unit and the electromagnetic wave propagation unit.

2. A surface communication device, comprising:
an electromagnetic wave propagation unit which propagates electromagnetic waves and has a sheet shape; and
at least one of a power feeding device unit which is disposed on the electromagnetic wave propagation unit in a non-conductive and non-embedded state with the electromagnetic wave propagation unit and feeds the electromagnetic waves to the electromagnetic wave propagation unit, and a reception device unit which is disposed on the electromagnetic wave propagation unit in a non-conductive and non-embedded state with the electromagnetic wave propagation unit and receives the electromagnetic waves propagated via the electromagnetic wave propagation unit, the at least one of the power feeding device unit and the reception device unit comprising:
an electromagnetic wave coupling unit which transmits the electromagnetic waves to the electromagnetic wave propagation unit or receives the electromagnetic waves from the electromagnetic wave propagation unit; and
an electromagnetic wave suppression unit which includes a plurality of conductor unit structures arranged along a surface of the electromagnetic wave propagation unit so as to surround the electromagnetic wave coupling unit, and suppresses leakage of the electromagnetic waves from a space between the electromagnetic wave coupling unit and the electromagnetic wave propagation unit.

3. The surface communication device according to claim 2, wherein the plurality of conductor unit structures comprise:
a plurality of patch conductors which are disposed to face the electromagnetic wave propagation unit; and
a wire conductor which connects the plurality of patch conductors which are adjacent to each other.

4. The surface communication device according to claim 2, wherein the plurality of the conductor unit structures includes:
a reference conductor which faces the electromagnetic wave propagation unit at a distance, and has a plate shape;
a wire-shaped conductor which faces the reference conductor; and
a conductor post which connects the reference conductor and the wire-shaped conductor.

5. The surface communication device according to claim 4, wherein each of the wire-shaped conductors is respectively disposed between each of the reference conductors and the electromagnetic wave propagation unit.

6. The surface communication device according to claim 5, wherein, among two or more layers which include a layer between said each of the reference conductors and said each of the wire-shaped conductors, at least one layer of the two or more layers is configured to have a higher dielectric constant than the other layers.

7. The surface communication device according to claim 2, wherein each of the plurality of conductor unit structures respectively includes:
a reference conductor which faces the electromagnetic wave propagation unit at a distance, and has a plate shape;
a patch conductor which faces the reference conductor, and has a plate shape; and
a conductor post which connects the reference conductor and the patch conductor.

8. The surface communication device according to claim 7, wherein each of the reference conductors of the respective plurality of conductor unit structures are another patch conductors which are separated from each other.

9. The surface communication device according to claim 7, wherein each of the patch conductors is disposed on an opposite side to the electromagnetic wave propagation unit with respect to the reference conductor.

10. The surface communication device according to claim 9, wherein a dielectric constant of a space filling a layer respectively between each of the reference conductors and said each of the patch conductors is higher than a dielectric constant of at least one layer filling respectively between said each of the reference conductors and the surface of the electromagnetic wave propagation unit.

11. The surface communication device according to claim 7, wherein the plurality of conductor unit structures include two or more conductor unit structures having different positional relationships between a respective patch conductor and a respective conductor post thereof.

12. The surface communication device according to claim 7, wherein the plurality of conductor unit structures include two or more conductor unit structures in which respective patch conductors thereof have different dimensions.

13. The surface communication device according to claim 7, wherein the plurality of conductor unit structures include at least one conductor unit structure including a respective patch conductor thereof to which two or more of respective conductor posts are connected.

14. The surface communication device according to claim 13, wherein the plurality of conductor unit structures include two or more conductor unit structures in which the number of the conductor posts connecting the respective reference conductor and the respective patch conductor is different.

15. The surface communication device according to claim 7, wherein each of the reference conductors includes an opening portion in which a wire-shaped conductor is provided, and said each of the reference conductors and each of the conductor posts are respectively connected by the wire-shaped conductor.

16. The surface communication device according to claim 7, wherein each of the patch conductors has an opening portion in which a wire-shaped conductor is provided, and said each of the patch conductors and each of the conductor posts are respectively connected by the wire-shaped conductor.

17. The surface communication device according to claim 7, wherein each of the patch conductors is disposed between the respective reference conductor and the electromagnetic wave propagation unit.

18. The surface communication device according to claim 17, wherein a dielectric constant of a space filling a layer respectively between each of the reference conductors and said each of the patch conductors is higher than a dielectric constant of at least one layer filling respectively between said each of the patch conductors and the surface of the electromagnetic wave propagation unit.

19. The surface communication device according to claim 7, wherein each of the reference conductors of the respective plurality of conductor unit structures are formed integrally together.

20. The surface communication device according to claim 19, wherein each of the patch conductors respectively adjacent to one another overlap one another when viewed from a side of the corresponding reference conductor.

* * * * *